US009520827B2

(12) United States Patent
Tarng

(10) Patent No.: US 9,520,827 B2
(45) Date of Patent: Dec. 13, 2016

(54) ZILINX : THE 11 LESS GREEN TECHNOLOGY FOR FPIC OF SMART WINDOW

(75) Inventor: Min Ming Tarng, San Jose, CA (US)

(73) Assignee: Anlinx, San Jose, CA (US)

( * ) Notice: Subject to any disclaimer, the term of this patent is extended or adjusted under 35 U.S.C. 154(b) by 1878 days.

(21) Appl. No.: 12/752,121

(22) Filed: Apr. 1, 2010

(65) Prior Publication Data

US 2010/0188057 A1    Jul. 29, 2010

Related U.S. Application Data

(63) Continuation-in-part of application No. 12/288,770, filed on Oct. 23, 2008, now Pat. No. 7,663,349, and a continuation-in-part of application No. 11/593,271, filed on Nov. 6, 2006, now Pat. No. 7,511,589, and a continuation-in-part of application No. 11/500,125, filed on Aug. 5, 2006, now Pat. No. 7,525,392, and a continuation-in-part of application No. 12/079,179, filed on Mar. 25, 2008, now Pat. No. 8,089,353, and a continuation-in-part of application No. 12/291,984, filed on Nov. 14, 2008, now Pat. No. Plant 20,686, and a continuation-in-part of application No. 12/082,601, filed on Apr. 12, 2008, now abandoned, and a continuation-in-part of application No. 11/500,125, filed on Aug. 5, 2006, now Pat. No. 7,525,392.

(51) Int. Cl.
| G05F 1/613 | (2006.01) |
| H03B 5/04 | (2006.01) |
| H03B 5/36 | (2006.01) |
| H03B 5/12 | (2006.01) |
| E06B 9/24 | (2006.01) |

(52) U.S. Cl.
CPC ............... *H03B 5/04* (2013.01); *H03B 5/124* (2013.01); *H03B 5/1215* (2013.01); *H03B 5/1228* (2013.01); *H03B 5/1278* (2013.01); *H03B 5/366* (2013.01); *E06B 2009/2464* (2013.01)

(58) Field of Classification Search
CPC ......... H03B 5/04; H03B 5/366; H03B 5/1228; H03B 5/1215; H03B 5/1278; H03B 5/124; E06B 2009/2464
See application file for complete search history.

(56) References Cited

U.S. PATENT DOCUMENTS 6,452,442 B1 * 9/2002 Laude ............... H03F 3/193
327/379
8,878,392 B2 * 11/2014 Lemmens ............... H02J 5/005
307/104

(Continued)

*Primary Examiner* — Jue Zhang

(57) ABSTRACT

The 11Less Green Technology are Noiseless Field Programmable Integrated Circuit FPIC, Curtainless Window, Bladeless Turbo Fan, Brakeless Vehicle, Sawless, Resistorless, Capless, Inductorless, Diodeless Random Number Generator, Xtaless Clock Generator, Clockless Switch Mode Power Supply. The Green Technology of the Current Regulator for Green Power & Noise of Green Chip and Smart Window Driver for Smart Window of Green House are the fundamental building blocks of the next century green technology industry. Zilinx' FPIC is the last Field Programmable Integrated Chip. For the Green Building Management System, the IGU of the Smart Window includes the transparent Solar Cell, ElectroChromic Window and Smart Fan to adjust the light, temperature and ventilation simultaneously.

20 Claims, 51 Drawing Sheets

(56) References Cited

U.S. PATENT DOCUMENTS

| | | | | |
|---|---|---|---|---|
| 2008/0042765 A1* | 2/2008 | Tarng | ................ | H03B 5/04 331/167 |
| 2009/0134947 A1* | 5/2009 | Tarng | ................ | H03B 5/04 331/116 FE |
| 2010/0103571 A1* | 4/2010 | Brown, Jr. | .......... | H01L 27/0248 361/56 |
| 2010/0283437 A1* | 11/2010 | Chung | ............... | H02M 1/44 323/212 |
| 2010/0283438 A1* | 11/2010 | Chung | ............... | G05F 1/575 323/268 |

* cited by examiner

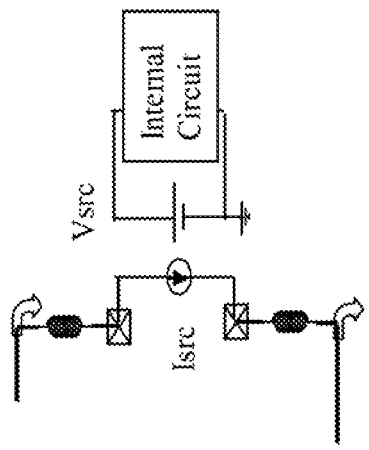
FIG.1L
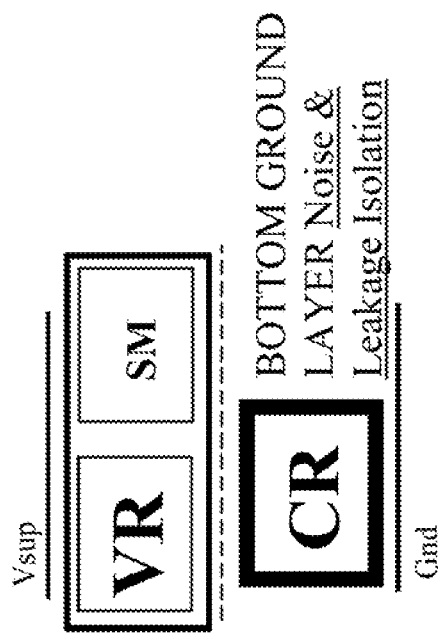
FIG.1M
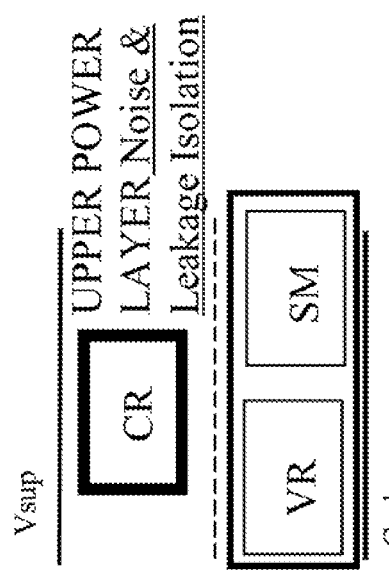
FIG.1J
FIG.1K

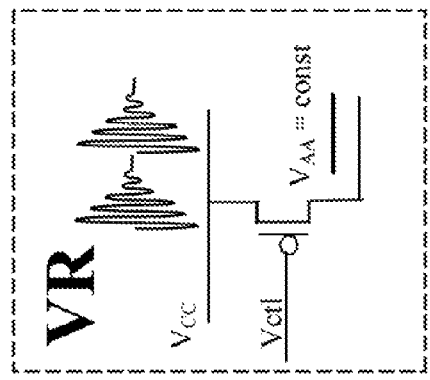
FIG.1O
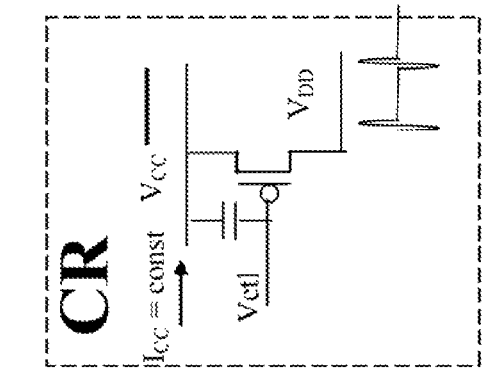
FIG.1P
| Conventional | Green P&N |
|---|---|
| Multi-Chip | Single Chip |
| On-Board Bypass Capacitor $C_{bypass\_capacitor}$ | On-Chip Storage AC Capacitor $C_{AC}$ |
| Voltage Regulator VR | Current Regulator CR |
| Constant Output Voltage ($V_{AA}$) | Constant Output Current ($I_{CC}$) |
| Supply constant Voltage to FF/AF/Analog Circuits | Supply constant Current to Digital Circuits |
FIG.1N

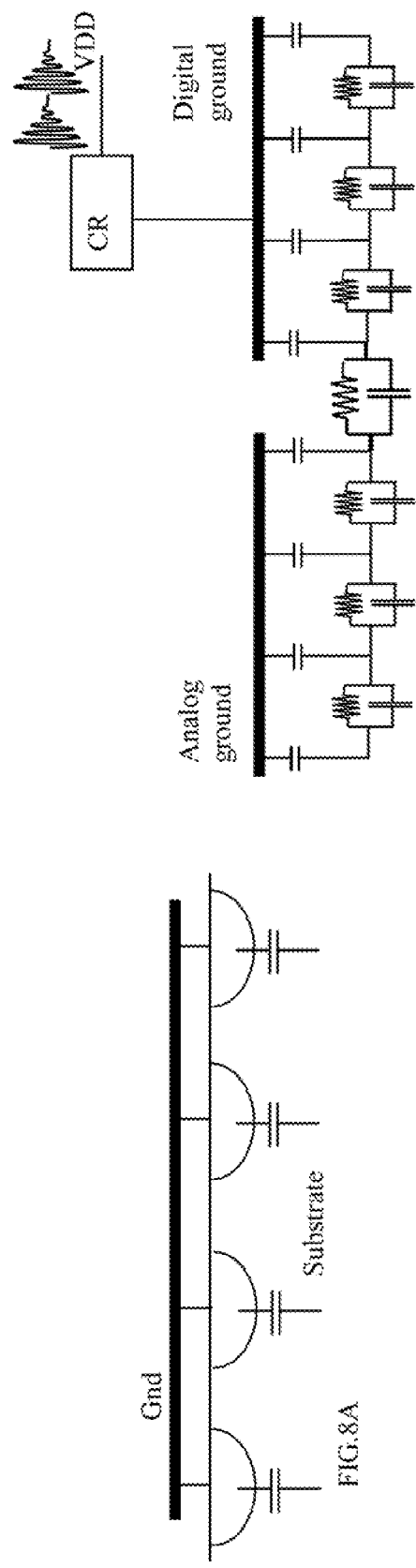
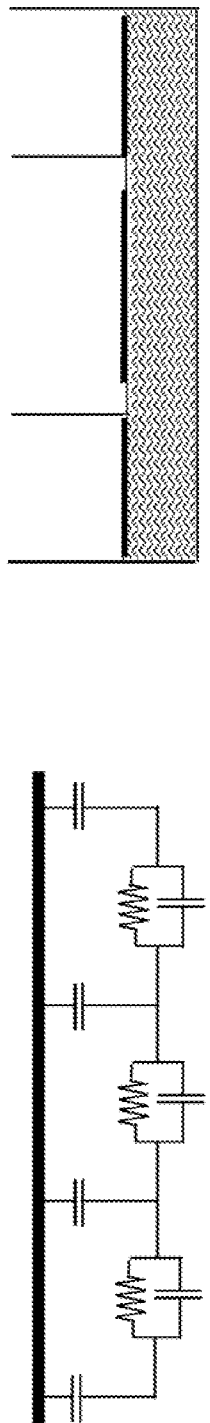
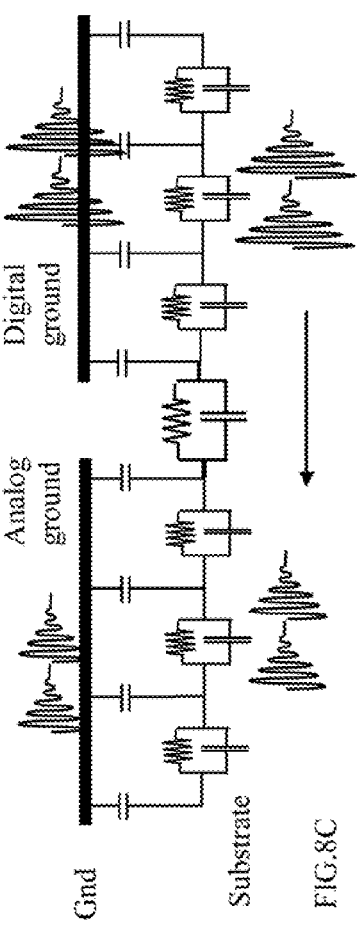
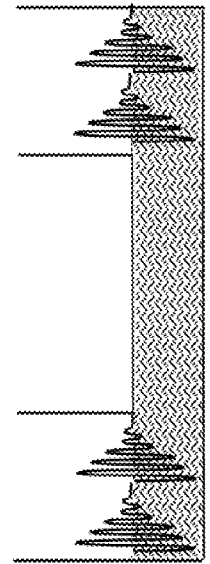
FIG.8A
FIG.8B
FIG.8C
FIG.8D
FIG.8E
FIG.8F

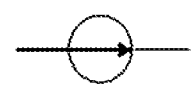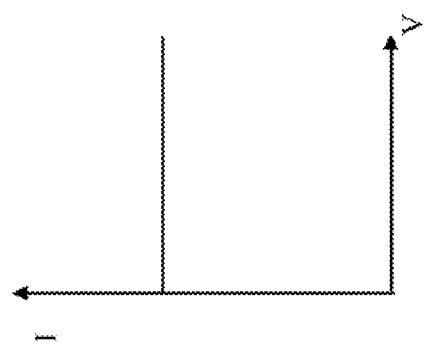
FIG.11A
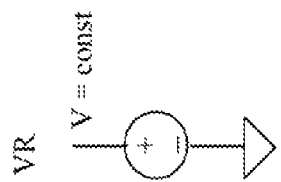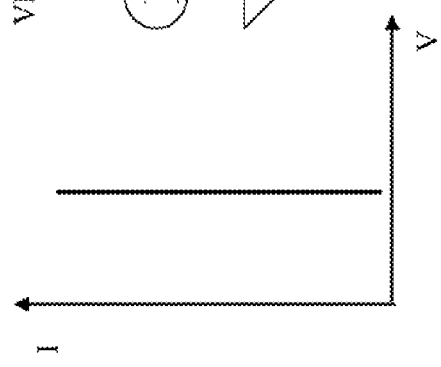
FIG.11B
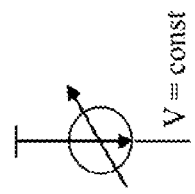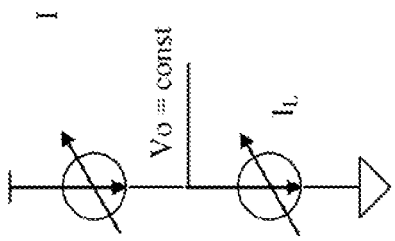
FIG.11C
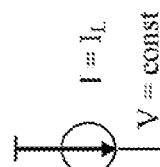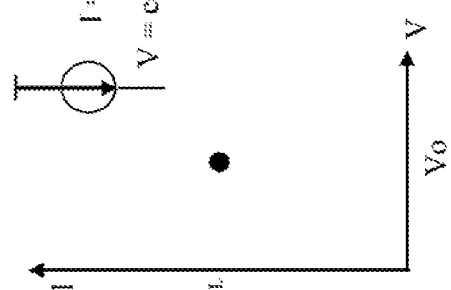
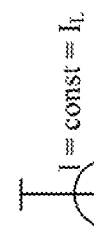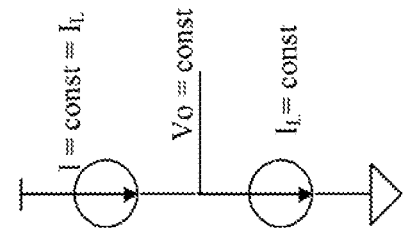
FIG.11D

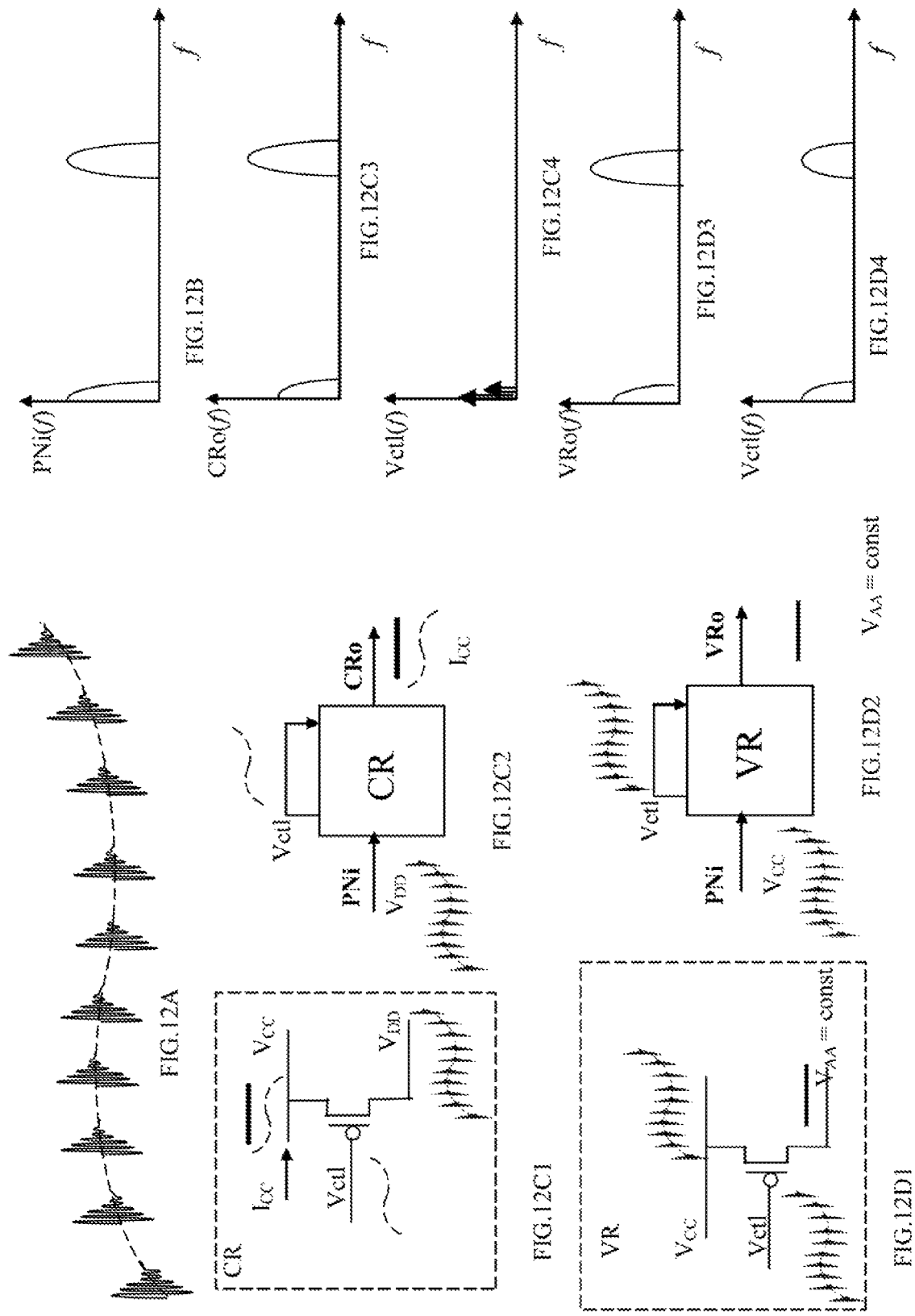

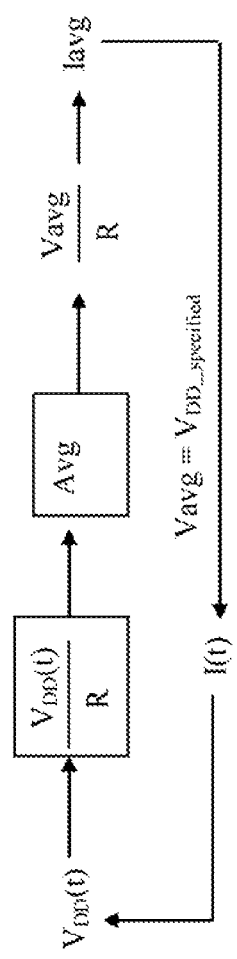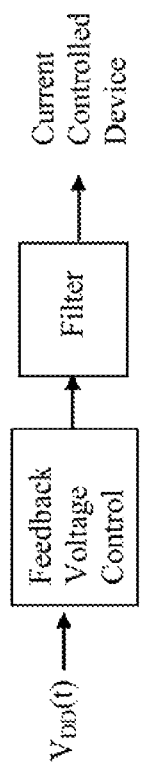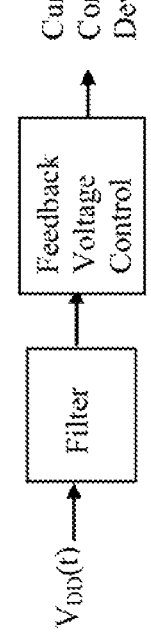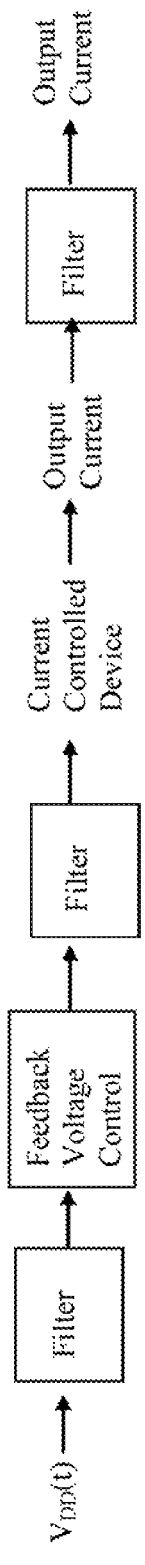
FIG.13A  FIG.13B  FIG.13C  FIG.13D1  FIG.13D2  FIG.13D3

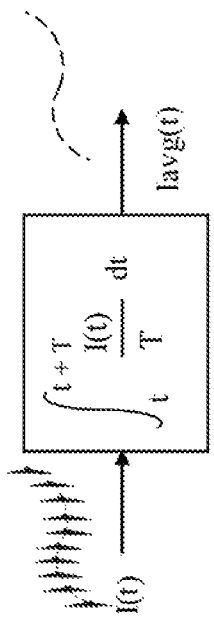
FIG.14B
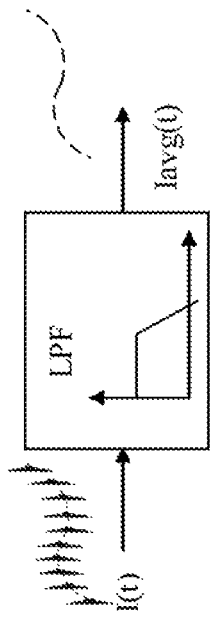
FIG.14D
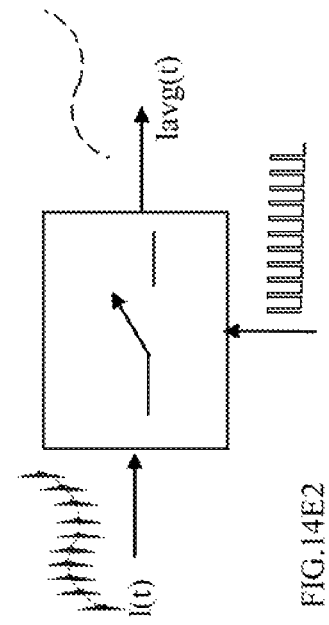
FIG.14E2
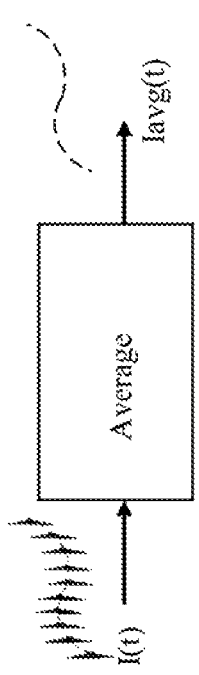
FIG.14A
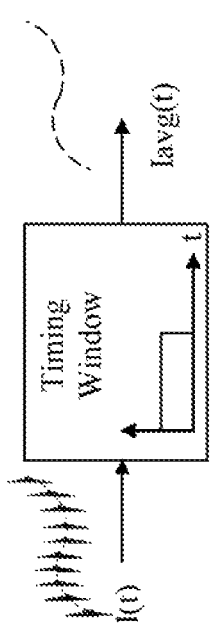
FIG.14C
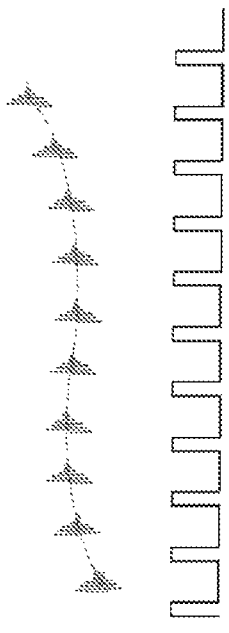
FIG.14E1

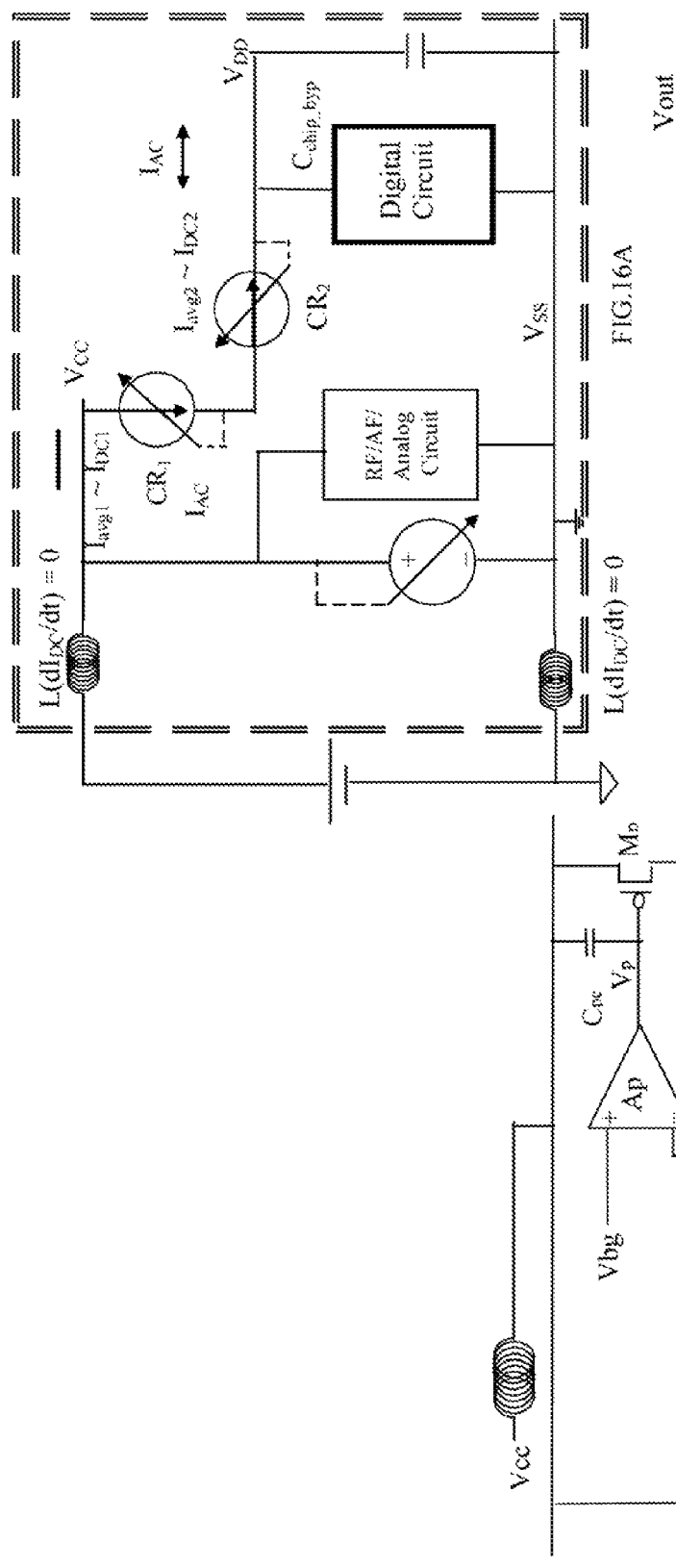
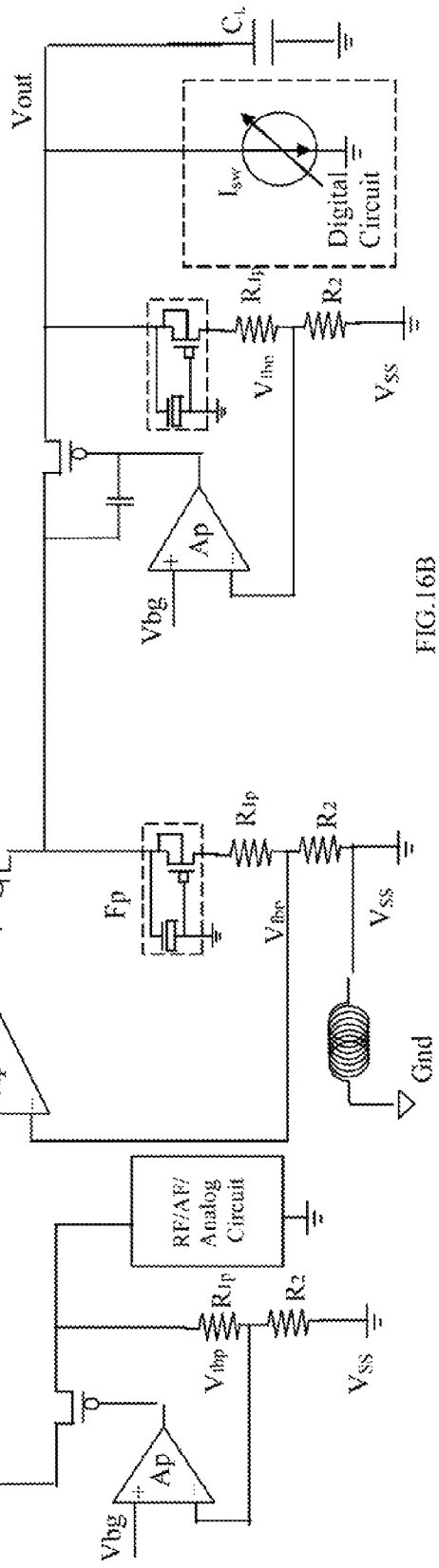
FIG. 16A
FIG. 16B

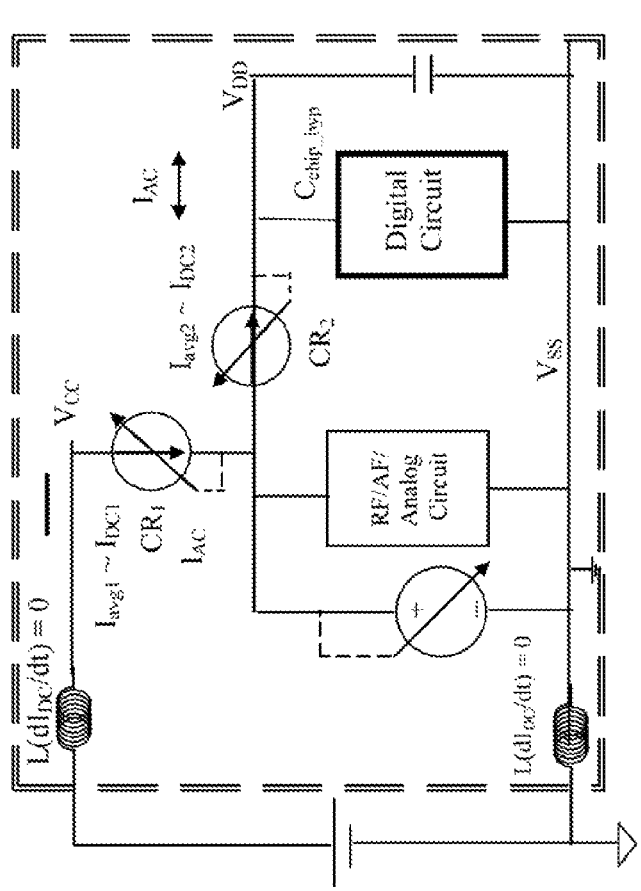
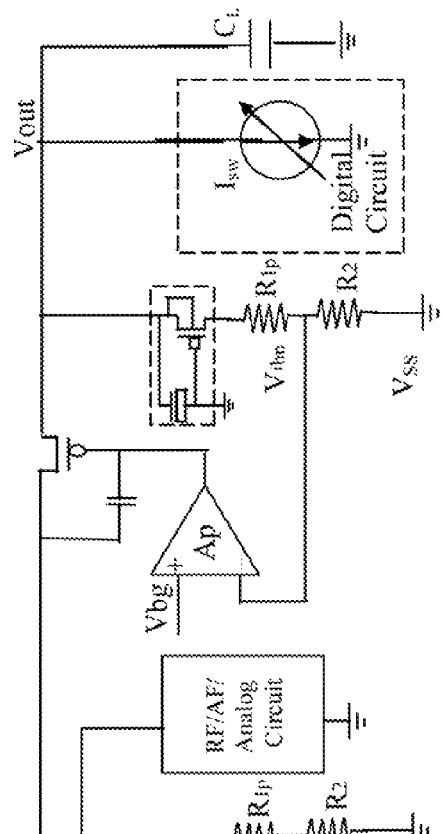
FIG. 17A
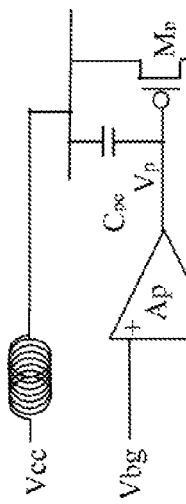
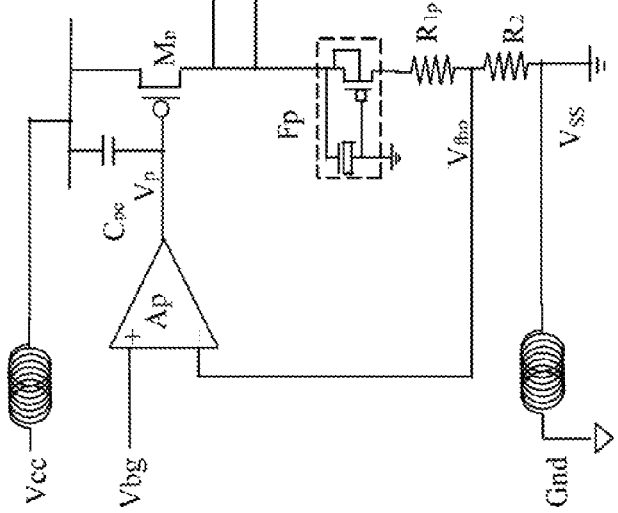
FIG. 17B

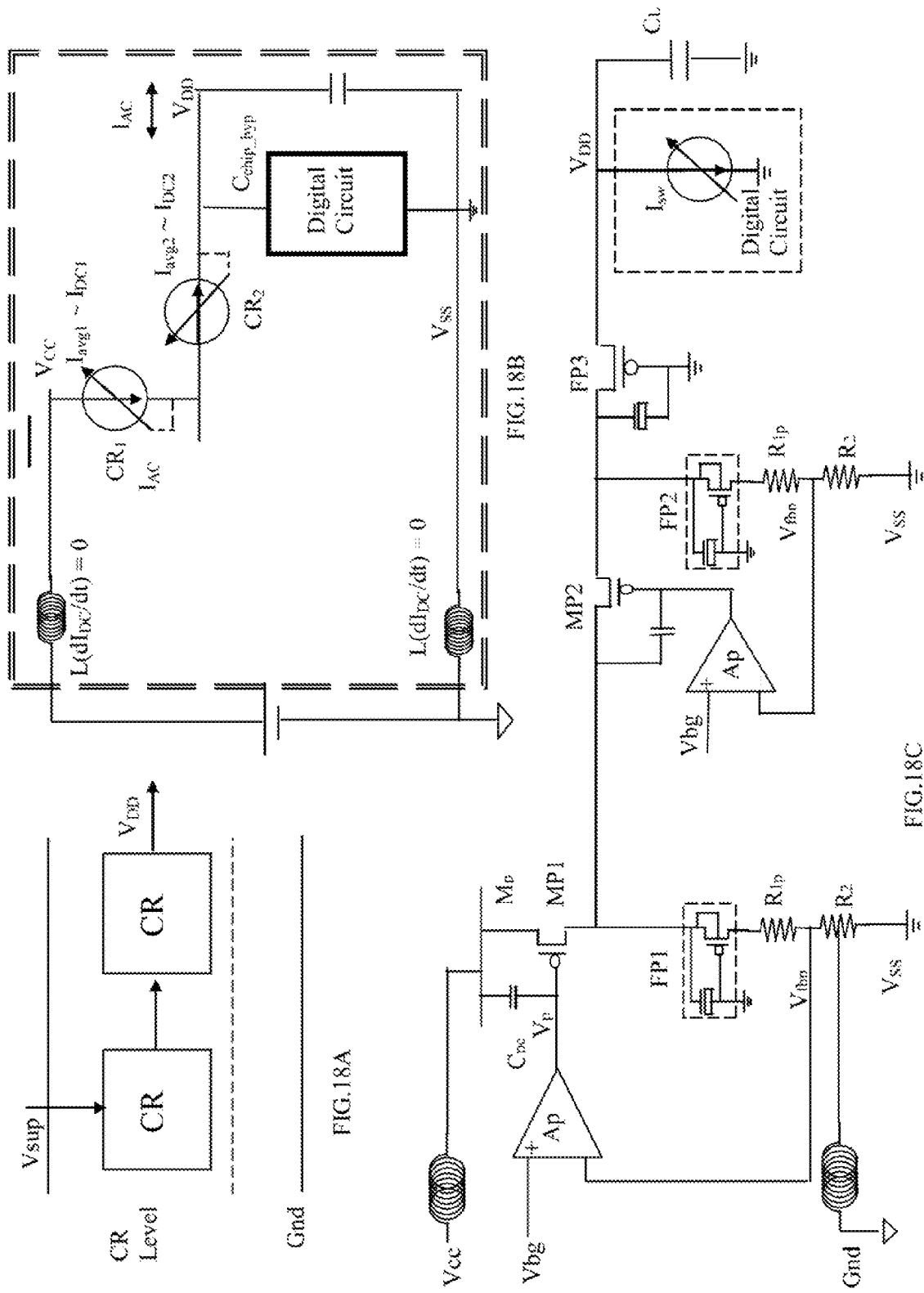

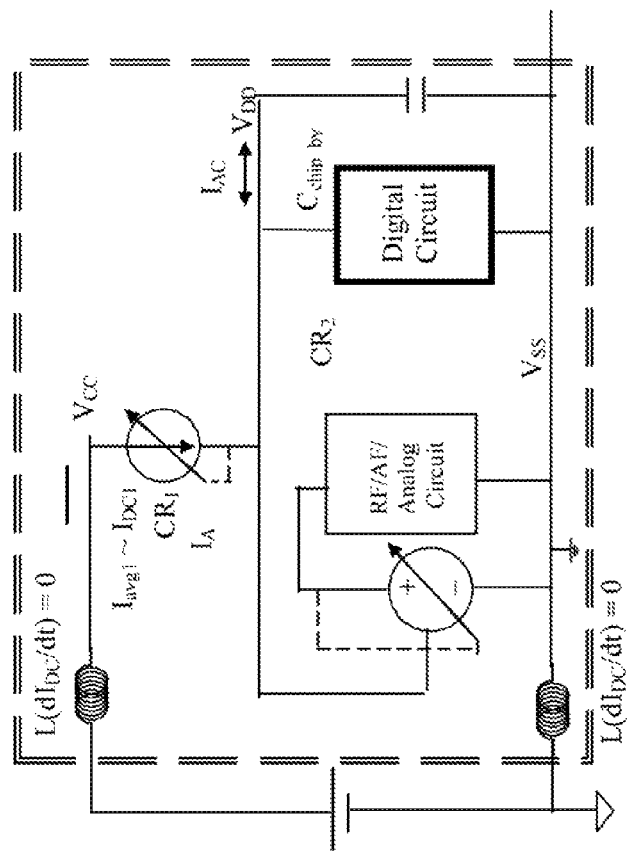
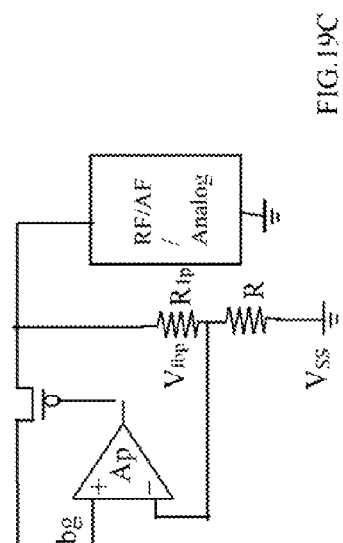
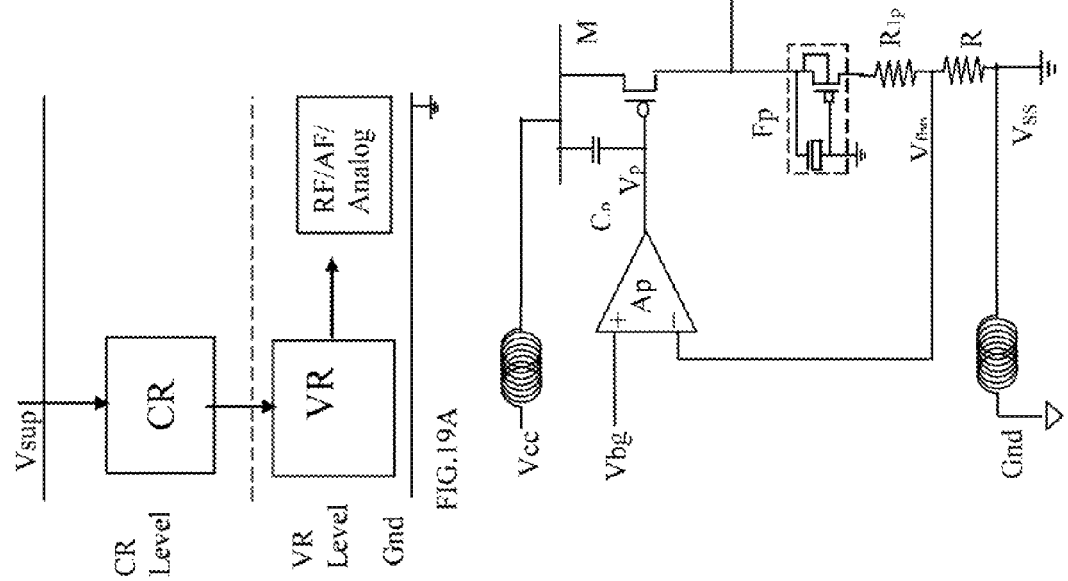
FIG. 19A
FIG. 19B
FIG. 19C

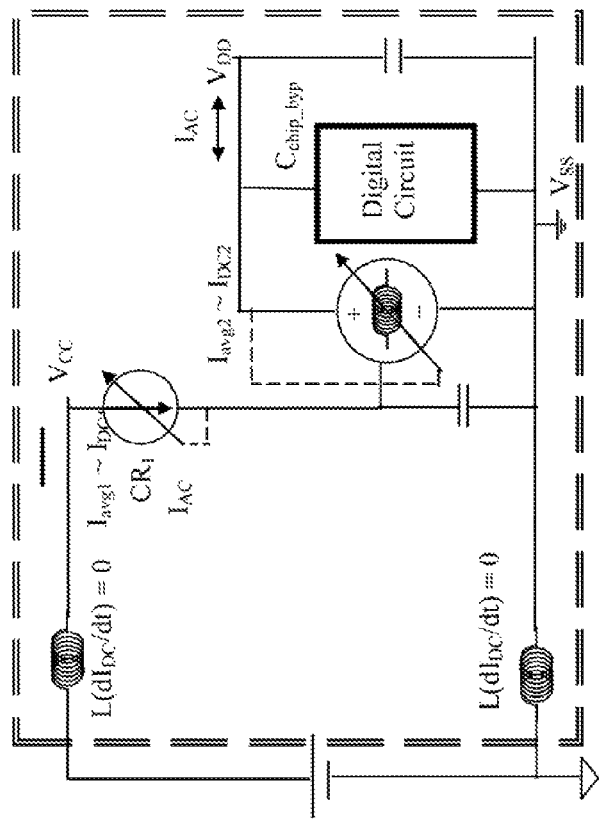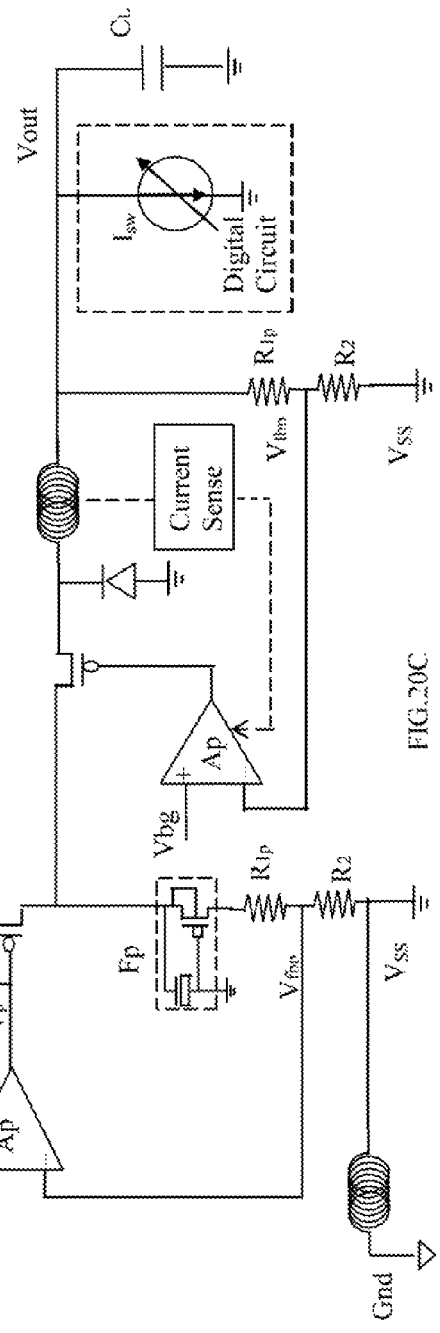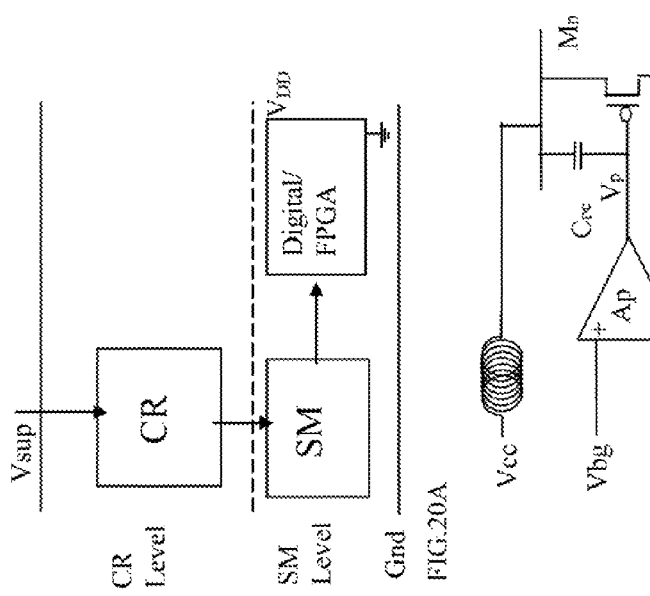

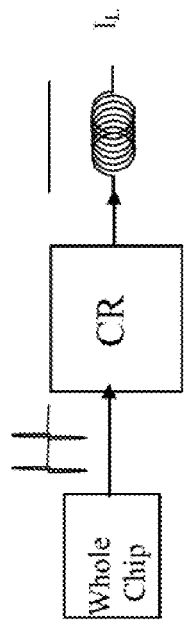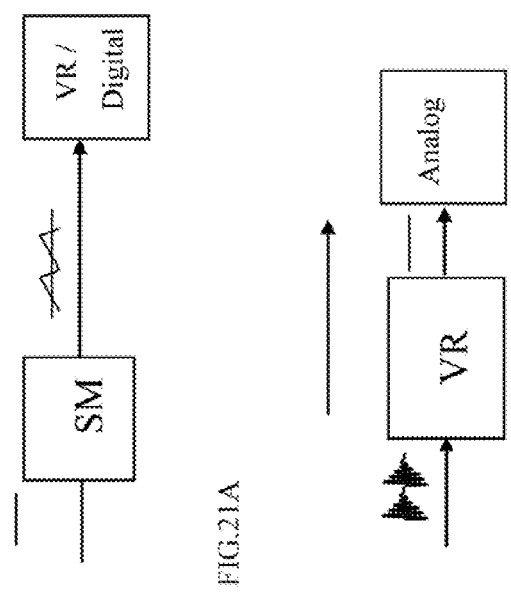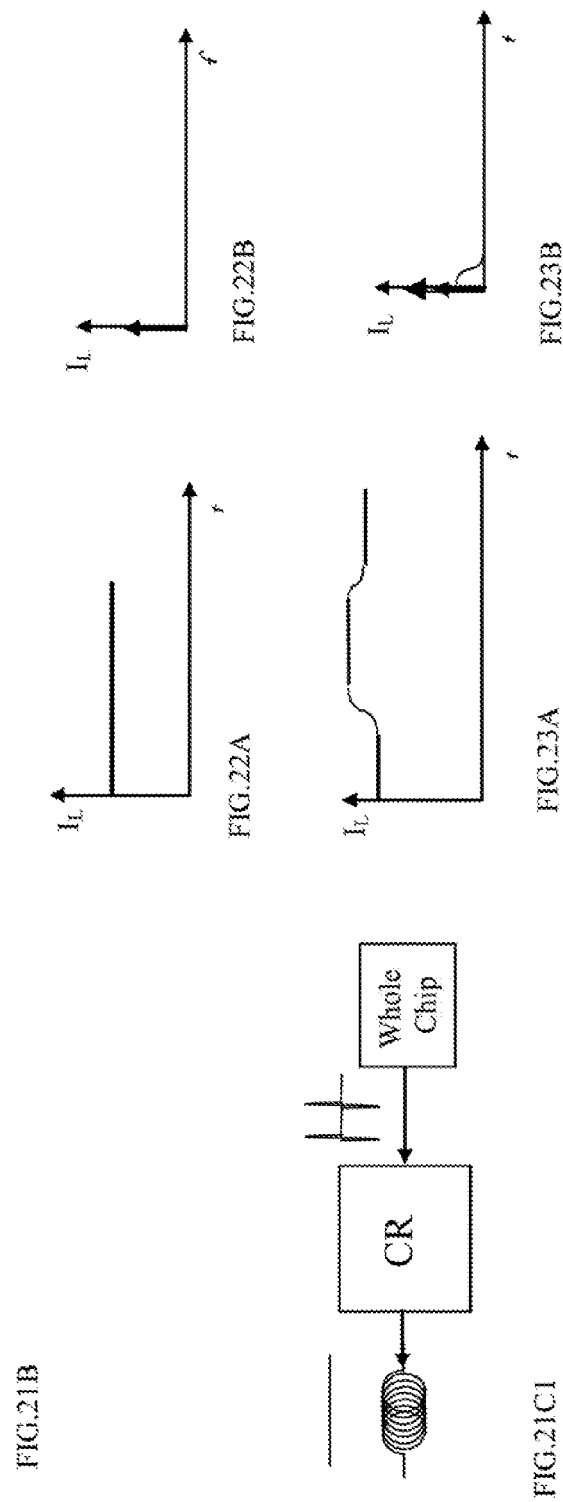

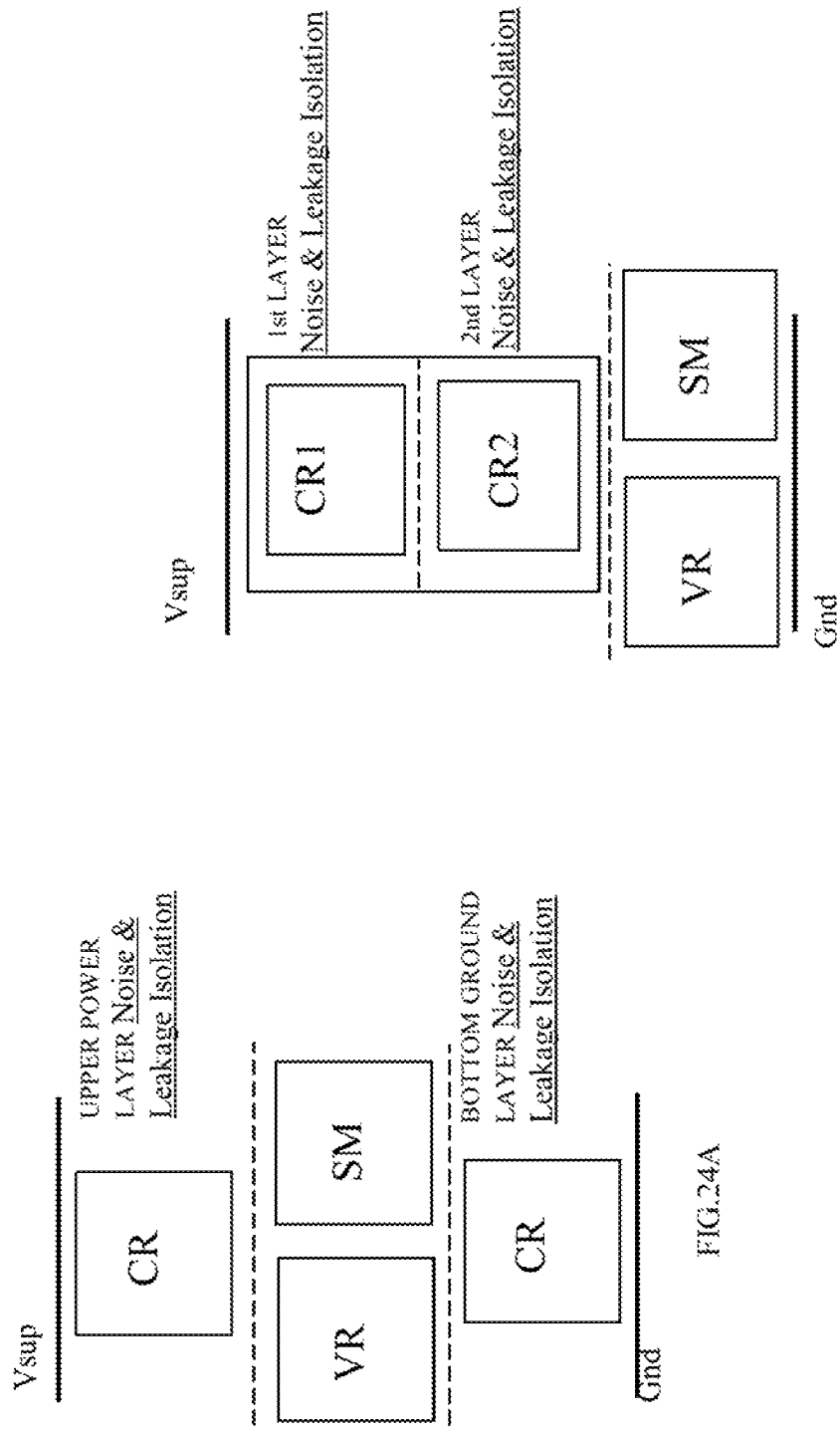

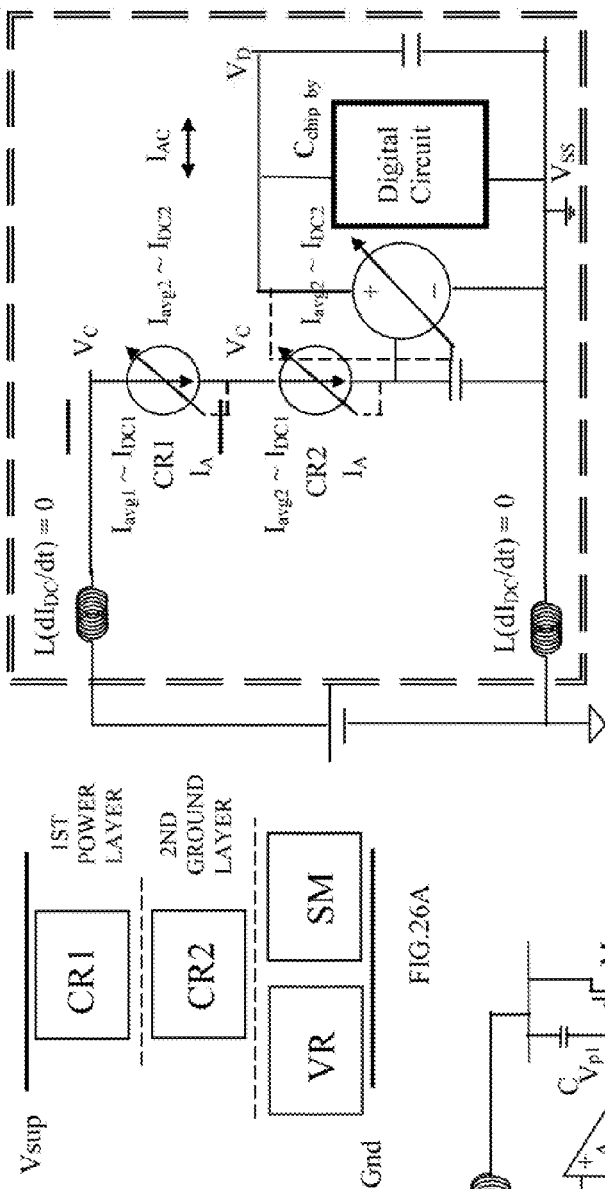
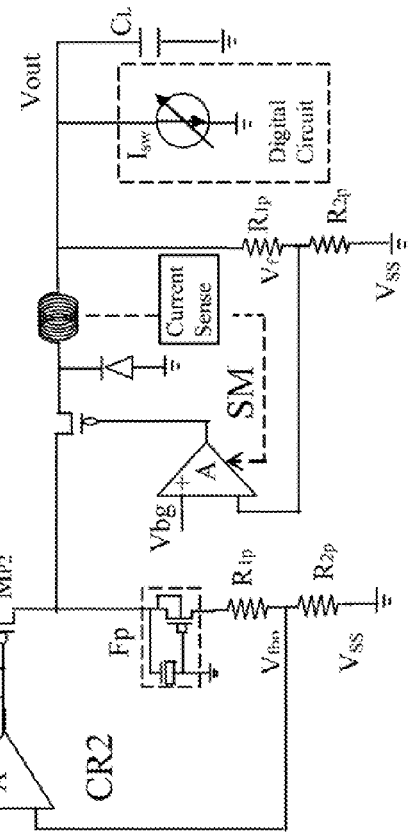
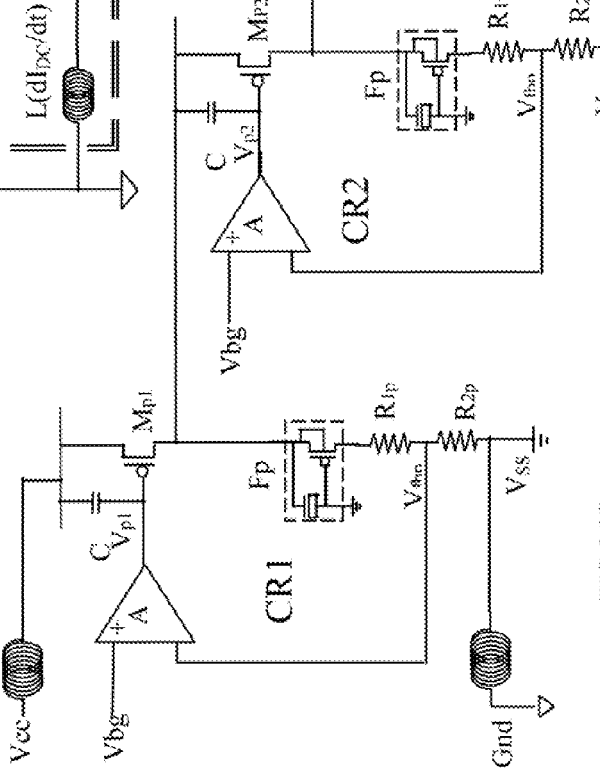
FIG.26A
FIG.26B
FIG.26C

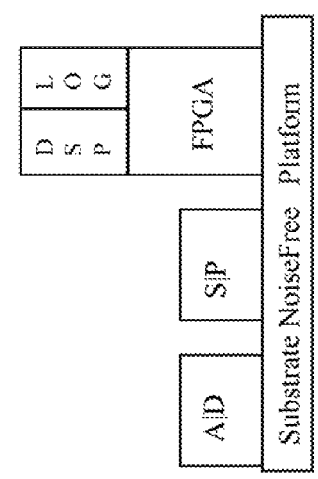
FIG.28B
FIG.28C
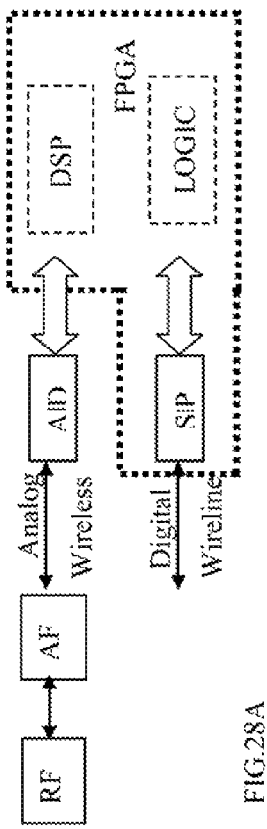
FIG.28A
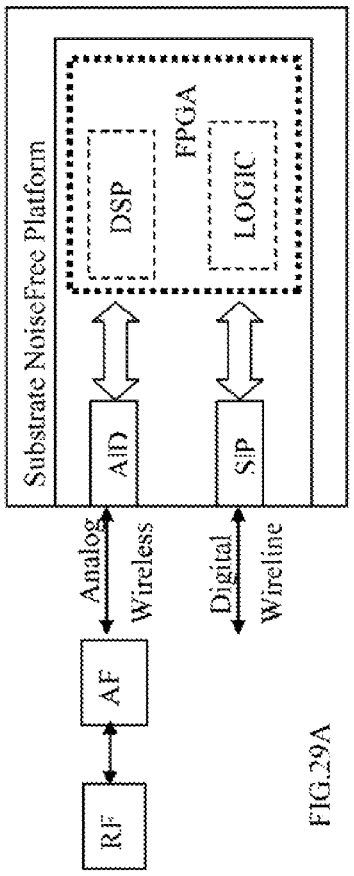
FIG.29A
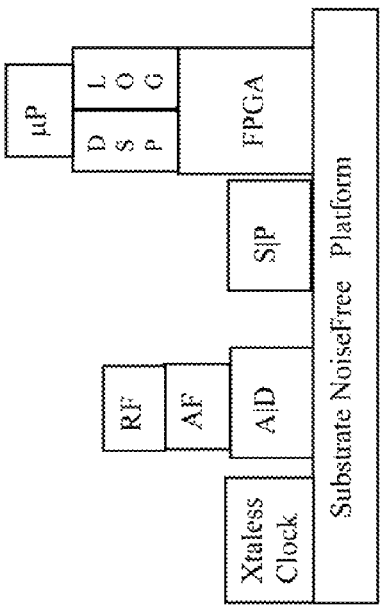
FIG.29B
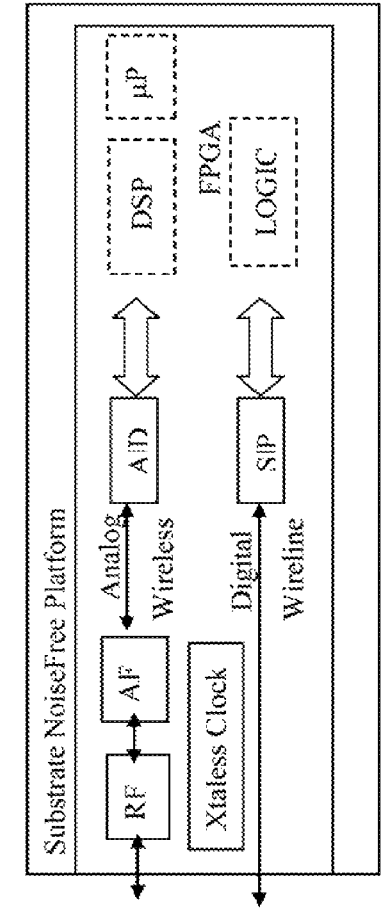
FIG.30A
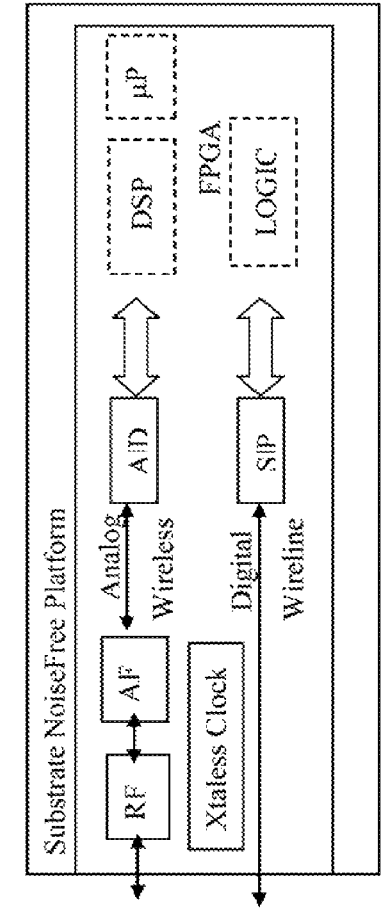
FIG.30B

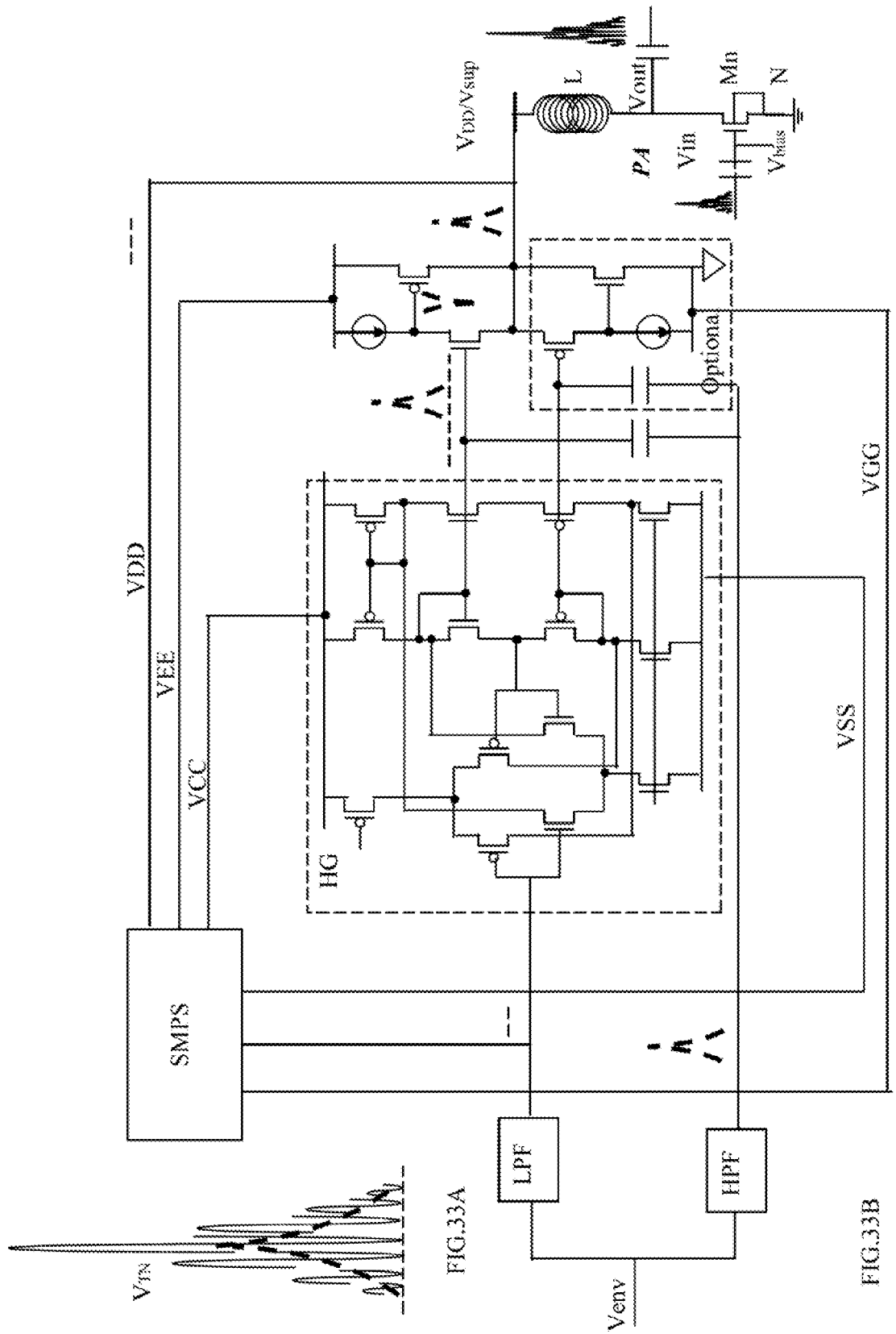

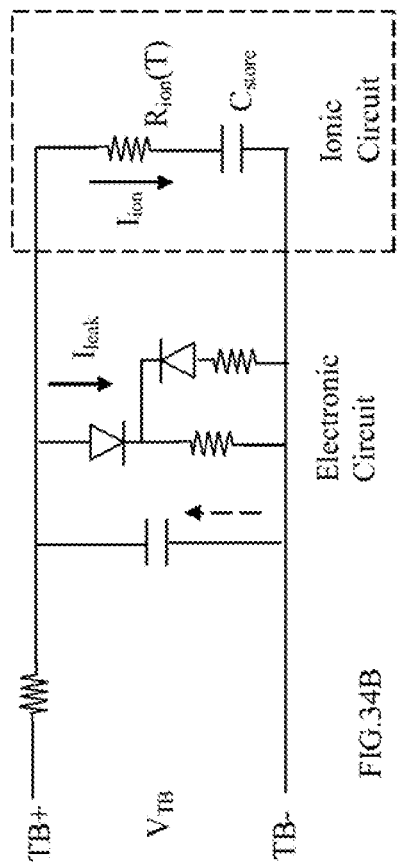
FIG. 34A
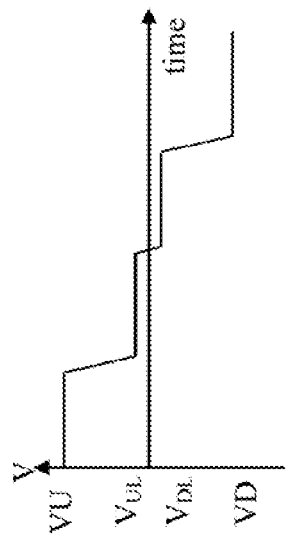
FIG. 34B
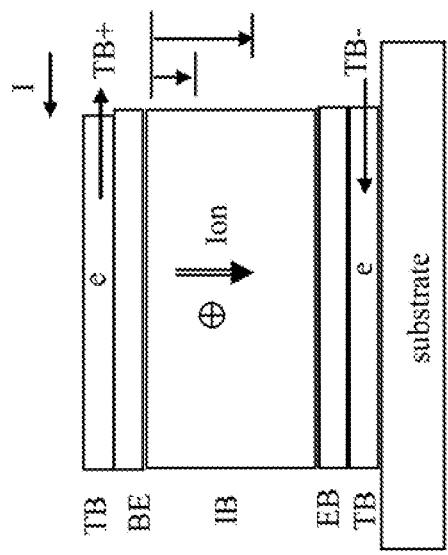
FIG. 34C
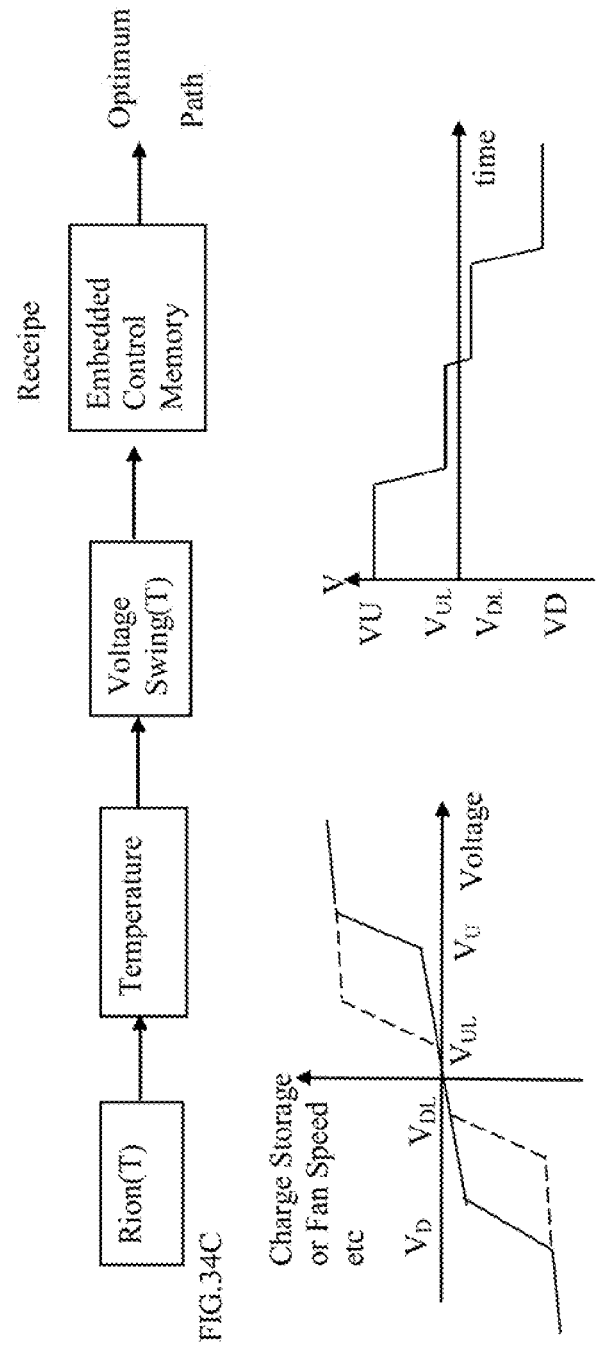
FIG. 34D
FIG. 34E

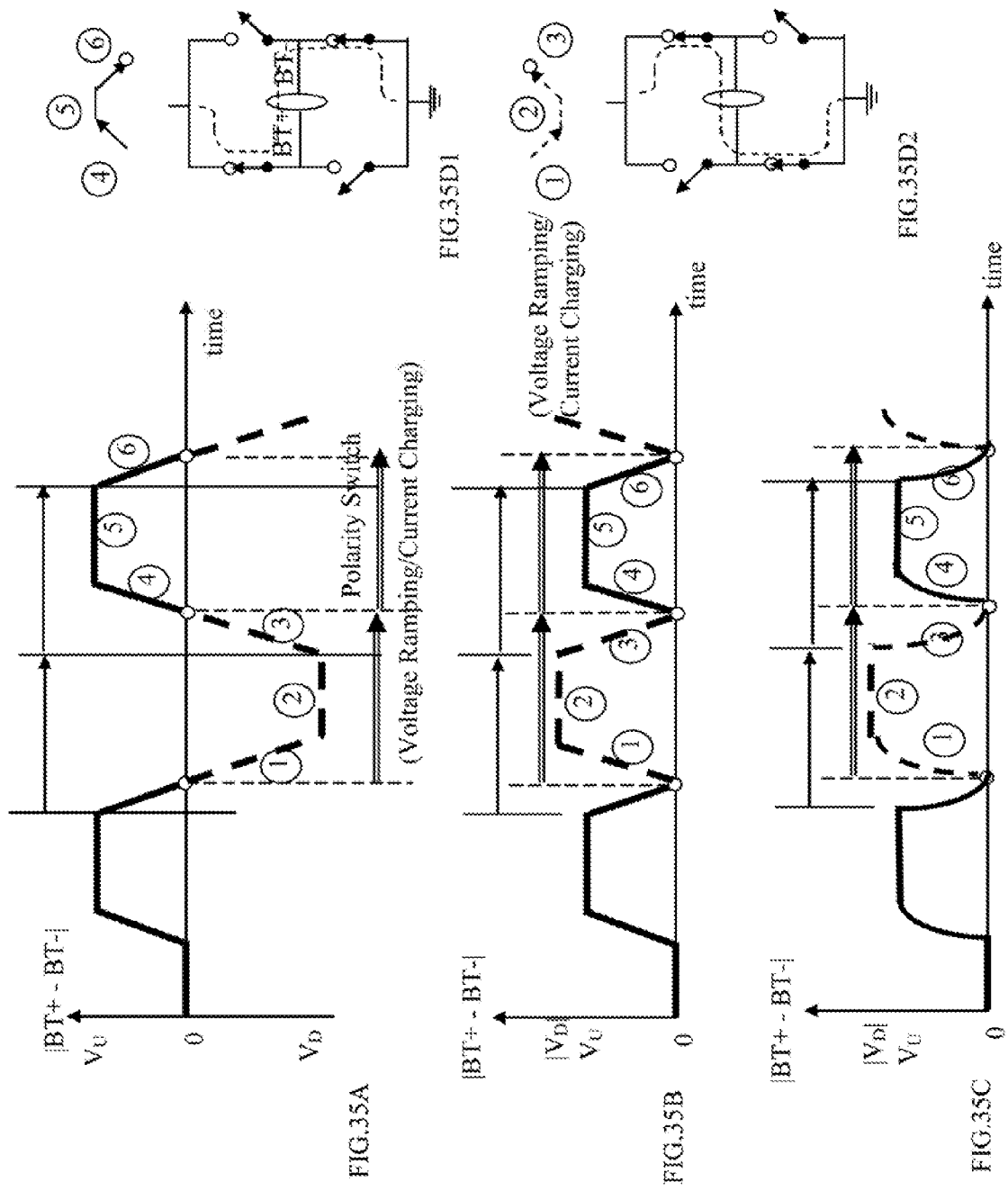

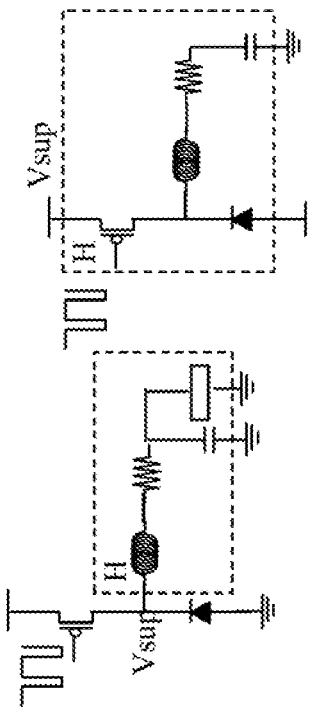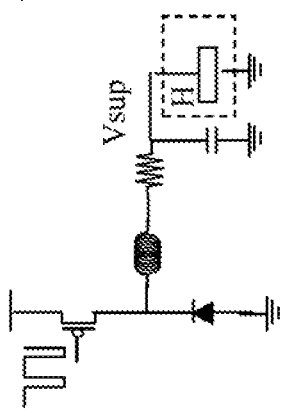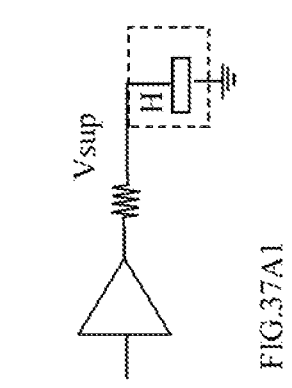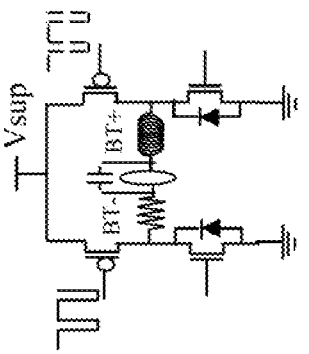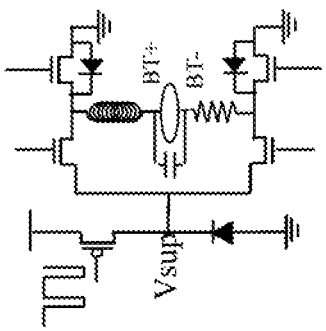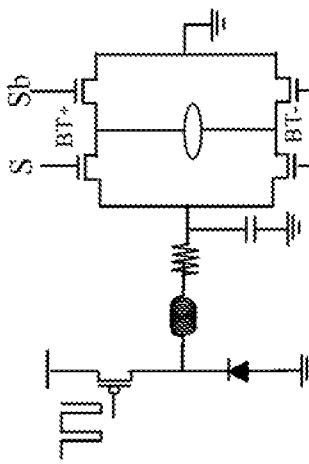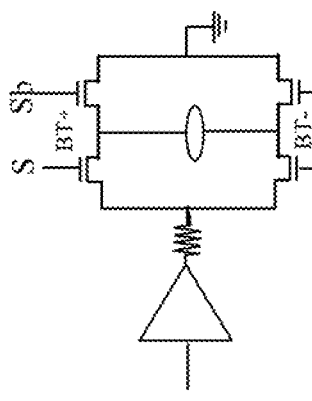
FIG.37A1  FIG.37B1  FIG.37C1  FIG.37D1
FIG.37A2  FIG.37B2  FIG.37C2  FIG.37D2

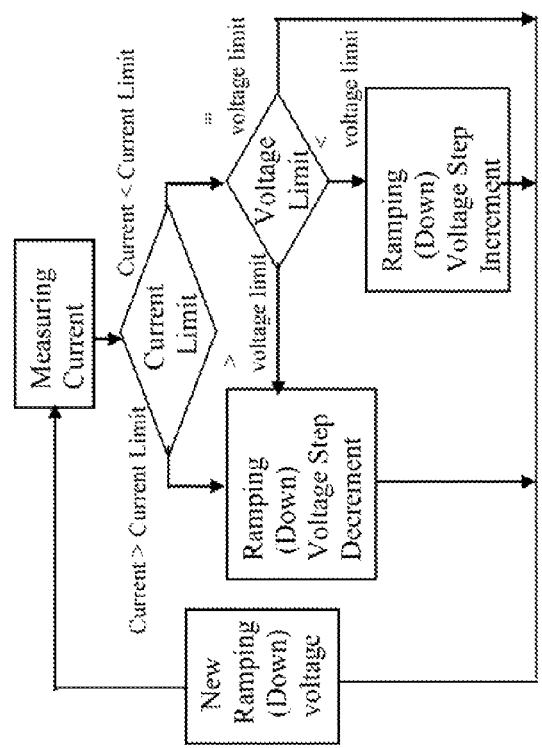
FIG.38C2
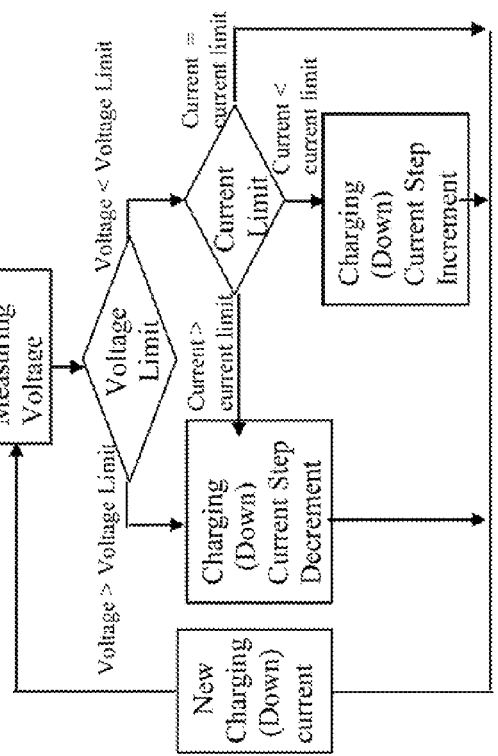
FIG.38D2
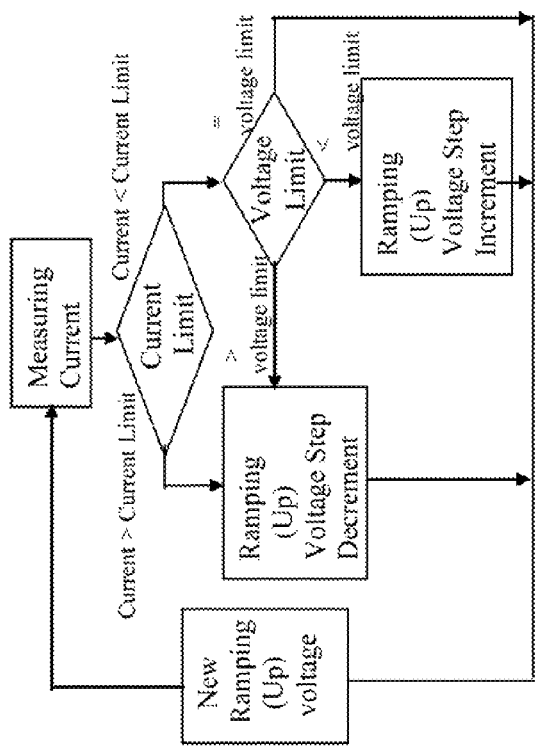
FIG.38C1
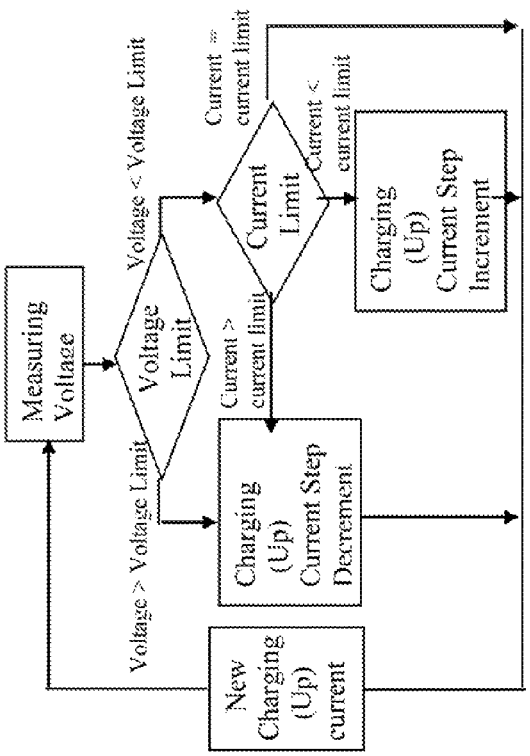
FIG.38D1

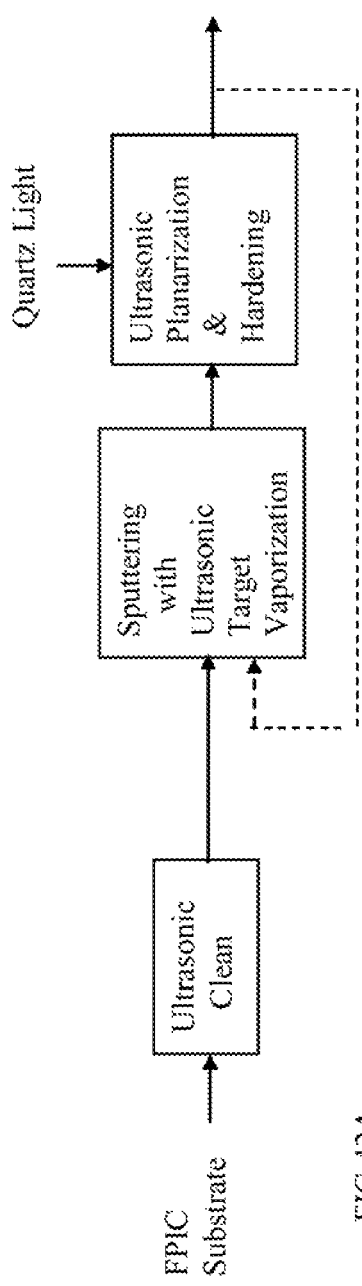
FIG. 42A
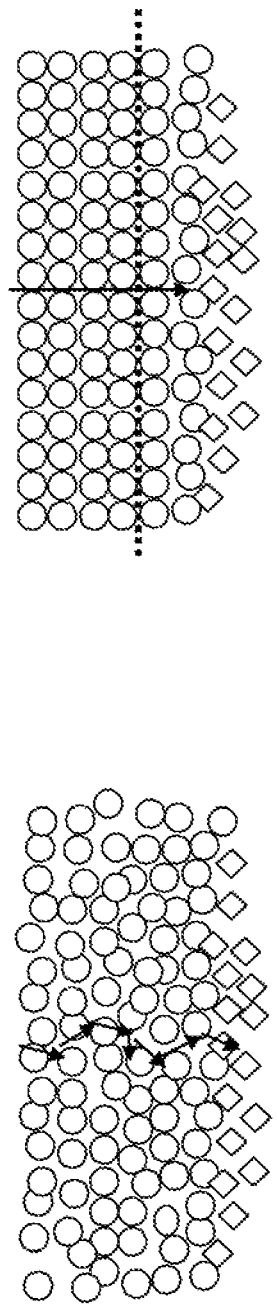
FIG. 42B
FIG. 42C

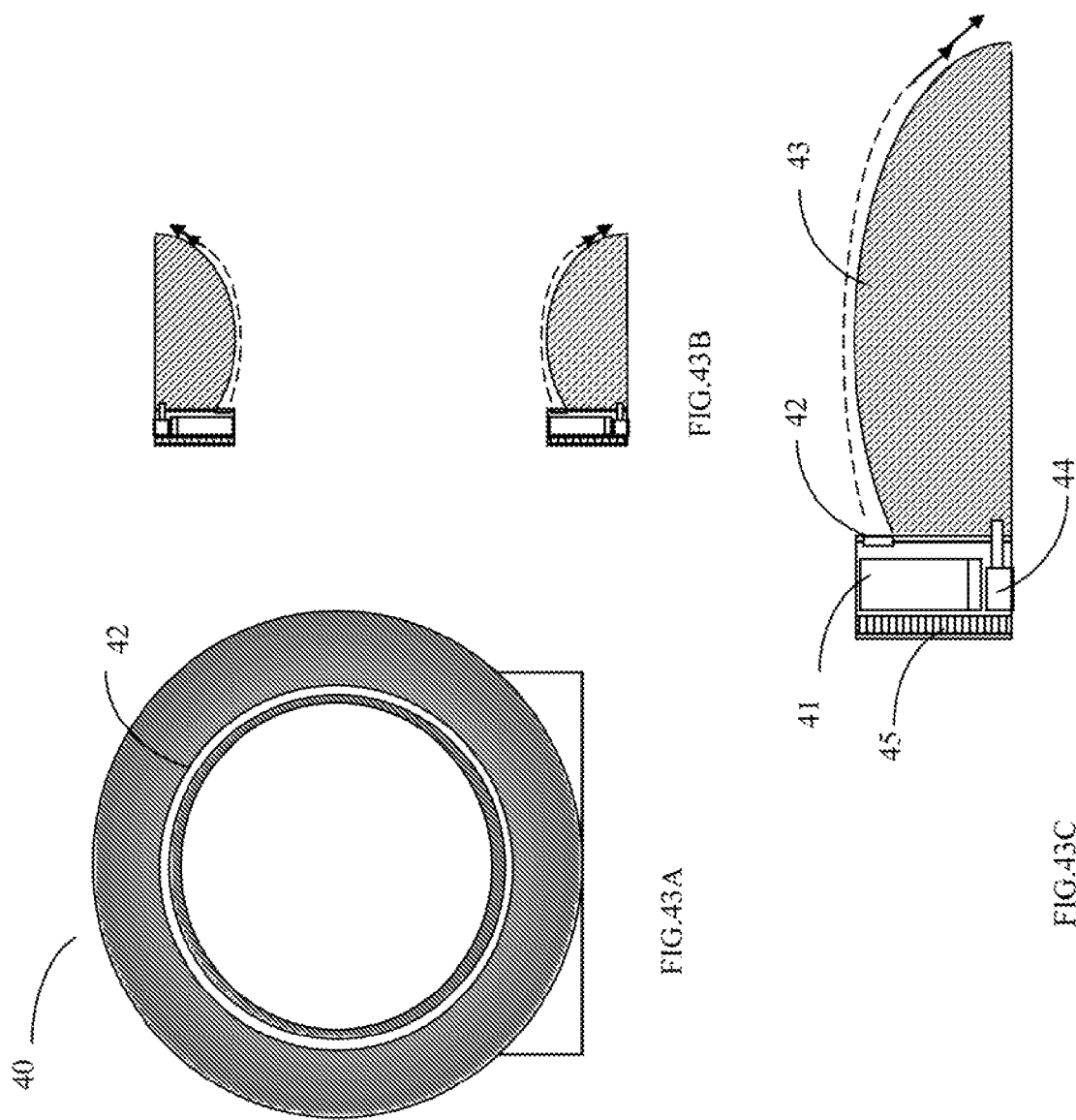

ZILINX : THE 11 LESS GREEN TECHNOLOGY FOR FPIC OF SMART WINDOW

This is a Continuation in Part application claims priority of U.S. patent application Ser. No. 12/288,770, filed Oct. 23, 2008, Ser. No. 11/500,125, filed Aug. 5, 2006, Ser. No. 11/593,271, filed Nov. 6, 2006, Ser. No. 12/079,179, filed Mar. 25, 2008, Ser. No. 12/291,984, filed Nov. 12, 2008, Ser. No. 12/082,601, filed Apr. 12, 2008, U.S. Pat. No. 7,511,589 filed Nov. 6, 2006 and U.S. patent application Ser. No. 11/500,125, filed Aug. 5, 2006 which herein incorporated by reference in its entirety.

BACKGROUND FIELD OF INVENTION

ASIC is Application Specific Integrated Circuit. FPGA is Field Programmable Gate Array and FPIC is the Field Programmable Integrated Circuit. For the Green Technology, FPIC will merge ASIC and FPGA together to be the last Field Programmable Integrated Chip. So far, there are ASIC and FPGA two categories. In the future, it will have FPIC left only.

Zilinx FPIC is the last field programmable Integrated Chip. Zilinx is the subsidiary of the Green Technology holder of Tang System. The Field Programmable Integrated Chip FPIC of Zilinx is based on the green technology of Tang System to integrate the FPGA with ASIC to be the last field programmable FPIC. Thanks to the support of Dr. Mei Jech Lin, Eric Yu-Shiao Tarng, Alfred Yu-Chi Tarng, Angela Yu-Shiu Tarng, Jwu-Ing Tarng, Huang-Chang Tarng, Shun-Yu Nieh that I can make the revolutionary innovations in the Zilinx' holding company, Tang System. The core Green Technology of Tang System includes the Current Regulator for Green Power & Noise of Green Chip, the Smart Window Driver for Smart Window of Green House, etc to be the 11Less Green Technology. The 11Less Green Technology are the Noiseless Field Programmable Integrated Circuit FPIC, Curtainless Window, Bladeless Turbo Fan, Brakeless Vehicle, Sawless LNA, Resistorless SMPS and Transceiver, Capless LDVR, Inductorless SMPS, Diodeless Random Number Generator, Xtaless Clock Generator, Clockless Switch Mode Power Supply.

However, to merge ASIC and FPGA together to be the FPIC, it needs the Noise Isolation Technology of Green Technology. As the semiconductor device process continues shrinking down, the mask price and process price are much higher. The revenue of one-generation product cannot recover the investment. It needs the revenue of several generations product to cover the Non-recurring engineering (NRE) cost. So, all the chips will be forced to be FPIC. However, the substrate noise is the barrier for the further system integration of the RF, AF, and Mixed Signal circuits with the FPGA. The RF, AF, Mixed Signal circuits still stay as the ASIC. With our 11Less Green Technology, we can generate the Noiseless Field Programmable Integrated Circuit FPIC.

Green Technology is the low power, low noise, low pollution, recycling not only the resources but also the energy. Green Technology means low power and low pollution. The low pollution includes both low noisy and resource saving. The energy supplied for the house warming or cooling is the largest power consumption. The largest amount energy is released from the window of the house. We need to have the self-adaptive adjustable smart window to adjust the light and heat in and out of the house.

Furthermore, the window had better to be self-contained to have no external energy and extra wiring supplied to the self-adaptive adjustable smart window. It is the smart window having wireless connection. Both the light and heat are transmitted through or reflected from the smart window. The light and heat of the smart window are the integrated building management.

However, the barriers for the smart window are the cost, noise and power consumption of smart window. To have the individual control of the light, each light has the individual switch. To have the light dimmer control, the light switch is the dimmer switch. The smart window needs to cooperate with the dimmer light to have the light control that the smart window needs to be dimmer window. Each window needs one window controller to drive each dimmer window individually. The ElectroChromic EC window has the leaking current and the window controller has the stand-by power consumption. So, to be the green technology, the smart window has to be energy self-contained. The smart window can convert the sunlight energy to be the electro-chromic EC window energy. The controller costs a lot that it has to be the integrated chip to save the cost budget. To integrate the controller to be integrated chip, it has to have the noise isolation technology. To have the wireless connection of the window, the RF power amplifier of the window controller needs to be very power efficient. The LNA low noise amplifier has to work in the noiseless integrated chip that the noise isolation technology is the key technology.

So, the green technology needs to improve the house energy to fill up the energy big hole requirement. It needs to convert the conventional window to be the smart EC window. It needs to incorporate the dimmer lights, dimmer windows to be wireless network. The green technology for the smart EC window includes the power, wireless in a noiseless and power saving RF platform.

BACKGROUND-DESCRIPTION OF PRIOR ART

The noise isolation of the conventional chip adopts the multiple power and ground buses. The chips are the noise generator. All the noise generated by the chips is dumped on the board. There is an implicit assumption that the board is the ground having the infinite capacitance. However, this is not true. As the product becomes thin and small, there is no more the big board to serve as the ideal ground.

Furthermore, the FPGA cannot integrate the ADC on the same chip. The switch noise generated by the FPGA will kill all the high performance ADC. There is no ADC, the other RF/AF/analog cannot be integrated on FPGA, either. All these circuits are left to be ASIC. Since there is no isolation technology that the ASIC still can exist.

The Electronic Chromatic EC window technology has developed more than 80 years. However, due to the versatile technical barriers, the Electronic Chromatic EC window cannot be accepted by the market yet. One piece of small Electronic Chromatic EC window costs several hundred US dollars. It is out of consideration. Furthermore, the Electronic Chromatic EC window also consumes power and is not user friendly. There is no industrial standard of the building management for the Electronic Chromatic EC window yet.

The Electronic Chromatic EC window has the most difficult problem is the "uniformity" of the Electronic Chromatic EC window. To avoid the show up of the non-uniformity, the Electronic Chromatic EC window operates at bi-state, bleach or color. In the middle state, the non-uniformity of the Electronic Chromatic EC window will show up. Furthermore, as there are local defects, there is serious leakage and the Electronic Chromatic EC window cannot change color.

OBJECTS AND ADVANTAGES

The green technology provides the complete set solution to save all the world energy consumption by more than half. Using the noise isolation technology to build up the platform to integrate all the FPGA and ASIC together to be FPIC. Furthermore, this integration is extended to the Green Fields of the smart window to save the national energy consumption by more than 20%.

DRAWING FIGURES

FIG. 1 (A) is the overall system of the Green Technology for the smart window. The smart window includes the EC window, the solar cell window, battery, smart fan and dimmer light; FIG. 1B and FIG. 1C are the Zilinx FPIC with the 11Less Green Technology for of Smart Window; (B) is the platform of the Zilinx FPIC having the 11Less Green Technology for of Smart Window; (C) is the Zilinx FPIC having the IP wrapper of Noise Isolation Technology for 11Less Green Technology for of Smart Window; (D) is the block diagram for the current-limited voltage-ramping EC window controller; (E) is the block diagram for the voltage-limited current-charging EC window controller; (F) is the block diagram of the EC window controller; (G) is the design platform for the EC window controller which includes the LDVR type mode, SMPS type mode and current-limited mode, voltage-limited current charging mode, current-limited voltage ramping mode, etc; (H) is the embedded window controller; (I) is the operation of the embedded window controller; (J) is the current regulator is located at the upper power layer; (K) is the current regulator is located at the lower power layer; (L) is the circuit model for the current regulator generating the voltage source to the digital circuit, etc; (M) is the general platform for the multiple current sources; (N) is the table of comparisons between the current regulator of the noise isolation technique and the voltage regulator of the analog chip in the noisy board environment; (O) is the switching operation of the voltage regulator; (P) is the switching operation of the current regulator; (Q) is the simulation curves of the conventional Power and Ground plan; (R) is the simulation curves of the Noise Isolation Technology.

Figure 1A:
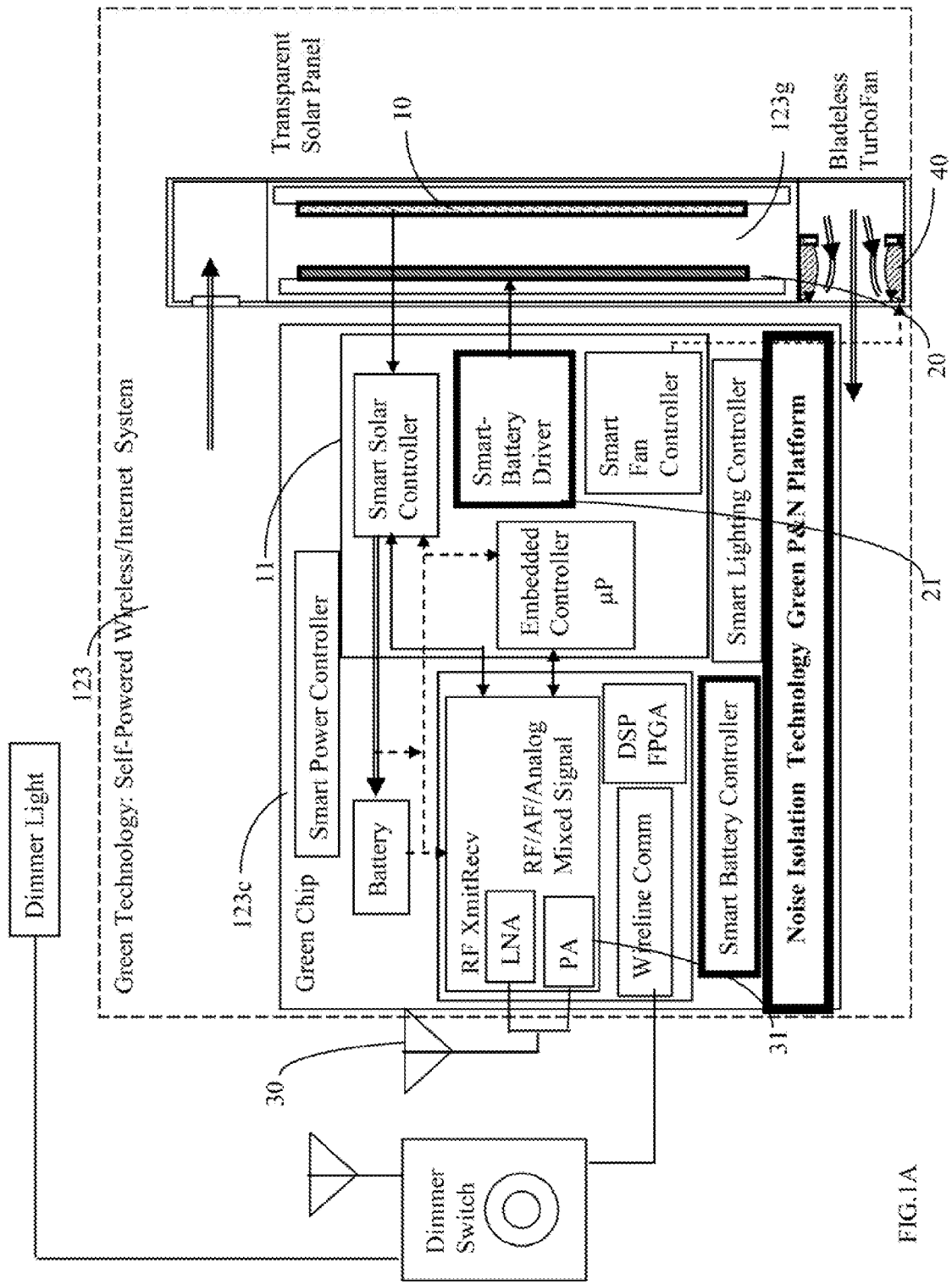

FIG. 6 is the introduction of the noise isolation technique; (A) is the conventional digital chip having the ground node (0 node) set at the board; (B) is the ground nodes (0 node) in the SPICE simulation is set at the substrate of the chip; (C) is the noise isolation having the ground node (0 node) set at the board; (D) is the analogy of the magnetic shield for the heat isolation in the fusion chamber; (E) is the electric shield for the noise isolation in the planar chip.

FIG. 7 is the fundamental pattern of the noise isolation technique; (A) is the noise isolation for the digital chip having the noiseless substrate; the Kirchhoff's Current Law (KCL) shows that $I_U=I_B$ that only one current regulator is needed; (B) is the analog circuit can co-exist in the same chip having noiseless substrate.

FIG. 8 is the substrate model; (A) is the substrate; (B) is the electric model for the substrate; (C) is the noise coupling in substrate model for noise isolation with separate ground buses; (D) is the hydraulic model for the noise coupling in substrate model for noise isolation with separate ground buses; (E) is the hydraulic model for the noise isolation technique; (F) is the electric model for the Noise Isolation Technology.

FIG. 9 is the analysis of the power and ground voltages in the noise-isolation technique; it proves that there is no substrate noise injection into the substrate; (A) is the capacitor with the current loop of charging and discharging; (B) is the capacitor with the current loop having the ground node of charging and discharging; (C) is the capacitor with the current loop having the ground node and substrate of charging and discharging; (D) is the Electric Field analogy of the Noise Isolation Technology; (E) is the power and ground voltages in the system integration with the noise isolation technology.

FIG. 10 is the comparisons to make the differential between the current regulator noise isolation platform and the voltage regulator analog-digital multi-power-bus platform; (A) is the noise isolation technique with the current regulator; (B) is the conventional analog chip to use the voltage regulator to get rid of the power supply noise by the factor PSRR power supply rejection ratio.

FIG. 11 The comparison of voltage source and current source; (A) is the voltage source; (B) is the current source; (C) is the current source of the current regulator; (D) is the adaptive current source of the current regulator.

FIG. 12 is the comparisons of the current regulator and voltage regulator; (A) is the digital switching noises in the power supply; (B) is the spectrum of the power supply having the digital switching noise; (C1) is the waveforms of signals of current regulator; (C2) is the block diagram of the current regulator; (C3) is the spectrum of the input noise signal for the current regulator; (C4) is the spectrum of the control signal for the current regulator; (D1) is the waveforms of signals of voltage regulator; (D2) is the block diagram of the voltage regulator; (D3) is the spectrum of the input noise signal for the voltage regulator; (D4) is the spectrum of the control signal for the voltage regulator.

FIG. 13 is the average current generator for the current regulator; (A) is current average; (B) is the voltage average; (C) is the current average of the current regulator being implemented with the voltage average; (D1) is the preferred implementation of the current regulator which the pre-filter serves as the average function; (D2) is the alternative implementation of the current regulator which the post-filter serves as the average function; (D3) is the cascading current regulator which has the pre-filter, post-filter for the feedback signal and the filter for the feed forward output current.

FIG. 14 is the different ways to implement the average function; (A) is the block diagram of the average; (B) is the window function in the time domain to implement the average with the integration and divider; (C) is the timing window function to implement the average function; (D) is the low pass filter to implement the average function; (E1) is the waveform of the digital switching noise; (E2) is the sampling to implement the average function; (F) is the current regulator adopting the filter as shown in the FIG. 14D and the sampling as shown in FIG. 14E2 to get the average current for the P-P type cascading current regulator; (G) is the alternative implementation of the current regulator adopting the filter as shown in the FIG. 14D and the sampling as shown in FIG. 14E2 to get the average current for the P—N type cascading current regulator. It is noted that the current regulator having the filter Fp and Fn; the voltage regulator doesn't have filter.

FIG. 15 is the fundamental current regulator; (A) is the architecture of the current regulator; (B) is the circuit and system of the current regulator.

FIG. 16 the current regulator is for the digital circuit or whole chip; the voltage regulator is for the analog or RF circuit; (A) is the architecture having the current regulator and voltage regulator; (B) is the circuit and system having the current regulator and voltage regulator.

FIG. 17 is the cascade current regulator for the digital circuit or whole chip and the voltage regulator for the analog or RF circuit; (A) is the architecture of the cascade current regulator and voltage regulator; (B) is the circuit of the cascade current regulator and voltage regulator.

FIG. 18 is the cascade current regulator for the digital circuit or whole chip; (A) is the system block diagram of the cascade current regulator; (B) is the architecture of the cascade current regulator; (C) is the circuit of the cascade current regulator.

FIG. 19 is the cascade of current regulator and the voltage regulator; (A) is the system of the cascade current regulator and voltage regulator; (B) is the architecture of the cascade current regulator and voltage regulator; (C) is the circuit of the cascade current regulator and voltage regulator.

FIG. 20 is the cascade of current regulator and the switch mode power supply; (A) is the system of the cascade current regulator and the switch mode power supply; (B) is the architecture of the cascade current regulator and the switch mode power supply; (C) is the circuit of the cascade current regulator and the switch mode power supply.

FIG. 21 is the comparison of the conventional power supply with the current regulator power supply; (A) is the switch mode power supply for the digital circuit or cascade connecting with voltage regulator; (B) is the voltage regulator power for the analog circuit or RF circuit; (C1) is the signal flow block diagram of the current regulator of which signal flowing direction is reverse of the voltage regulator; (C2) is the re-drawing of the signal flow block diagram of the current regulator of which signal flowing direction is in the left-to-right normal direction.

FIG. 22 is the current regulator; (A) is the current regulator having the constant current; (B) is the spectrum of the current regulator having the constant current.

FIG. 23 is the slow varying current regulator; (A) is the current regulator having the slow varying current; (B) is the spectrum of the current regulator having the slow varying current.

FIG. 24 is the on-chip of the versatile arrangements of the multi-power supplies; (A) is the multi-current regulator is located at the upper and lower power layer; (B) is the hierarchical view of the multi-current regulator.

FIG. 25 is the N-type fundamental current regulator as the CR in bottom ground layer shown in FIG. 1K; (A) is the architecture of the N-type current regulator; (B) is the circuit and system of the N-type current regulator.

FIG. 26 is the cascade current regulator or the hierarchical current regulator as shown in FIG. 24B; (A) is the system block diagram of the cascade current regulator or the hierarchical current regulator; (B) is the architecture of the cascade current regulator or the hierarchical current regulator; (C) is the circuit of the cascade current regulator or the hierarchical current regulator.

FIG. 27 (A) is the general current regulator noise isolation platform; (B) is the conventional mixed signal chip; (C) is the CR wrapper of the current regulator noise isolation platform for the conventional mixed signal chip.

FIG. 28 is the conventional system; (A) is the partition of the chips; (B) is the A|D waveform of the ADC or DAC; (C) is the S|P waveform of the SERDES.

FIG. 29 is the system integration of the A|D, S|P with FPGA, DSP or Embedded Controller, etc; (A) is the chip partition with the system integration of the A|D, S|P with FPGA, DSP or Embedded Controller, etc; (B) is the platform of the system integration of the A|D, S|P with FPGA, DSP or Embedded Controller, etc.

FIG. 30 is the system integration of all the RF, AF, A|D with FPGA, DSP or Embedded Controller, etc; (A) is the system integration of all the RF, AF, A|D with FPGA, DSP or Embedded Controller, etc; (B) is the platform of the system integration of all the RF, AF, A|D, S|P with FPGA, DSP and Embedded Controller, etc.

Figure 31:
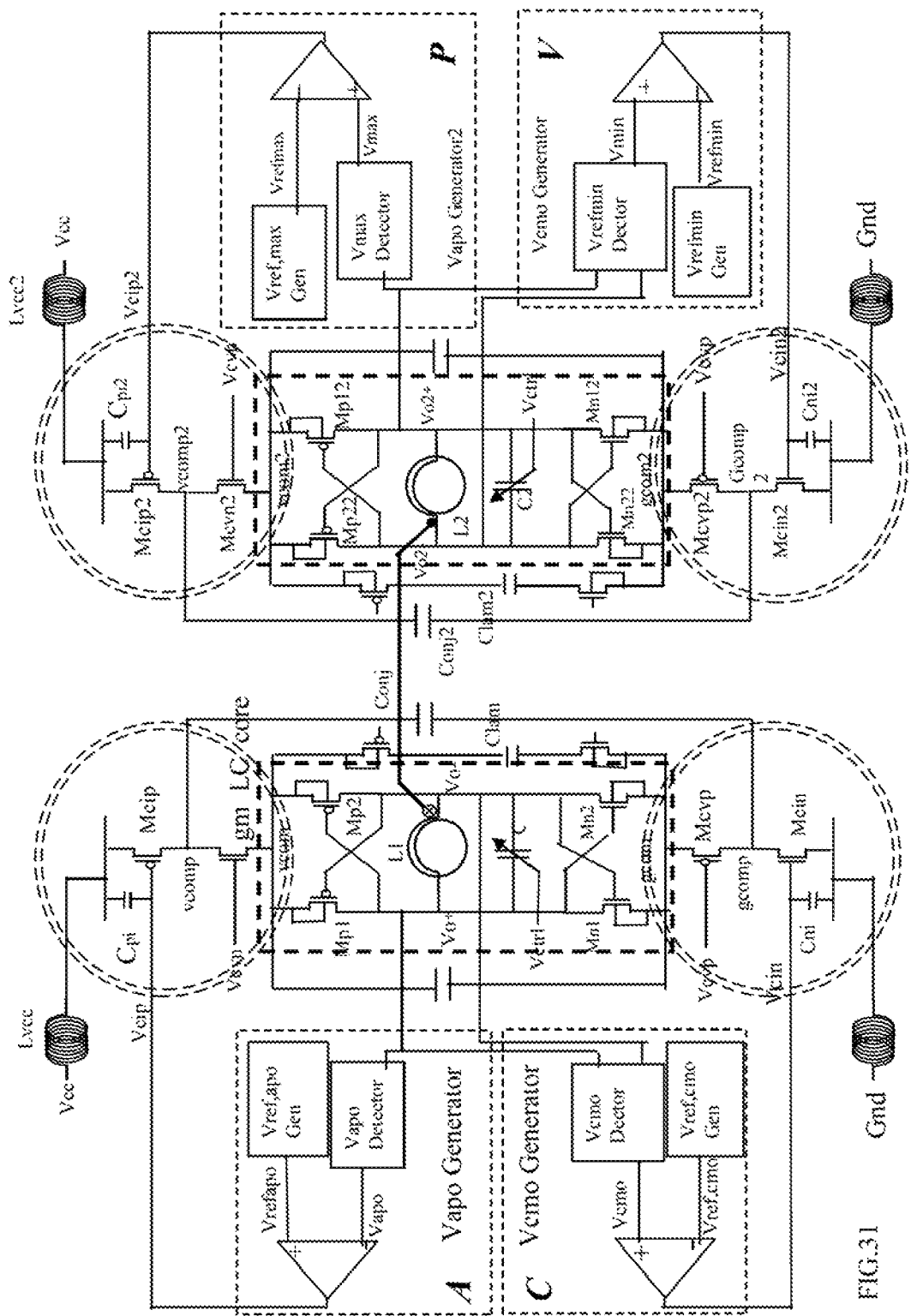

FIG. 31 is the Xtaless Clock circuit with the embedded Noise Isolation Technology to implemented in the system integration as shown in FIG. 30A.

FIG. 32 is the comparison of the performance of the super-drive ADC with the conventional and comparator based ADC; (A) is the multiplying digital-to-analog converter MDAC of the conventional pipeline ADC; (B) is the multiplying digital-to-analog converter MDAC of the comparator based ADC; (C) is the multiplying digital-to-analog converter MDAC of the super-drive ADC; (D) is the comparison of speed of the super-drive ADC with the conventional and comparator based ADC; (E) is the comparison of speed, accuracy and power of the super-drive ADC with the conventional and comparator based ADC; (F) is the schematics of the MDAC of the super-drive ADC.

FIG. 33 is the low power ultra-fast dynamic power supply for the high peak-average-ratio PAR radio frequency RF signal power amplifier; (A) is the waveform of the high PAR input signal; (B) is the circuit of the low power ultra-fast dynamic power supply for the power amplifier to have the high power efficiency and low power operation.

FIG. 34 is the operation characteristics of the Electro-Chromic EC window; (A) is the layered structure of the EC window; (B) is the electrical model of the EC window; (C) is the signal flow of the temperature compensated EC window switching algorithm; (D) is the optical hysteresis curve of EC window; (E) is the operation of the EC window.

FIG. 35 is the switching operation of EC window; (A) is bi-polar operation of the EC window; (B) is the uni-polar operation of the EC window; (C) is the non-linear uni-polar operation of the EC window; (D1) is the uni-polar operation for the positive voltage; (D2) is the uni-polar operation for the negative voltage.

FIG. 36 is the EC window uni-polar operation with the H-Bridge; (A) is the uni-polar operation of the region 1 charging up EC window in FIG. 35A and FIG. 35B; (B) is the uni-polar operation of the region 2 hold EC window in FIG. 35A and FIG. 35B; (C) is the uni-polar operation of the discharging EC window of region 3 in FIG. 35A and FIG. 35B; (D) is the uni-polar operation of the charging up EC window of region 4 in FIG. 35A and FIG. 35B; (E) is the uni-polar operation of the hold EC window of region 5 in FIG. 35A and FIG. 35B; (F) is the uni-polar operation of the discharging EC window of region 6 in FIG. 35A and FIG. 35B.

FIG. 37 is to show the H-Bridge operator operating on the power circuit to generate the EC window controller; (A1) is the analog buffer circuit with the H operator; (A2) is the H-Bridge operator operating on the analog buffer to generate the voltage ramping circuit; (B1) is the buck converter circuit with the H operator; (B2) is the H-Bridge operator operating on the capacitor load of the buck converter to generate the voltage ramping or current charging circuit; (C1) is the buck converter circuit with the H operator operating on the inductor and capacitor, etc; (C2) is the H-Bridge operator operating on the inductor and capacitor load of the buck converter to generate the voltage ramping or current charging circuit; (D1) is the buck converter circuit with the H operator operating on the whole buck converter; (D2) is the H-Bridge operator operating on the buck converter to generate the voltage ramping or current charging circuit.

FIG. 38 is the EC window controller; (A) is the architecture of the H-Bridge buck converter type EC window controller; (B) is the block diagram of the H-Bridge buck converter type EC window controller; (C1) is the algorithm of the current-limited voltage ramping in charging up phase; (C2) is the algorithm of the current-limited voltage ramping in discharging phase; (D1) is the algorithm of the voltage-limited current charging in charging up phase; (D2) is the algorithm of the voltage-limited current charging in discharging phase.

FIG. 39 is the super-performance EC window driver which can be developed to be the dedicated chip for the window controller; (A) is the bleaching process; (B) is the coloring process; (C) is the complete super-performance EC window driver.

FIG. 40 is the analysis of the analog buffer type voltage ramping; (1) is the analogy of analog buffer with the power supply system; (B) is the power supply of the analog buffer voltage ramping EC window controller; (C) is the waveform of the analog buffer type voltage ramping operation; (D) is the analog buffer circuit for the voltage ramping EC window controller.

FIG. 41 is the operation of the self-cleaning sputtering chamber; (A) is the characteristics of the gas reaction sputtering process; (B) is the detonating phenomena in the gas reaction sputtering chamber; (C) is the self-cleaning sputtering process; (D) is the block diagram of the system of the self-cleaning sputtering chamber.

FIG. 42 is the high performance EC window manufacturing process; (A) is the recursive/pipeline manufacturing process flow for the high performance EC window manufacturing process; (B) is the section view without the plating and hardening process; (C) is the section view with the plating and hardening process.

FIG. 43 (A) is the smart fan having the bladeless turbofan and humidity/de-humidity/filter air-conditional multi-function; (B) is the section view of the smart fan embedded in the smart window; (C) is the working principle of the bladeless turbofan.

DESCRIPTION AND OPERATION

Figure 1B:
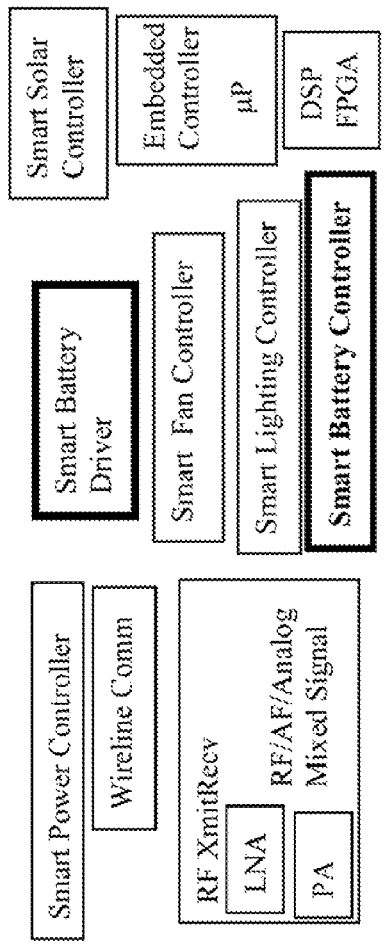
Figure 1C:
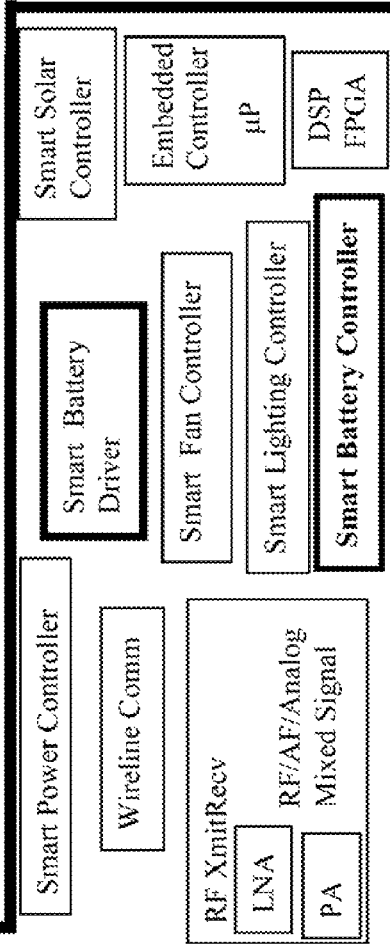

The Green Technology is the reduction of energy consumption, noise generation and resource saving. The green technology integration system comprises an Insulated Glass Unit IGU. The Insulated Glass Unit IGU further comprises the electrochromic window and the solar cell window. As shown in FIG. 1A, the green technology 123 has the window 123g comprising both solar panel 10 and EC panel 20. The IGU Isolated Glass Unit 123g has the solar panel 10 and EC panel 20. The solar panel 10 and the Switch Mode Power Supply SMPS 11 provide the solar power energy to the Green Technology System 123 and the smart fan as shown by the dotted line. In the smart window, there are six smart controller of the smart window controller, smart lighting controller, smart solar controller, smart battery controller, smart power controller and smart fan controller. As shown in FIG. 1B and FIG. 1C, Zilinx' FPIC will integrate all the six smart controller on the same platform to be one single chip.

The solar cell window provides the electricity to the electrochromic window to be self-contained IGU means. All the controllers will be embedded in the frame of the IGU means. The IGU further comprises the smart fan controller and the smart fan. In the smart fan, there are the bladeless turbofan, air conditioner means of humidity/de-humidity/air-filter multiple function. The bladeless turbine circulates the air for air conditioning. In the winter, the ceiling portion warm air will be sucked in to the channel inside the IGU then be blown out at the bottom by the blades turbofan. As shown in FIG. 43A, it is the bladeless turbofan. The blade of the turbofan is hidden inside the ring frame and cannot reached from outside that it named as the bladeless. As shown in FIG. 43C, the gear 44 of the motor drives the blade 41 of the turbofan. The air is sucked to flow through the humidify/de-humidify/air-filter 41 and flows out of the slot 42. As shown in FIG. 43B and FIG. 43C, the expanded cone 43 makes the air pressure to drop to suck more air to flow through the center of the cone. The air multiplying factor is about 16. One volume of air flows through the blade, there are sixteen times air volume flows out the cone. As shown in FIG. 1A, the warm air at the ceiling is sucked into the side channels of the IGU and is blown out at the floor. It keeps the fresh air circulating in the room that a lot of energy is saved.

Figure 1D:
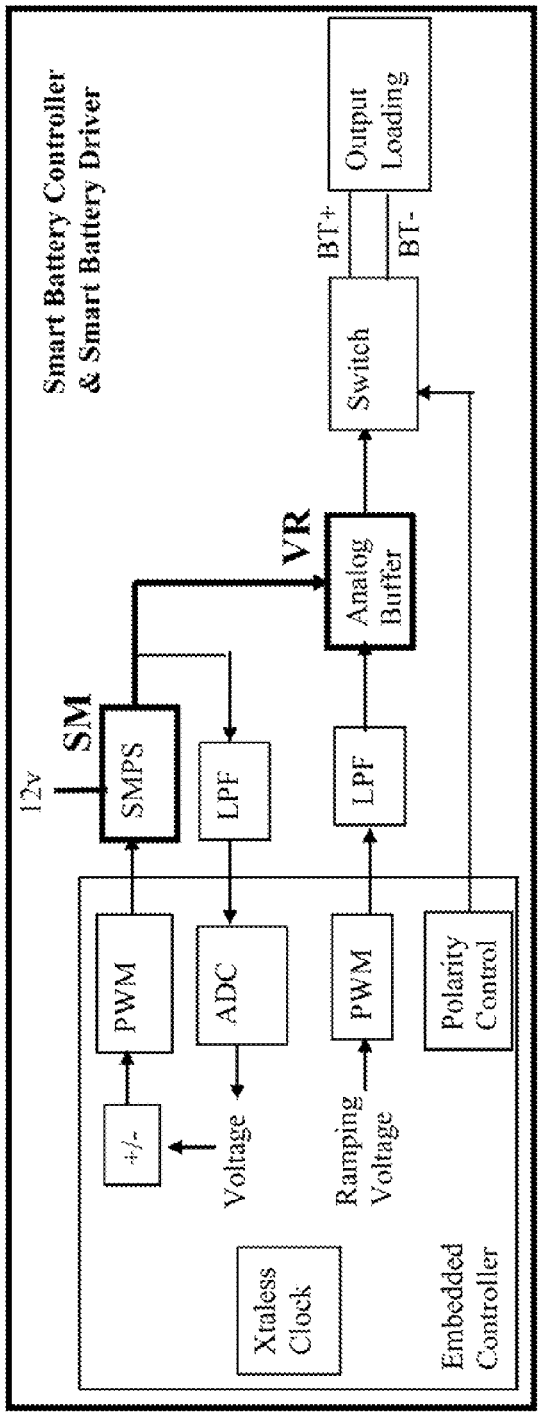
Figure 1E:
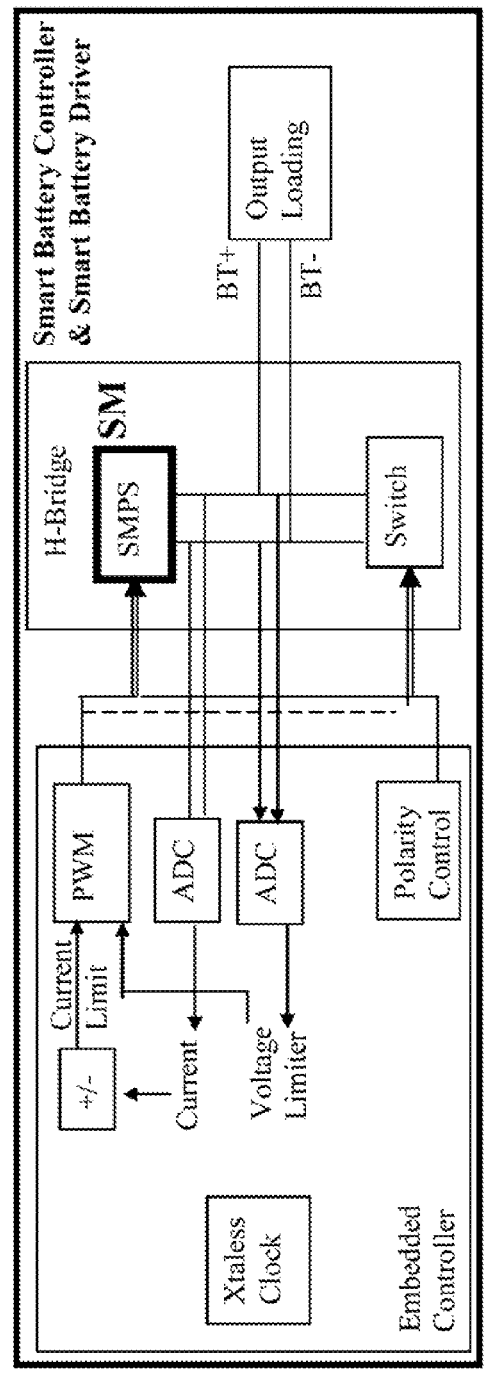

The smart EC window 20 can be operated as either the dimmer window or bi-state window. As shown in FIG. 1D and FIG. 1E, the window controller adopts the embedded controller. FIG. 1D is the system block diagram for the current-limited voltage ramping EC window controller. FIG. 1E is the system block diagram for the voltage-limited current charging EC window controller. In the embedded controller, there are embedded ADC and embedded Xtaless Clock. In the embedded Xtaless Clock, there are the embedded current regulators.

There are the wireline connection and/or the wireless connection for the dimmer/bi-state window and light to integrate the light and window to be building management system. There are wireless connection and the switching power in the Green Technology for the smart window. However, the wireless is sensitive to noise and the switching power generates a lot of noise. To be consumer product, the cost must be low that the switching power, digital, analog and wireless, etc will integrate together to be a customer ASIC Application Specific Integrated Chip. To enable the Green Technology, we must have the Noise Isolation Technology NIT first.

Figure 1G:
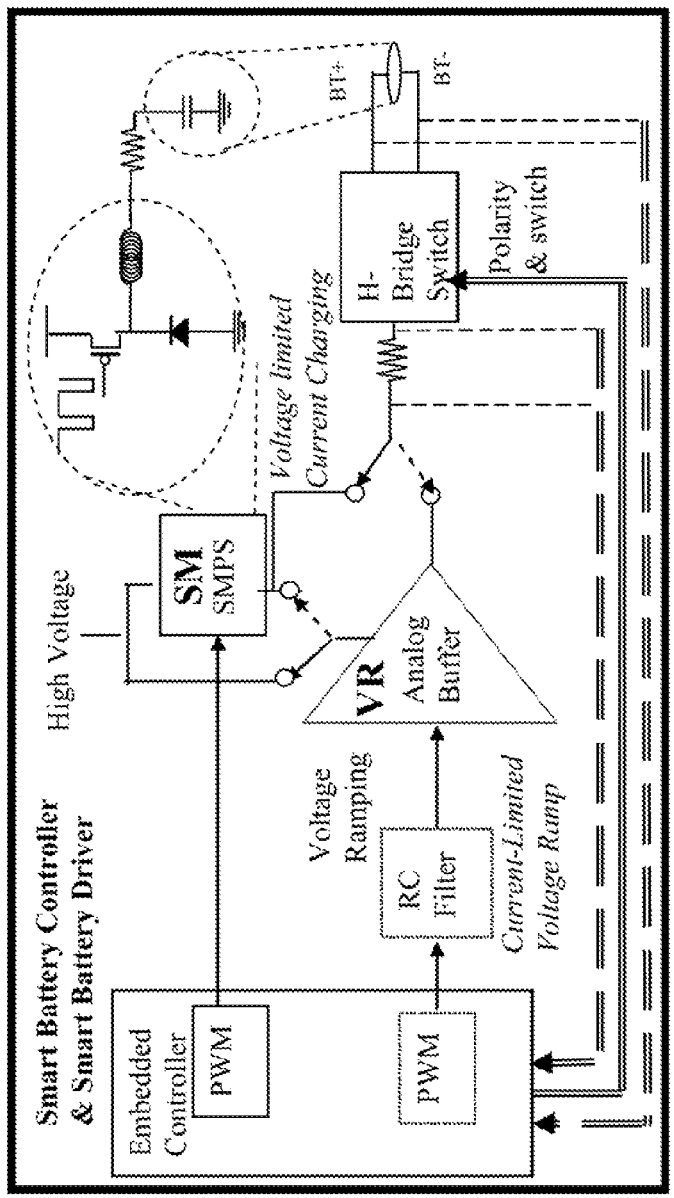
Figure 1I:
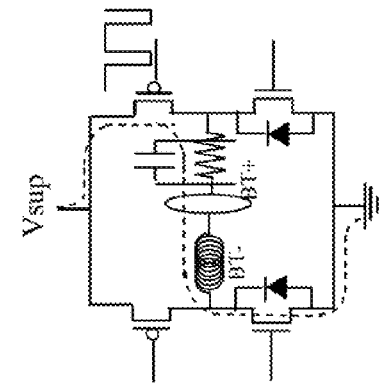
Figure 1H:
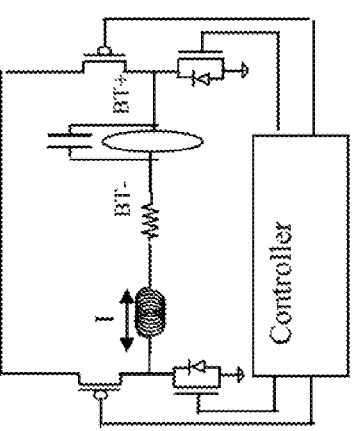
Figure 1F:
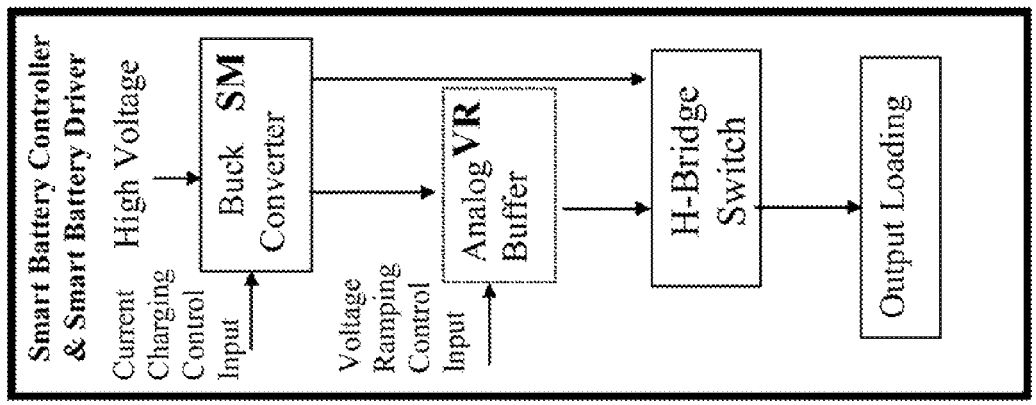
Figure 1R:
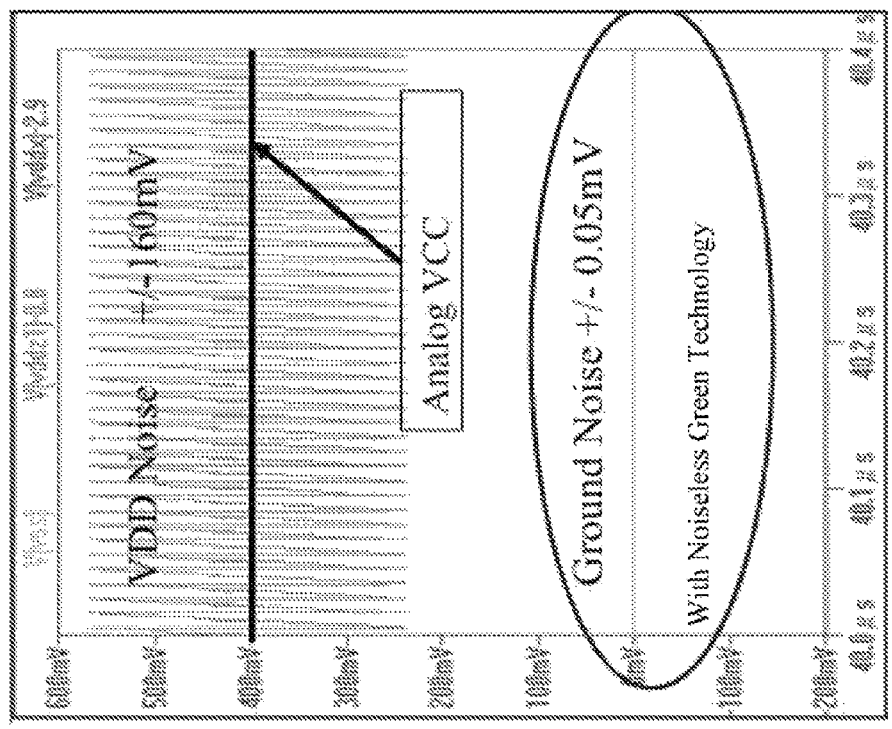
Figure 1Q:
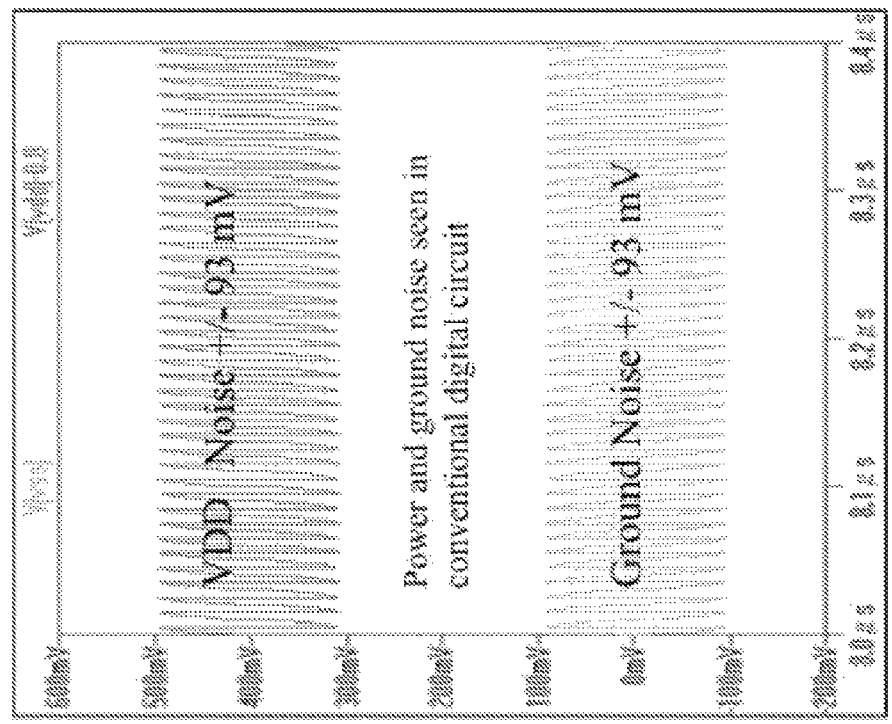

From FIG. 1A to FIG. 1R, they show the complete system of the Zilinx: the 11Less Green Technology for FPIC of Smart Window based on the embodiments of layered based noise isolation integrated circuit structure. The FIG. 1J shows the layered based noise isolation integrated circuit has the upper power layer to be noise and leaskage isolation CR layer. The FIG. 1K shows the layered based noise isolation integrated circuit has the bottom ground layer to be noise and leaskage isolation CR layer. FIG. 1L shows the conventional integrated circuit structure having no layered based noise isolation integrated circuit structure. FIG. 1M shows the layered based noise isolation integrated circuit has both the upper power layer to be noise and leaskage isolation CR layer and the bottom ground layer to be noise and leaskage isolation CR layer. As shown in FIG. 1N and FIG. 1P, the noise isolation current regulator CR is adoped in the upper power layer and the bottom ground layer to be noise and leaskage isolation CR layer as shown in FIG. 1J, FIG. 1K and FIG. 1M. As shown in FIG. 1A, the system and architecture of Zilinx: the 11Less Green Technology for FPIC of Smart Window is implemented with the Noise Isolation Technology Green P&N. As shown in FIG. 1B, the 11Less Green Technology for FPIC of Smart Window is implemented with the platform of Noise Isolation Technology Green P&N. As shown in FIG. 1C, the 11Less Green Technology for FPIC of Smart Window is implemented with the Noise Isolation Technology Green P&N Platform has both UPPER POWER LAYER CR Noise & Leakage Isolation and BOTTOM GROUND CR LAYER Noise & Leakage Isolation. As shown in FIG. 1C, FIG. 1D, FIG. 1E, FIG. 1J and FIG. 1K, the Smart Battery Controller and Smart Battery Driver of the Smart Window are implemented with the Noise Isolation Technology Green P&N Platform. As shown in FIG. 1L and FIG. 1Q, the ground of the conventional integrated circuit has a lot of noise. As shown in FIG. 1M and FIG. 1R, the ground of the layered based noise isolation has no noise at all. To eliminate the EMI radio noisy interference to the cellular phone, etc, the smart window does need the layered based noise isolation.

Figure 4C:
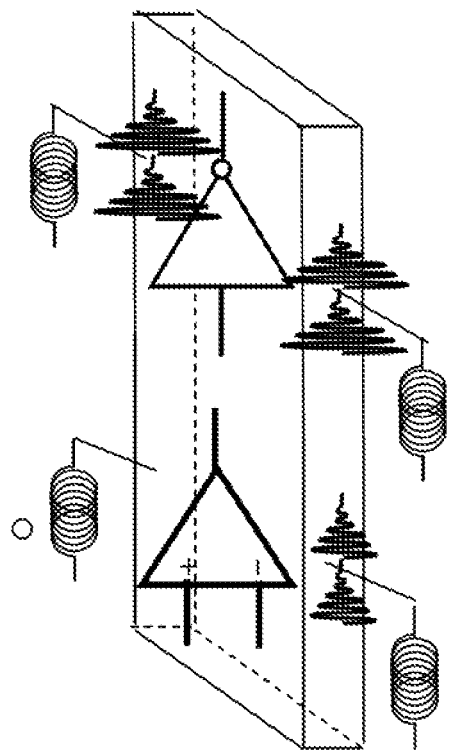
FIG. 4 is the impact of the substrate noise coupling; (A) is the analog chip; (B) is the digital chip having the substrate noise; (C) is the substrate noise coupling in the integration of the analog chip and the digital chip; (D) is the noise coupling mechanism of the substrate noise.
Figure 4D:
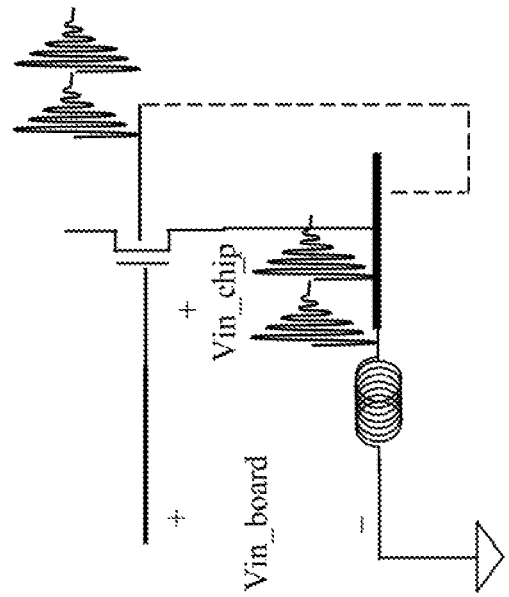

As shown in FIG. 2, the generated noise and system degraded are the function of the frequency. As shown in FIG. 2A, the switching frequency is low that the slopes of the rising edges and falling edges can be slow. As shown in FIG. 2B, the switching frequency is high that the slopes of the rising edges and falling edges are fast. As shown in FIG. 2C, as the frequency increase, the slew rate of the digital switching increases. The charging and discharging of the digital circuit has to finished in much smaller time that the switching noise of L(dI/dt) of the package inductor increases. It induces the power and ground noises. The noise injected into the substrate becomes the coupling substrate noise. As shown in FIG. 4D and FIG. 2C, the substrate coupling noise injected into the circuit and system causes the degrade of the circuit and system performance. The signal to noise ratio S/N and SINAD decrease. The SINAD is the ratio of the wanted signal (the fundamental) to the sum of all distortion and noise. The Effective Number of Bits ENOB decreases where

ENOB=(SINAD−1.76)/6.02

Figure 2A:
FIG. 2 is the frequency impact on the Green Technology. (A) is the low frequency clock/signal waveform; (B) is the high frequency clock/signal waveform; (C) is the chain reaction mechanism of the frequency effect impact on the system integration; (D) is the performance degrade as the function of the frequency for the analog/ADC or RF/LNA circuit performance.
Figure 2B:
Figure 2C:
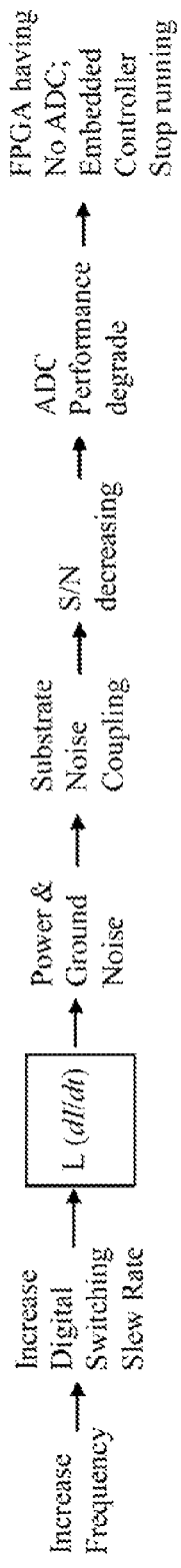
Figure 2D:
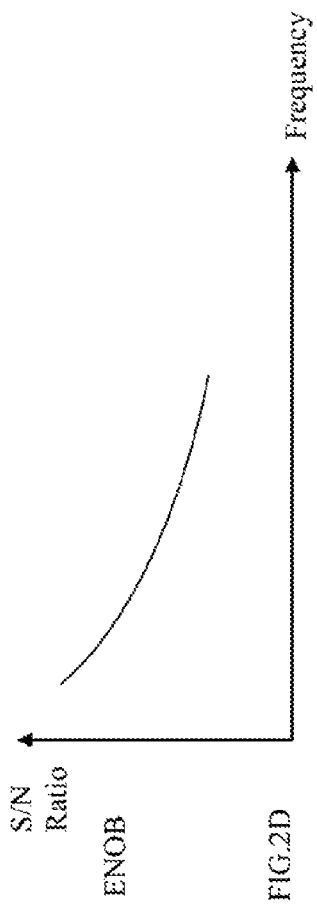
Figure 27A:
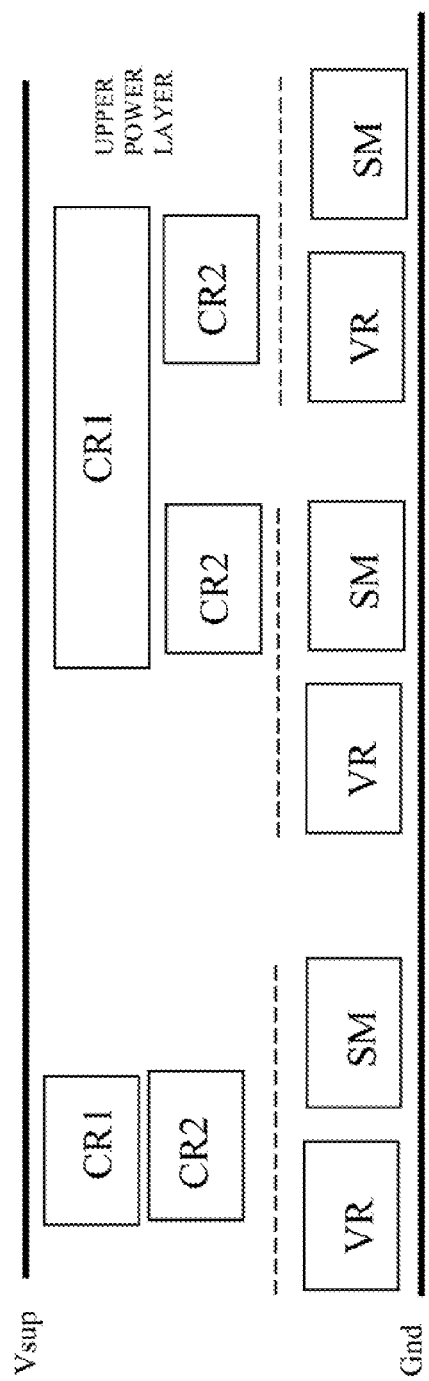
Figure 27C:
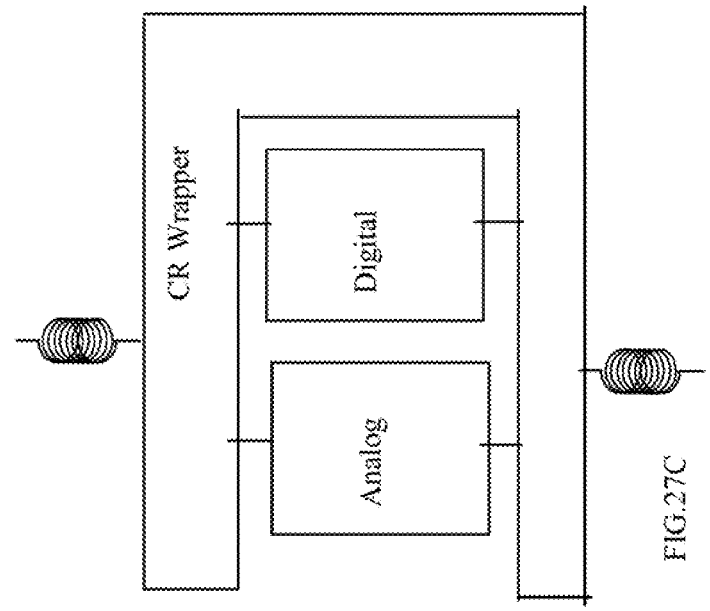
Figure 27B:
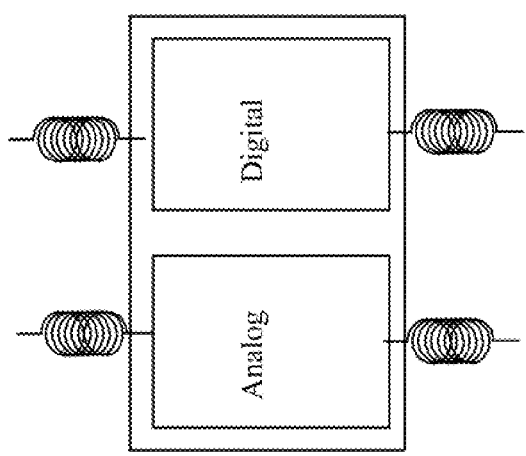

As shown in FIG. 27B and FIG. 2D, the ENOB decrement of the ADC on the FPGA is unpredictable and unacceptable that the ADC and DAC cannot integrated on the FPGA.

Figure 3A:
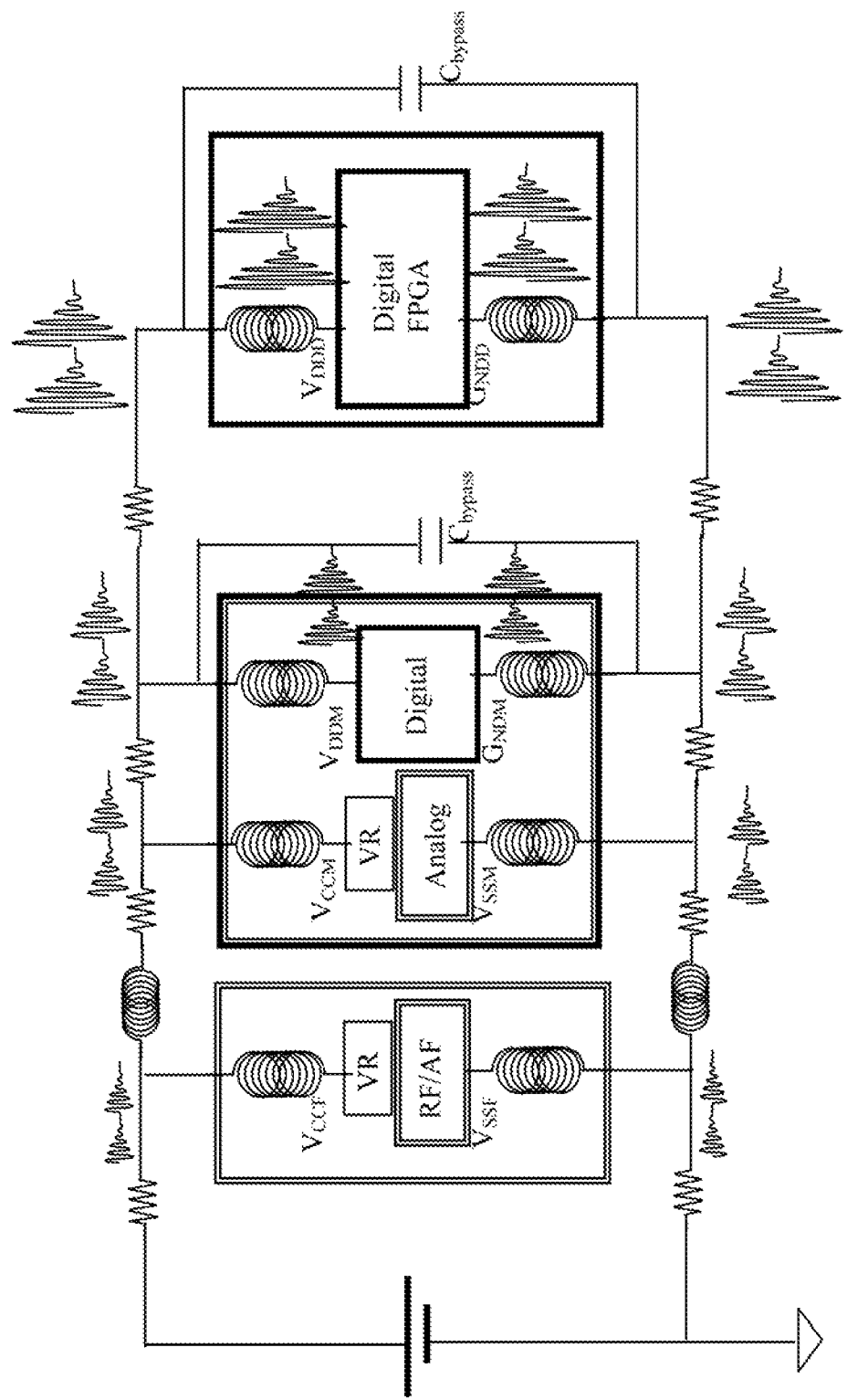
FIG. 3 is the conventional system; (A) is the partition of the system to be chips; (B) is the signal level and the substrate noise level of the chips.
Figure 5B:
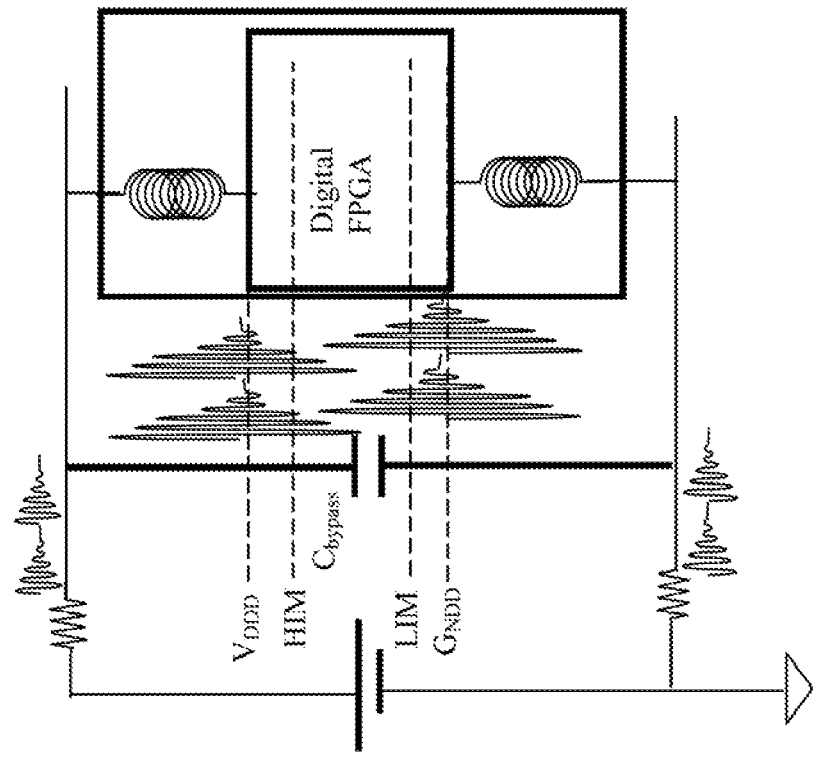
FIG. 5 is the conventional digital and FPGA switching noise; (A) is the switching noise generated by the digital and/or FPGA chips; (B) is the switch noise augmented by the decoupling capacitor.
Figure 5A:
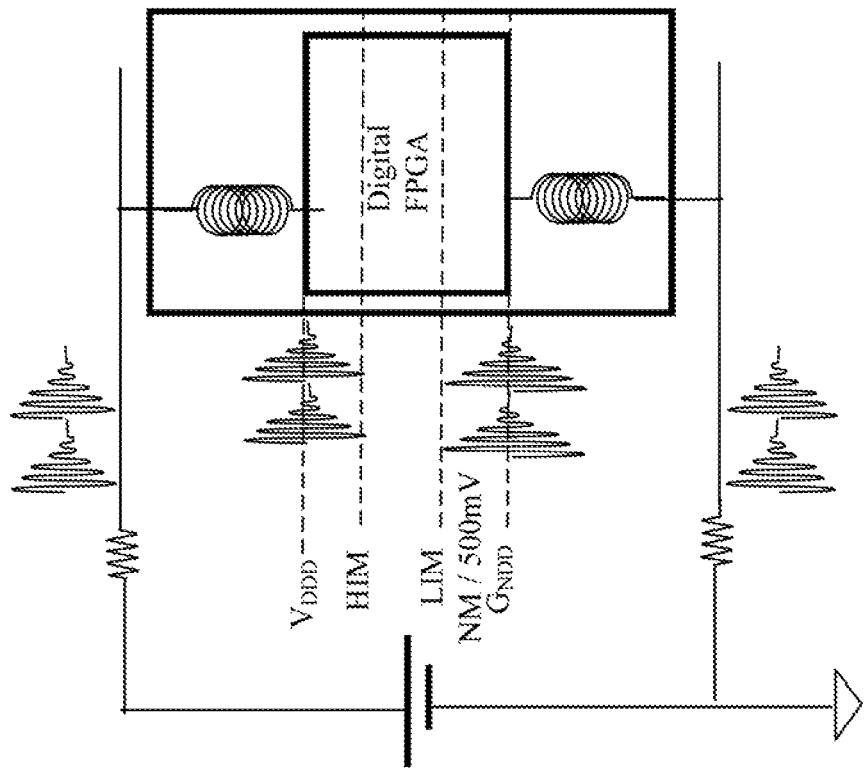

To solve the noise in system, the conventional system is partitioned as shown in FIG. 3A. The system is partitioned to be RF/AF chip, Mixed Signal Chip and Digital/FPGA chip. The parametric inductance of the package generates a lot oscillation in power and ground. To minimize the noise dumped on the board, there is the bypass capacitor $C_{bypass}$. As shown in FIG. 5A and FIG. 5B, this bypass capacitor $C_{bypass}$ makes the on-chip oscillatory noises even worse. All the switching noise is dumped on the board. For the analog chip, there is the on-board inductor/choke to block the digital switching noise from the noise contamination of the analog and RF chip.

Figure 3B:
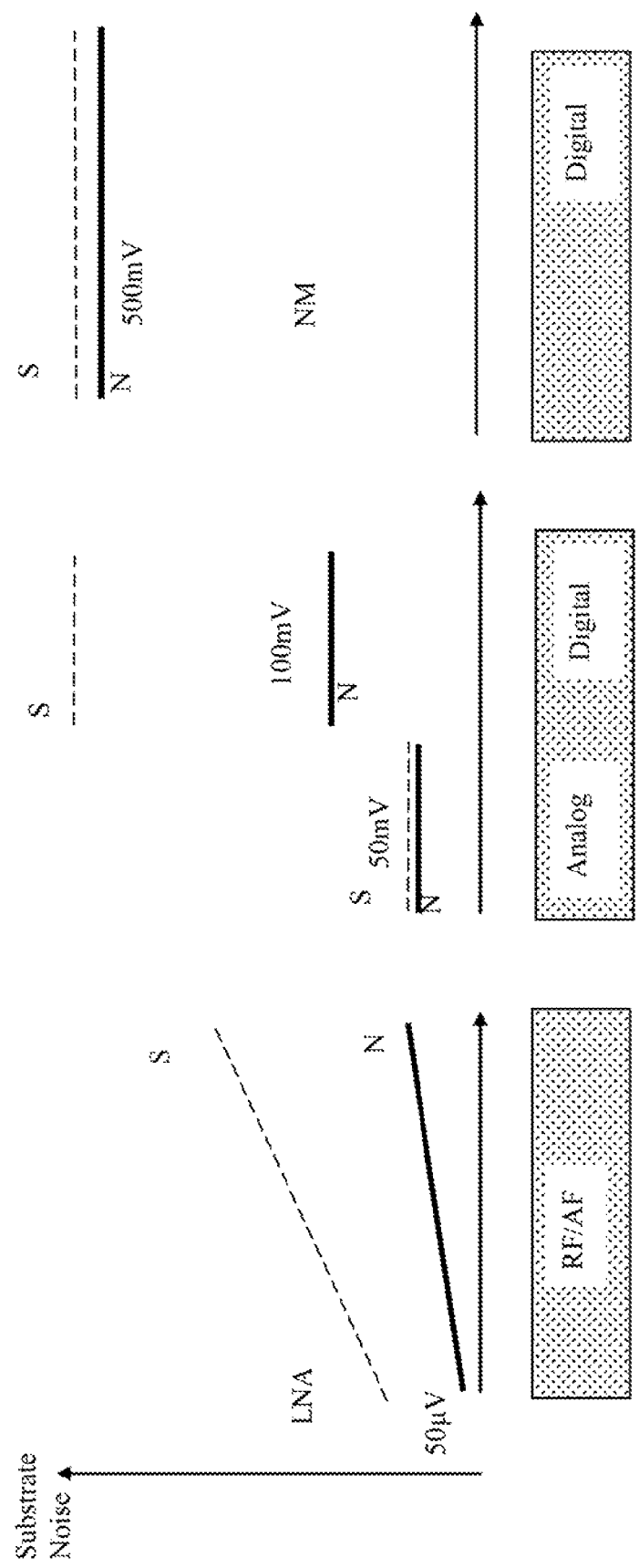

As shown in FIG. 3B, to keep the circuit performance requirement, the substrate noise for the RF/AF chip, Mixed Signal Chip and Digital/FPGA chip are bounded at separate levels. As long as these noise levels are matched at the boundaries, the signal can transmit across the chip boundaries without the loss of information.

The RF/AF signal and noise will be amplified along the chain. The noise level at the front end of LNA is very small. For the mixed signal, the substrate noise of the ADC signal has to be small. As the analog signal is converted to be the digital signal, the substrate noise can be raised to be the noise margin. However, the size of the mixed signal chip is bounded by the allowable substrate noise of the ADC. The large digital circuit has large substrate noise which is exceed the allowance of the substrate noise of the ADC. So, the mixed signal chip cannot have large digital circuit and cannot integrated with the FPGA. Furthermore, for the FPGA, it is due to the uncertainty of the user programming digital circuit, a lot of fine tuned mixed signal techniques fails to work such as the different switching time of IO, etc. It makes the ADC not be able to integrated with the FPGA.

Figure 4A:
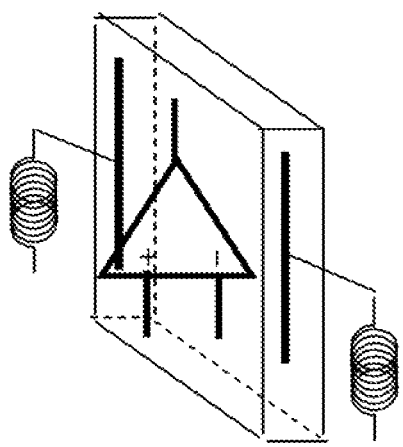
Figure 4B:
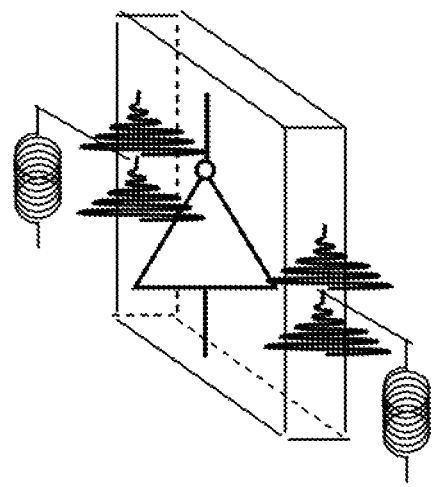

As shown in FIG. 4A, it is the analog circuit in the AF/RF chip. There is no switching noise in the power and ground. As shown in FIG. 4B, it is the digital circuit in the digital/FPGA chip. There is switching noise in the power and ground. As shown in FIG. 4C, it is the mixed signal chip or large system integrated chip. There are switching noise and the switching noise injecting into the substrate to be the coupled substrate noise.

FIG. 4D shows how the ways the substrate noises coupling into the circuit to destroy the circuit performance such as S/N and ENOB, etc. First, the on-board signal Vin_board will be much different the on-chipVin_chip.

$Vin\_board=Vin\_chip+N\_substrate$ $Vin\_chip=Vin\_board-N\_substrate$

It means the substrate noise N_substrate becomes the circuit input signal at the front gate. Second, the substrate noise N_substrate applies on the substrate of the input MOS. It is the back gate effect. Due to the dual substrate noise effect of the front gate and back gate, the RF circuit such as LNA Low Noise Amplifier cannot allow the digital switching circuit to be integrated into the RF/AF chip.

Regarding to the substrate noise, there are a lot of misunderstanding and mistakes in the system design. As shown in FIG. 5A, the digital circuit or FPGA generates the digital switching current. As the digital switching current flowing through the parametric inductor, the digital switch noise oscillations are generated. The digital switching noise is dumped on the board and it contaminates the board. It is assumed the board having the infinite large capacitance and to be the solid power ground.

However, as the board shrinks, the assumption of the board having the infinite large capacitance is no more valid. The traditional way to dump the noise on the board is no more allowed in the disciplinary of rigorous board design. To reduce the noise dumped on the board, as shown in FIG. 5B, there is the bypass capacitor $C_{bypass}$ connecting between the power and ground. However, this bypass capacitor $C_{bypass}$ makes the chip substrate noise even larger than the chip having no bypass capacitor $C_{bypass}$. It is due to the bypass capacitor $C_{bypass}$ offering the storage of extra energy for substrate noise. Comparing FIG. 5B with FIG. 5A, it shows the substrate noise of chip having the bypass capacitor $C_{bypass}$ will be much larger than the substrate noise of chip having no bypass capacitor $C_{bypass}$. To reduce the substrate noise, it had better not to add the bypass capacitor $C_{bypass}$. It is completely reverse the conventional thinking of the design practice.

Due to the fundamental wrong concepts about the substrate noise, it is no wonder the substrate noise problem becomes the mysterious and nobody can solve it. Actually, the substrate noise is the essential problem of the planarization of the chip system integration design. It is beginning with the Bell Lab in 1950 for the first planar device in system integration. For so many years, there is no fundamental theory to solve this substrate noise coupling problem in the planar device system integration. It is due to the industry and academic world having no grand master to formalize the fundamental problem and solve this fundamental problem. With the multi-disciplinary training, now the grand master Ming recognized the fundamental problem and solved this problem. The Noise Isolation Technology is introduced as follows.

Figure 6A:
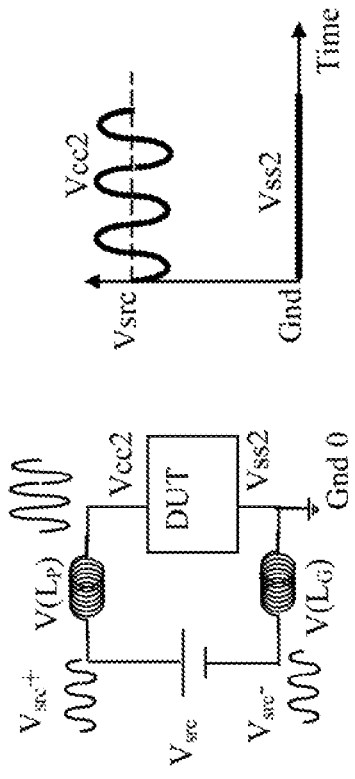

As shown in FIG. 6A and FIG. 18D, the Device Under Test DUT has the digital switch and the power and ground are oscillatory in the conjugate phases. The ground is on board to be at the bottom of the voltage source Vsrc. The Vsrc+node voltage is Vsrc and the Vsrc− is 0V. The ground having the infinite capacitance and have the constant voltage, 0V. The power goes up and the ground goes down, and vice versa. As the P-device and N-device of the digital circuit are both on, there is the crowbar current. We might consider the power and ground are "shorted" by the P-device and N-device of the digital circuit. So, the power is pulled down and the ground is pulled up to be short together. At the same time, the parametric inductor tries to supply more current for the crowbar current. As the circuit having no more shorted path and there is no more crowbar current, however, the inductor current still flows in large amount. The continuous flows of the inductor will charge up the Vcc1 power node and discharge the Vss1 ground node. It causes the Vcc1 to go upward and the ground to go downward. The cycle of the power ground oscillation will be the doubling frequency of the switching frequency of the digital circuit. The oscillation of the power and ground are in conjugate 180° out of phase.

Figure 6B:
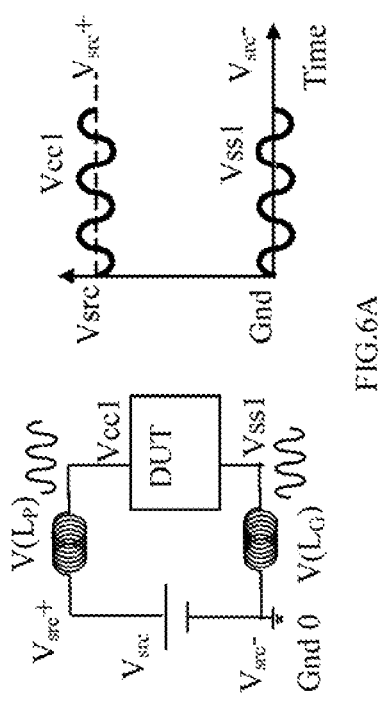
Figure 6E:
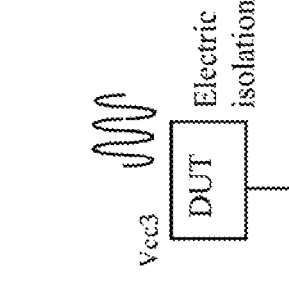
Figure 6D:
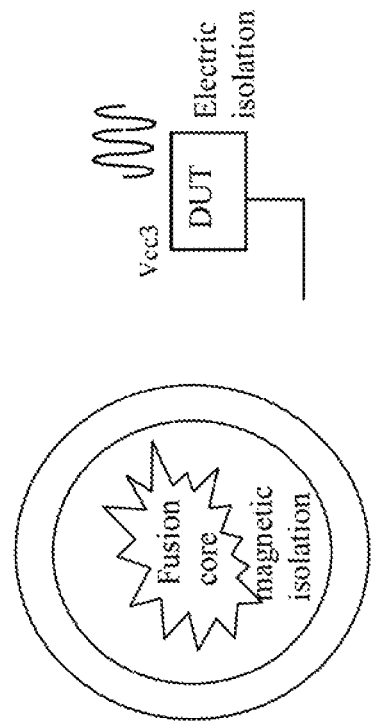
Figure 6C:
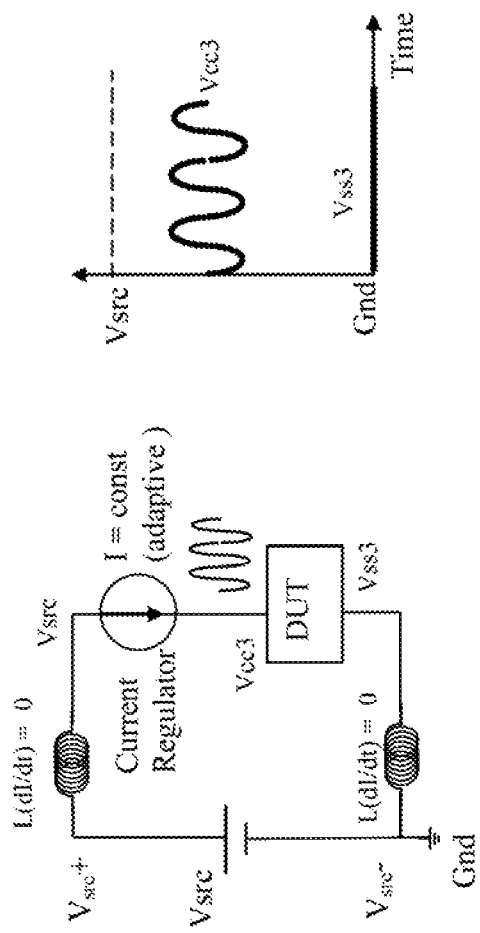

It is very hard for the industrial and academy to change the concept to accept the concept that the substrate noise can be zero with the proper design of circuit. To illustrate the zero substrate noise concept, two different zero substrate noise conditions are introduced for comparison. FIG. 6B is virtual mathematical game and FIG. 6C is the real world Noise Isolation Technology.

Now, as shown in FIG. 6B, in the spice simulation, we move the ground 0 node having the 0V to the on-chip ground node Vss2. Now, the Vss2 has the 0V. Vsrc− has the Vss1 voltage. The Vsrc+=Vss1+Vsrc that the Vss+curve is in phase of Vss−. For the two cases of FIG. 6A and FIG. 6B, the voltage across the inductor should be the same.

$$V(Vcc2) = V(Vsrc+) + V(L_P)$$
$$= V(L_P) + Vsrc + V(Vsrc-)$$
$$= V(L_P) + V(L_G) + Vsrc$$
$$V(Vss2) = 0$$
$$V_A(Vcc2) = V(L_P) + V(L_G)$$

with $$V(L_P) = -V(L_G) != 0$$

$$Vss2 = Gnd(0v)$$

This is the mathematical and simulation trick. It shows the substrate noise can be zero and the power oscillation is double as the coordinate reference of ground node 0 is moved. It gives the implication that the substrate noise can be zero in the mathematical virtual world.

Now, with our innovative Current Regulator of Noise Isolation Technology, as shown in FIG. 6C and FIG. 1R, in the physical real world, the substrate noise is real zero.

$$V(Vss3) = 0$$

$$V_A(Vcc3) = V_A(Vcc2)$$

with $$V(L_P) = V(L_G) = 0$$

$$Vsrc- = Gnd$$

The conventional noise technology is to try to reduce or get rid of the digital switch noise. Our approach is completely different. We are not to reduce or get rid of the digital switch noise. Our innovation is to confine the noise in the local power node VCC3 and isolate it from the substrate. Just as the heat isolation using the magnetic shield in the fusion reaction as shown in FIG. 6D, our noise isolation uses the electric shield in the planar chip as shown in FIG. 6E. Instead of the dump of the noise on the board, our innovation is to confine the noise in the digital power bus of each individual chip locally. The board is clean without noise.

Figure 7A:
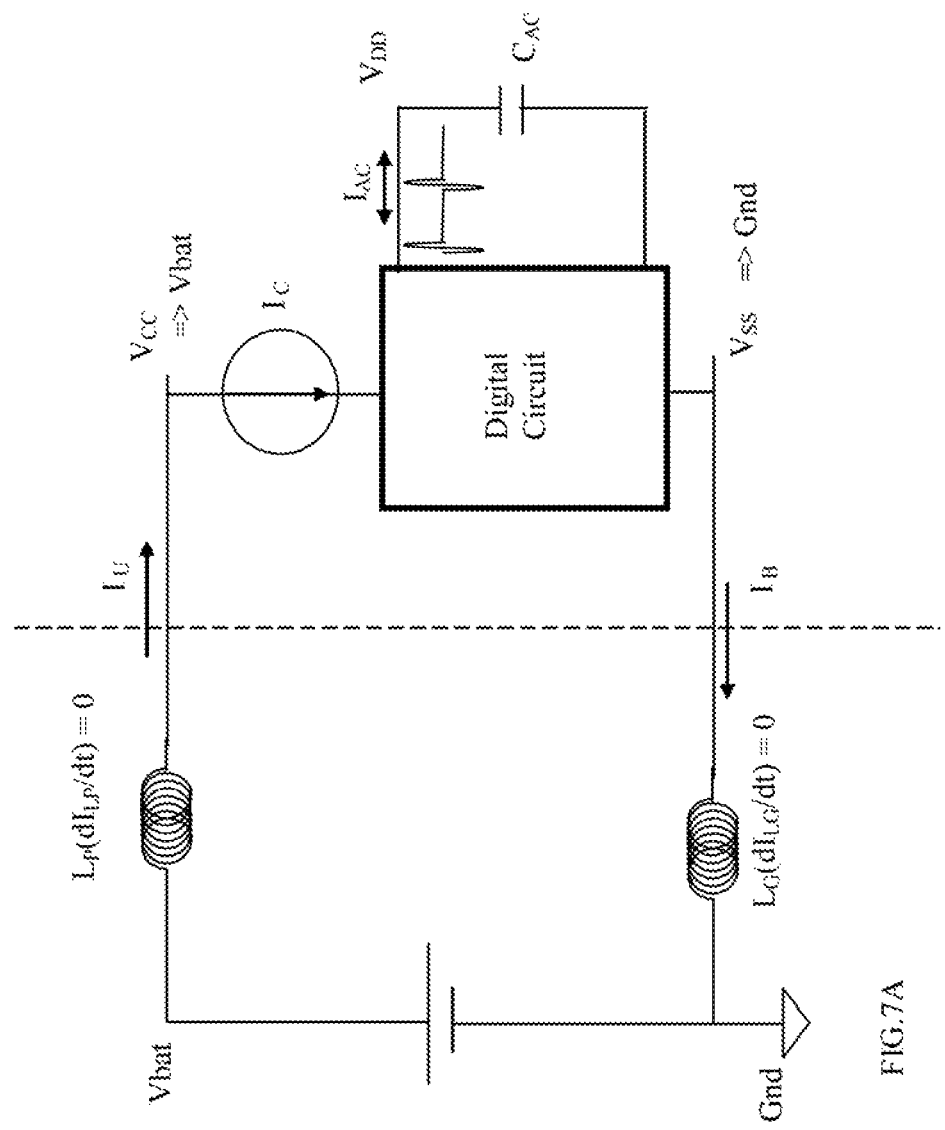

As shown in FIG. 7A, ideally, the current regulator regulates the current supply to be a constant current source IC. As the digital circuit is switched, all the time varying current $I_{AC}$ flows through the capacitor $C_{AC}$. $I_{LP}$ and $I_{LG}$ are the current flowing through the parametric inductors.

$$I_{LP} = I_U = I_C = \text{const}$$

$$L_P(dI_{LP}/dt) = 0$$

Furthermore, according to Kirchoff's Current Law, the section cut is shown as the dotted line, we have $I_U = I_B$.

$$I_{LG} = I_B = I_U = \text{const}$$

$$L_P(dI_{LG}/dt) = 0$$

As shown in FIG. 5A, the inductor is the noise amplifier of the noisy instantaneous current with the L(dI/dt) mechanism. As shown in FIG. 7A, the noise isolation technique has the instantaneous current $I_{AC}$ to be confined locally with the local bypass storage capacitor $C_{AC}$. The $I_{AC}$ doesn't go through the inductor $L_G$. The green technology integration system has the noise isolation further comprising capacitor $C_{AC}$ at the output to absorb variance of current loading to keep variance of current flowing through the current regulator $I_C$ to be minimum.

As shown in FIG. 7A, with the short circuit $L_G(dI_{LG}/dt) = 0$ of the parametric inductors, the substrate Vss is clamped to be the zero voltage by the ground 0, Gnd. All the noise is confined and isolated at the node VDD and the ground and substrate is at 0V and is shorted and clamped by the ground 0 with the inductor $L_G$.

Figure 7B:
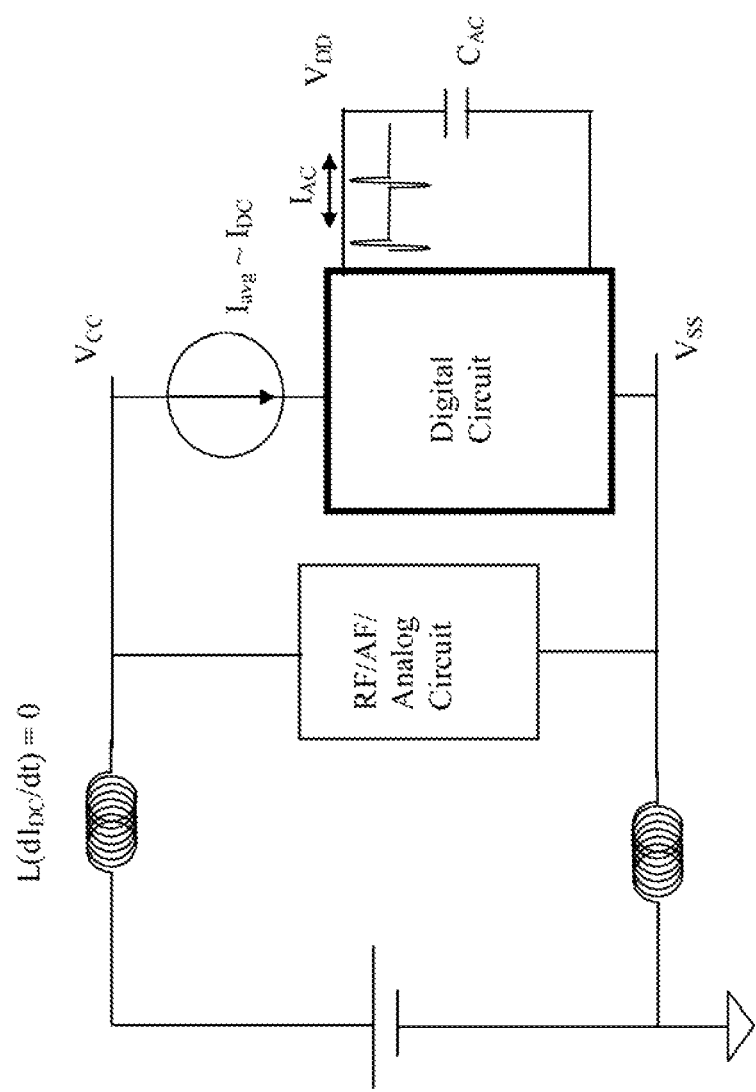

Since the VCC and VSS are quite, as shown in FIG. 7B, the RF/AF radio frequency, analog front and analog circuit can be connected to the quite power and ground VCC and VSS. The substrate is connected to the VSS that there is no substrate noise coupling problem. In other words, the RF/AF radio frequency, analog front and analog circuit can be integrated with the digital and FPGA to be single chip.

The green technology integration system means has noise isolation means. The noise isolation means has the current regulator means to regulate the current flowing a plural of connection of bonding wire. The bonding wire connection has the parasitic inductor. The current regulator regulates the current flowing through the parasitic inductor of bonding wire to reduce the switching noise generated by the parasitic inductor.

As shown in FIG. 8A is the on chip metal ground line Gnd connected to the substrate through the high density doping wells, etc. There are the parametric capacitors. As shown in FIG. 8B, it is the equivalent circuit of the substrate connection. The substrate has the resistance 3000 W per square; the metal has the resistance about 0.001 W per square. So, the ground metal shorts all the substrate circuit together to be a lump node. So, there is no need to do the whole chip 3D simulation to verify the noise isolation technique. The low resistance metal has shorten all the substrate circuit together and the substrate circuit effect has been marked off.

Comparing the conventional noise isolation techniques as shown in FIG. 8C, the digital noise injects into the substrate. This substrate noise injects further into the substrate under the analog circuit, the substrate noise contaminates the analog ground. So, the conventional separate power and ground doesn't solve the coupling substrate problem. As shown in the FIG. 8D, it is the hydraulic model of the electron sea in the substrate. The substrate noise in the digital substrate will disturb the substrate of analog circuit. In other words, it must have all the substrate connected together to be a calm sea as shown in FIG. 8E. The separation of power and ground cannot eliminate the substrate noise to meet the high S/N or ENOB requirements that the analog RF/AF ASIC chip has to separate from the large digital or FPGA circuit. To have the quite ground for the digital substrate in the FIG. 8E, as shown in FIG. 8F, the current regulator CR confines all the digital noise at the power node $V_{DD}$ and the ground is kept isolated from the noise with the digital circuit to be the electrical isolation layer.

Figures 9A, 9B:
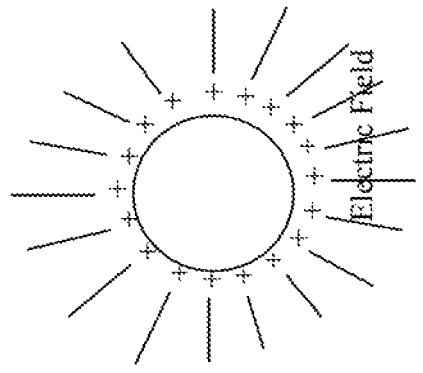
Figure 9C:
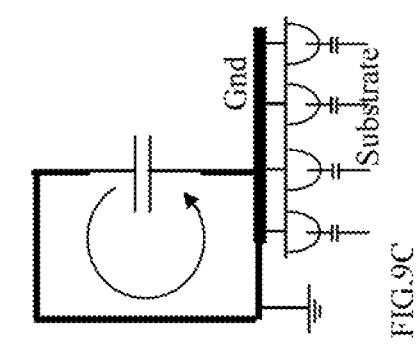
Figure 9D:
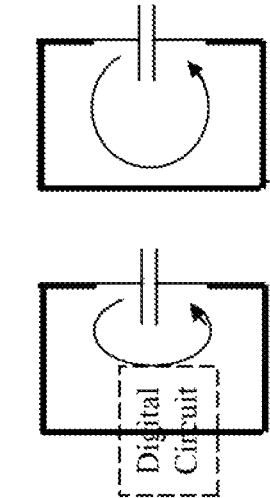
Figure 9E:
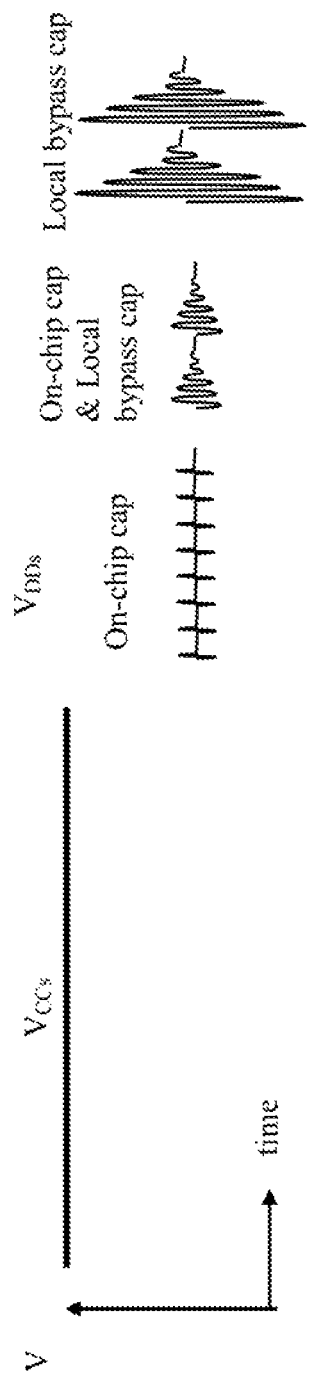

With the innovative CR in FIG. 8F, the power, ground and noise are shown in FIG. 9E. The ground voltage and the substrate voltage are clamped by the ground 0V with the $L_G$ inductor. There is no substrate noise. All the digital switching noise is confined at the $V_{DD}$ node. Depending on the size of digital/FPGA circuit, the $C_{AC}$ might be the versatile combinations of the on-chip capacitor and on-board capacitor. For very large digital/FPGA circuit, the crowbar current is too large that the on-board capacitor is needed. However, the on-chip capacitor can reduce the instantaneous rising of the inductor current a lot that the peak voltage oscillation is reduced a lot.

In the Noise Isolation Technology NIT, there is a question whether the oscillation of the current between the digital circuit and the capacitor will inject into the substrate to generate the noise. To answer this question, as shown in FIG. 9A, there is one capacitor with the positive terminal being connected to the negative terminal of this capacitor. There is no ground and/or substrate. The closed loop current will not inject to ground and/or substrate. As shown in FIG. 9B, the ground is added to the circuit however the loop current will be still the same. So, as shown in FIG. 9C, the loop current will not inject into the ground and/or substrate. In other words, just as the electric field inside the closed metal cavity as shown in FIG. 9D, the ground and substrate are shielded from the inject current FIG. 9C. FIG. 9D is the static electric field case; FIG. 9C is the dynamic current case. There is no switching noise outside the current loop and it is names as the Tangs' Law.

A green technology integration system comprises application specific integrated circuit ASIC and field programmable gate array FPGA. The green technology integration system integrates the ASIC and FPGA on a platform made of the noise isolation means to be the field programmable integrated chip FPIC. FIG. 9E is the application of the Tangs Law to the platform of the system integration. All the Radio Front, Analog Front RF/AF, analog/mixed signal and Digital/FPGA circuit are integrated on the same chip to share the same substrate. With the Tangs' Law, the power $V_{CCS}$ of the RF/AF, analog circuit is constant over time. The switching noise is confined on the multiple $V_{DDS}$ digital power buses. For the switching current spikes, the switching noise is small. With the on-chip capacitor, the oscillation voltage is much smaller than the on-board capacitor.

Figure 10A:
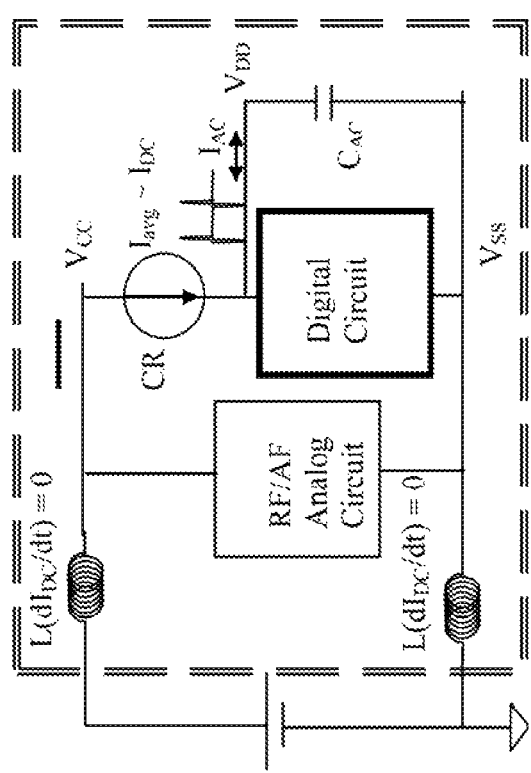
Figure 10B:
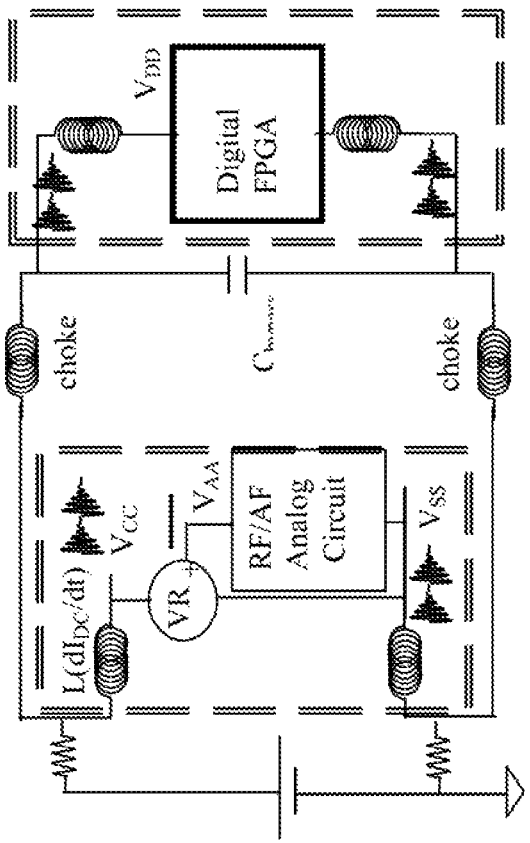

FIG. 10 is to illustrate the difference and make the comparison between the innovative current regulator and conventional voltage regulator. FIG. 10A is the current regulator to eliminate the internal on-chip substrate noise generated by the on-chip digital switching noise. FIG. 10B is the voltage regulator to eliminate the external on-board power noise injected into the analog circuit.

The digital switch has the periodic curve that we can take advantage to get rid of the digital switch noise. As shown in FIG. 10A, the digital circuit consumes the switching current $I_{switch}=I_{AC}+I_{DC}$. The $I_{DC}$ is the slow varying low frequency average current which can be treated to be constant in the timing window. The current regulator CR only provides the constant average current $I_{DC}$. In the short time window, $I_{DC}$ can be approximated to be constant, $I_{DC}$=constatnt. For $I_{DC}$=constatnt, $L(dI_{DC}/dt)=0$. The substrate has V(Vss)=V(0) to be the ground node voltage and have no digital switch noise. The capacitor $C_{AC}$ will smooth the voltage $V_{DD}$. The amplitude variance of $V_{DD}$ is the inverse proportional function of the capacitor $C_{AC}$. To make the variance of $V_{DD}$ smaller, we need the larger $C_{Ac}$. However, there is the limit of the on-chip capacitor. Then the off-chip capacitor can be used with the combination of the on-chip capacitor. The on-chip capacitor reduces the peak voltage and the off-chip capacitor reduces the large variance of the $V_{DD}$ amplitude.

As shown in FIG. 10A, for the current regulator, the current switching occurs at node $V_{DD}$. The protected node $V_{CC}$ voltage is a constant voltage. On the contrary, as shown in FIG. 10B, the node $V_{CC}$ has the on-board injecting noise. This on-board injecting noise is coming from the digital switching noise of the neighboring digital or FPGA chips. The digital or FPGA chip dumps the digital switching noise on the board. Even having the bypass capacitor and/or choke, there are still have the digital switching noise injecting into the RF/AF analog chip. Under the $V_{CC}$ injecting noise, the voltage regulator is trying to have the on-chip analog supply voltage $V_{AA}$ to be constant. Comparing FIG. 10A with FIG. 10B, the noise injecting node and the protected node are exactly reverse. It shows the essential difference between the current regulator CR and voltage regulator VR. The current regulator CR has the completely different functional features from the voltage regulator.

As shown in FIG. 1N, the comparison table summarizes the difference between the conventional approach and the Green Technology. In the conventional approach, the system is partitioned to be multi-chip of the RF/AF analog chip, mixed signal chip, digital and FPGA chip. The Green Technology uses the single chip system approach. It saves power and has higher performance. The conventional multichip system uses the on-board bypass capacitor. The on-board bypass capacitor will generate much more on-chip digital switching noise. The conventional system dumps the noise on the board. The Green Technology confines the noise on the local chip. The conventional uses the voltage regulator to isolate the analog circuit from the on-board power and ground noise. The Green Technology uses the current regulator to isolate the digital switch circuit to keep the switching noise from the contamination of the on-board power and ground. The conventional system uses the voltage regulator VR to generate the internal constant chip voltage $V_{AA}$ for the analog circuit. The Green Technology uses the current regulator to generate the constant current for the digital switching circuit.

Comparing the voltage regulator VR in FIG. 1O and the current regulator CR in FIG. 1P, the voltage regulator VR is to filter the voltage oscillation in Vcc to generate the constant voltage at $V_{AA}$ node; the current regulator CR is to filter the current spikes in the $V_{DD}$ to generate the constant current in node Vcc. The current regulator CR has the conjugate and opposite functions of the voltage regulator VR.

From the power source view, we compare and make the analysis for the characteristics of the current regulator. As shown in FIG. 11A, it is the characteristic curve and symbol of the voltage source of the voltage regulator VR. The output voltage is constant over all the current load. As shown in FIG. 11B, it is the characteristic curve and symbol of the current source. The output current is constant over all the voltage load. As shown in FIG. 11C, it is the characteristic curve and symbol of the current regulator. Both the output current and voltage are the specified constants. So, the current regulator is neither the voltage source nor the current source. The current regulator is the new kind of power source. Furthermore, for the dynamic loading, the output current load varies but the output voltage is constant. This is the adaptive smart current regulator. However, the current regulator is different from the voltage regulator. The voltage regulator has to be high speed and broad spectrum circuit to keep the out voltage to be constant. The current regulator can be low speed and narrow spectrum circuit to keep the output current to be constant.

As shown in FIG. 12A, it is the digital switching curve with the slow wandering. The slow wandering comes from oscillation having the large on-board capacitance, etc. The spectrum of the digital switching curve is shown in the FIG. 12B. The high frequency band is the digital switch. The low frequency is the wandering baseline coming from the large on-board capacitance, etc. FIG. 12C2, FIG. 12C3 and FIG. 12C4 are the waveform, symbol, spectrum of the input and output signals of the current regulator CR. FIG. 12D2, FIG. 12D3 and FIG. 12D4 are the waveform, symbol, spectrum of the input and output signals of the current regulator VR.

In FIG. 12C1 and FIG. 12C2, the power noise PNi input is at VDD and the output is the constant or very slow varying current ICC. The control signal Vctl makes the slow varying to keep the current ICC to be constant. As shown in FIG. 12C3, the power noise PNi input has both high frequency digital switching noise and the low frequency wandering baseline. As shown in FIG. 12C4, the control signal Vctl only has the low frequency control for the low frequency wandering baseline.

On the contrary, In FIG. 12D1 and FIG. 12D2, the power noise PNi input is at $V_{CC}$ and the output is the constant voltage $V_{AA}$. The control signal Vctl needs to be the fast varying to keep the voltage $V_{AA}$ to be constant. As shown in FIG. 12D3, the power noise PNi input has both high frequency digital switching noise and the low frequency wandering baseline. As shown in FIG. 12D4, the control signal Vctl only has both high frequency control for the high frequency digital switching and the low frequency control for the low frequency wandering baseline.

To generate the low frequency control signal for the current regulator, we need to extract the baseline wandering information from the input PNi digital switching power noise signal. As shown in FIG. 13, there are versatile different ways to extract the baseline wandering information from the input PNi digital switching power noise signal.

FIG. 13A is the basic block diagram of average circuit to extract the average value $I_{avg}$ from current I(t). FIG. 13B is the basic block diagram of average circuit to extract the average value $V_{avg}$ from current V(t). FIG. 13C is the block diagram which generates the average current from the voltage instead of the current directly. The fundamental principle of the current regulator is to minimize the variance of current flowing through the parasitic inductor of the bonding wire and pin, etc. The current flowing through the parasitic inductor is only the average of the current. The feedback control circuit provides the low frequency current to current loading and keeps the voltage to be the specified voltage level. The abrupt change and variance of switching current is absorbed by the storage capacitor. There are many different implementations of the above principles. As shown in FIG. 13D1 and the $F_P$ in FIG. 14F, the switching noise is filtered out first, then the low frequency signal is compared with the reference voltage to generate the control signal. This pre-filter is the preferred implementation. Of course, as shown in FIG. 13D2, there is possible to have the alternative post-filter implementation to feedback the voltage first then filter the switch noise. However, in the practical implementation, as shown in FIG. 13D3 and FIG. 18C, both the pre-filter of FP and post-filter made of the Cpc and the output impedance of amplifier AP are adopted. Furthermore, as shown in FIG. 18C, the cascade current regulators and the cascade filter FP3 are adopted. The green technology integration system has the current regulator further comprises the filter and feedback and comparing circuits. The filter filters out the high frequency variance of output current loading to get low frequency variance of output current loading. The feedback and comparing circuits feedback the information of variance of output current loading. The current devices are controlled based on the information of the low frequency variance of output loading current.

Figure 14F:
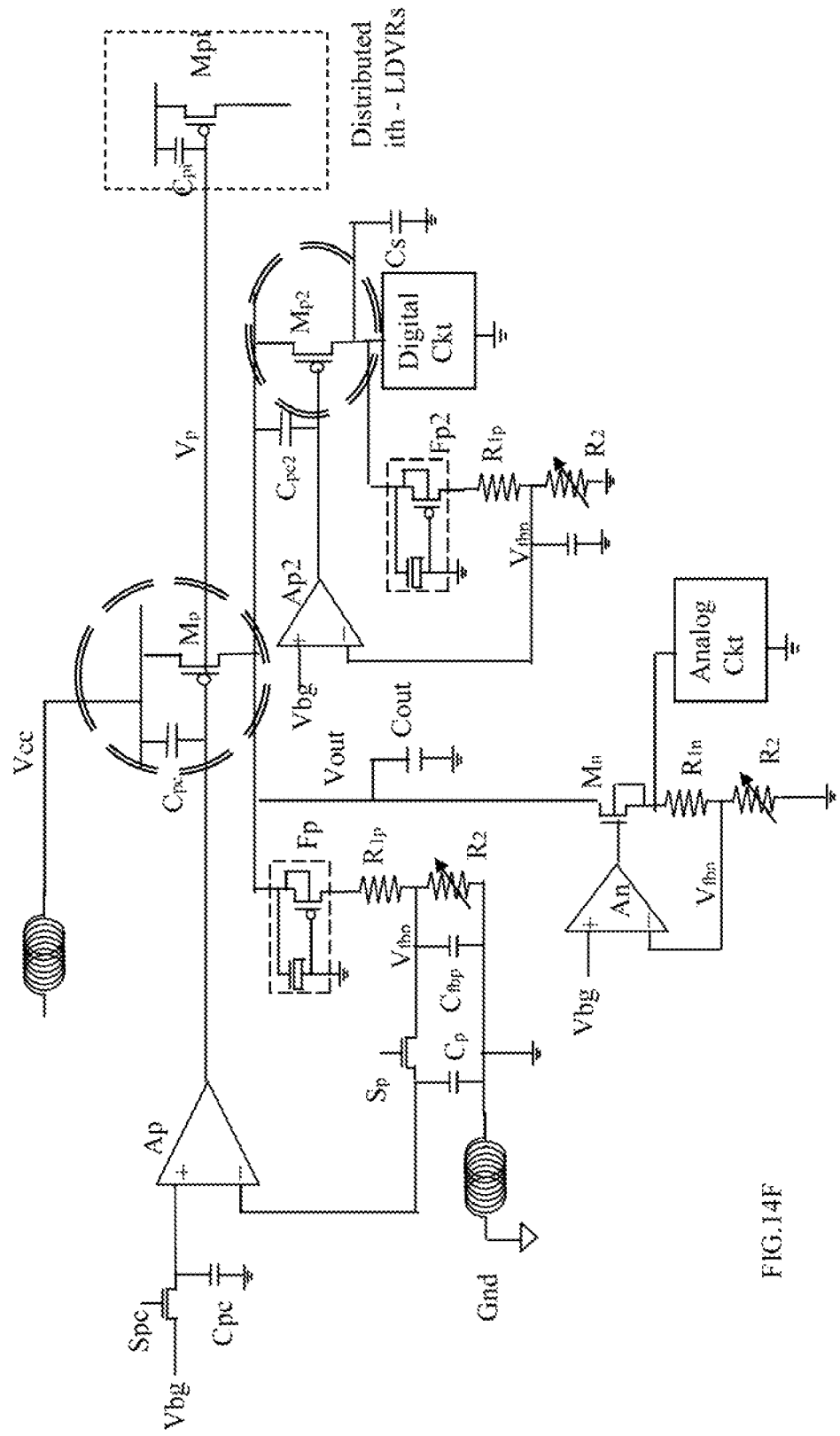

FIG. 14 illustrates the versatile techniques to generate the dynamic average current. FIG. 14A is to use the average circuit to generate Iavg(t) from I(t). FIG. 14B is the timing integration block to generate the Iavg(t) from I(t). FIG. 14C is the timing window to generate the Iavg(t) from I(t). FIG. 14D is to use the low pass filter to generate the Iavg(t) from I(t). FIG. 14E1 shows the waveform of the power buses and clock. At the clock edge, the simultaneous switches of the digital circuit generate the switch noises instantly. The switch noises then die away to be the average value. As shown in FIG. 14E2, the sampling circuit samples the average value at the average value period to get the average value Iavg(t). According to the principle illustrated in the FIG. 13C, FIG. 14F shows the current regulator design which integrates of the above techniques to have the practical application. The filter Fp is to serve as the filter as shown in FIG. 14D to generate the average voltage for the average current. The voltage divider RIp, R2 and Cfbp are the feedback circuit and filter. The sampler Sp is to sample the average value at the average period to have the much cleaner average value. The sampling gate Spc and capacitor is to compensate for the sampling noise generated by the switch gate Sp. The output capacitor Cpc and the output resistance of the amplifier Ap are constituted of another filter. So, there are four filters are in cascade to get the high quality average current. Finally, the average bias voltage for the average current applying on the P device Mp to generate the constant "current source" which has the "constant" current value Iavg(t) to be the "average" value of the current load I(t). It is noted that the circuit is dynamical that the Iavg(t) is also dynamic. The "constant" means over a short time period of time window. The time window shifts and the "constant" value also varies and shift slowly at very low frequency. For a short period time, the average value can be treated as a constant. For the constant current, L(dIavg/dt)=0, the voltage across the inductor is zero, i.e., the switching noise generated by the inductor is zero.

Figure 14G:
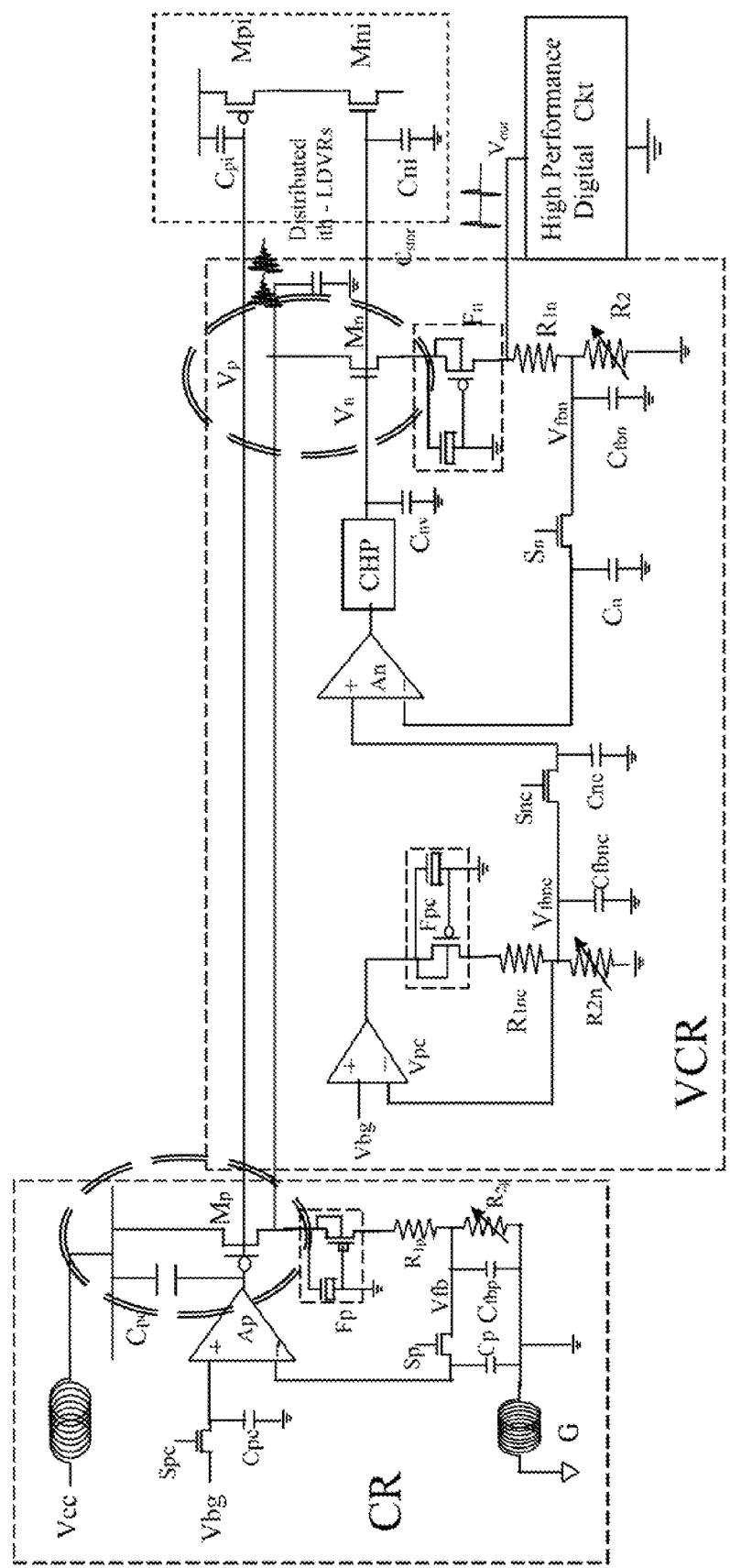

As shown in FIG. 14F and FIG. 18C, the green technology integration system has the current regulator comprising P type current devices and N type current devices. The P type current device $M_P$ and N type current device $M_N$ are connected in cascade with drains. The capacitor $C_{OUT}$ is connected to the drains of devices. As shown in FIG. 14G, the Hybrid current regulator HCR is made of the P type current regulator PCR and N type current regulator NCR. FIG. 14G is the cascade of the voltage regulators of the current regulator and it is the hybrid voltage regulator of P-type current regulator PCR and N-type current regulator NCR. The current regulator CR has the constant current flowing through the P-type current regulator and the N-type current regulator is to minimize the switching noise as seen by the high performance circuit to have the fast circuit speed and less noise. The noise is isolated in the capacitor between the P-type current regulator and the N-type current regulator that both the inductor and circuit does not see the violent switching noise. The hybrid current regulator is much better than the two P-type cascaded current regulator as shown in FIG. 18. The two P-type cascaded current regulator has the NIF to be 1800; however, the hybrid current regulator has the NIF much larger than 1800.

Figures 15A, 15B:
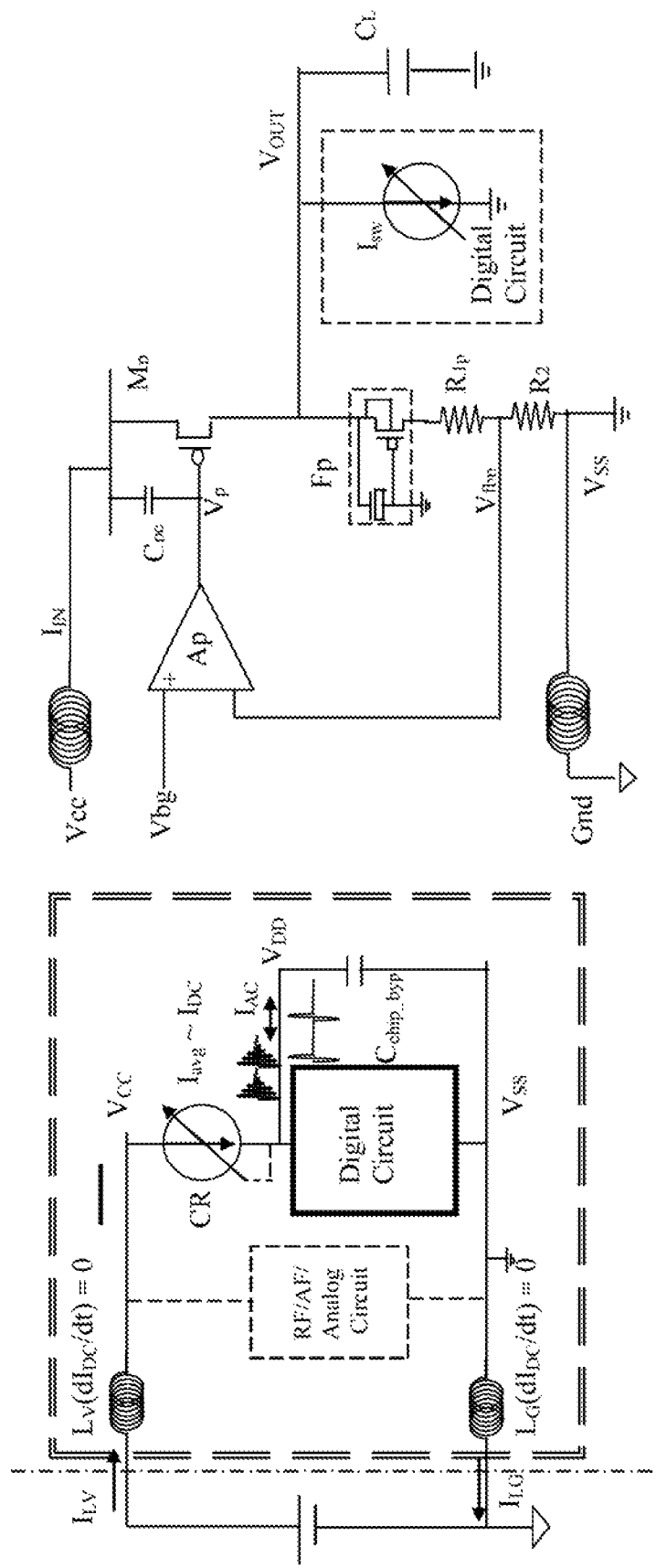

FIG. 15A is the basic system and architecture of the Noise Isolation Technology. FIG. 15B is the circuit implementation of the Noise Isolation Technology. FIG. 15A illustrates the fundamental principles of the Noise Isolation Technology. In FIG. 15A, the current regulator CR is the constant value DC current $I_{DC}$ of the current average $I_{avg}$. First, assumes the RF/AF/Analog circuit does not exist that only the current flows through the current regulator CR. Applying the Kirchoff's current law at the cross-section as shown in FIG. 15A, the current $I_{LC}$ flows through the inductor of the power supply is equal to the current $I_{LG}$ flows through the inductor of the ground, $I_{LV}=I_{DC}=I_{LG}=$constant. So the voltage across inductors LV(dIDC/dt)=0 and LG(dIDC/dt)=0. In other words, there is no switching noise generated by the inductor $L_V$ and $L_G$. The on-chip ground or substrate voltage Vss is the same voltage as the on-board ground.

The same argument can be applied to the circuit having the RF/AF/Analog circuit. As shown in FIG. 15A, the current flows through the RF/AF/Analog circuit is constant. Both the current regulator and the RF/AF/Analog circuit are constants that the current flows through inductor LV and LG are constant. The on-chip ground or substrate voltage Vss is the same voltage as the on-board ground.

FIG. 15B is the circuit for the current regulator. The current regulator is very similar to the voltage regulator. However, the function of the circuit is much different from the voltage regulator. The voltage regulator is to keep the "output voltage" to be constant. However, the current regulator is to keep the "input current" to be constant. The difference between the current regulator and voltage regulator is the current regulator having the addition of the low pass filters such as Fp and Cpc to the voltage regulator. The voltage regulator has to be fast response for the high frequency switch noise. The current regulator is only to trace and follow the low frequency average current.

To increase the switching noise rejection capability, the current regulator can be cascaded to get the high ratio of the switch noise rejection. The Noise Isolation Factor of the switch noise rejection is defined as NIF=Switching Noise in Isolated Power Bus/Switching Noise in Substrate As shown in FIG. 16A, for the cascade current regulator, the total SNRR $$NIF=NIF_1 \times NIF_2$$

where the $NIF_1$ is the NIF of the first stage current regulator and the $NIF_2$ is the NIF of the second stage current regulator. Usually one stage current regulator has the SNRR to be 50. For the two stage current regulator, the SNRR is bout 2500. It is equivalent to 13 Bits improvement for ADC. FIG. 16B is the circuit for the 2-stage cascade current regulator.

As shown in FIG. 17A, for the cascade current regulator architecture, there is another possibility for the RF/AF/Analog Circuit. The RF/AF/Analog Circuit can be located between the two current regulators. FIG. 17B is the circuit implementation of the FIG. 17A.

Referring to FIG. 18C, the green technology integration system has the noise isolation means is constituted of a plural of cascading controlled current devices MP1, MP2 to regulate the current flowing through the parasitic inductor to reduce noise generated by the parasitic inductor. Furthermore, with the basic patterns, we can have the versatile combinations of the different patterns for the noise isolation technology. The noise isolation means further comprising a plural of filters FP1, FP2 to filter the high-frequency noise to control a plural of cascading controlled current devices. FIG. 18 is the basic pattern of the cascade of the current generators. FIG. 18A is the block diagram for the cascade current generators. FIG. 18B is the system and architecture of the cascade current generators. FIG. 18C is the circuit of the cascade current generators. As shown in FIG. 1Q, it is the SPICE simulation to show the switching noise of digital circuit as shown in FIG. 6A. As shown in FIG. 1Q, it is the SPICE simulation with the Noise Isolation Technology Circuit in FIG. 18C to show the switching noise of digital circuit as shown in FIG. 6C. The Noise Isolation Factor NIF is 1800. Referring to FIG. 18C, the noise isolation means comprises a plural of cascading controlled current devices MP1, MP2 and filters FP3 to regulate current flowing through the parasitic inductor means to reduce noise generated by the parasitic inductor means.

FIG. 19 is the cascade of the current regulator and the voltage regulator. FIG. 19A is the block diagram of the current regulator and the voltage regulator. FIG. 19B is the system and architecture of the cascade current generator and voltage regulator. FIG. 19C is the circuit of the cascade current generator and voltage regulator.

FIG. 20 is the cascade of the current regulator and the Switch Mode power supply. FIG. 20A is the block diagram of the current regulator and the Switch Mode power supply. FIG. 20B is the system and architecture example of the cascade current generator and Switch Mode power supply. FIG. 20C is the circuit example of the cascade current generator and Switch Mode power supply of buck converter. It is noted that FIG. 20B and FIG. 20C are shown only one example of the Switch Mode power supply. The switch mode power supply can be boost converter, buck converter, etc.

FIG. 21 is to make the comparisons among the three different power management unit, Switch Mode SM, Voltage Regulator VR and Current Regulator CR. In FIG. 21A, the Switch Mode power supply changes the power from one voltage level to another voltage level. The output voltage has the ripple voltage. The output voltage is fed into the voltage regulator VR or directly to be the low voltage digital circuit, etc. In FIG. 21B, the voltage regulator VR is to filter the input power noise to have the output voltage to be the clean constant voltage for the analog circuit. FIG. 21C1 is the block diagram of the current regulator which is analogy to the voltage regulator VR. However, the signal flow is in the backward direction. So, the forward direction signal flow diagram is as shown in FIG. 21C2. FIG. 22A is the current regulator for the constant average current output loading $I_L$. FIG. 22B is the frequency spectrum for the constant output inductor current $I_L$ of the current regulator. FIG. 23A is the current regulator for the slow varying average current output loading $I_L$. FIG. 23B is the frequency spectrum for the slow varying output inductor current $I_L$ of the current regulator.

With the manipulation of the block diagrams, we can make novel innovations of the Noise Isolation Technology in the system and architecture level. FIG. 1J is the basic system and architecture of the noise isolation technology. The current regulator is at the upper power layer and the voltage regulator and the switch mode power supply are at the low layer. FIG. 1K is the conjugate architecture of FIG. 1J. The current regulator is at the lower ground layer and the voltage regulator and the switch mode power supply are at the upper layer. The system and architecture is shown as FIG. 25A and the circuit implementation is shown as FIG. 25B.

To have the higher Noise Isolation Factor NIF, as shown in FIG. 24A, the current regulators are in both upper layer and ground layer. The Noise Isolation Factor is $$NIF=NIF_P \times NIF_G$$

where the $NIF_P$ is the NIF of the current regulator at upper power layer and the $NIF_G$ is the NIF of the current regulator at upper power layer.

Similarly, we can have the different ways to cascade the current regulator. As shown in FIG. 24B, all the current regulators are in the upper power layer. It can be interpreted that the current regulator CR is the hierarchical current regulator having the current regulator $CR_1$ to be cascaded with the current regulator $CR_2$. The cascade current regulators are as shown in FIG. 18. FIG. 18A is the system and block diagram of the cascade current regulator. FIG. 18B is the architecture of the cascade current regulator. FIG. 18C is the circuit of the cascade current regulator.

Applying the hierarchical principles to the versatile combination of the current regulator, voltage regulator and switch mode power supply, there are many different novel power and ground plan. With the versatile novel combination, as shown in FIG. 1L, it is the equivalent circuit for the ideal power supply. The board provide the constant/average current source to the chip and the chip generate the constant/voltage source to the circuit. As shown in FIG. 1M, it is the architecture of the ideal power supply which is corresponding to the ideal circuit as shown in FIG. 1L. It is equivalent to the system and block diagram as shown in FIG. 24A.

Figure 25B:
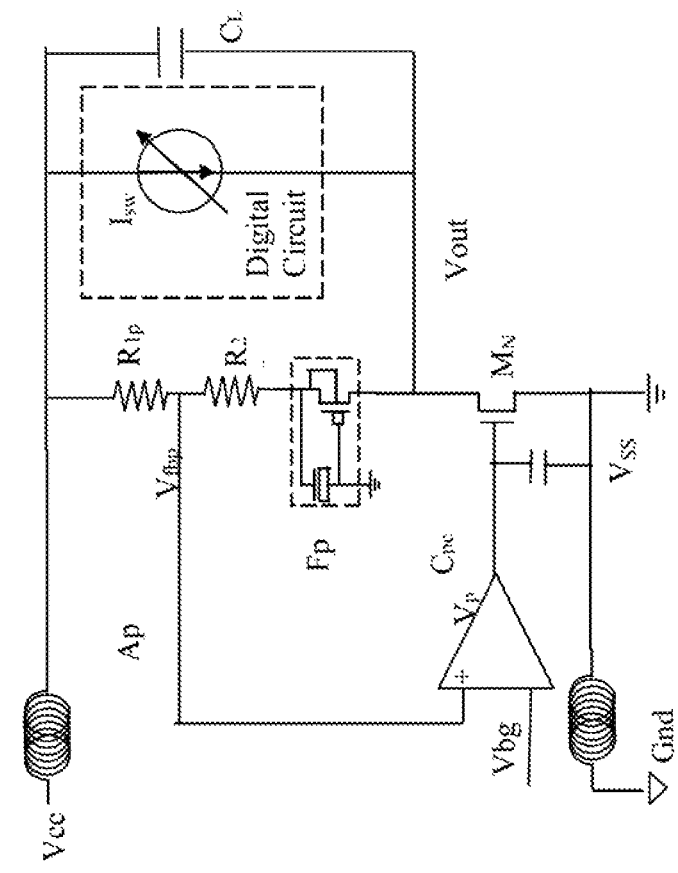
Figure 25A:
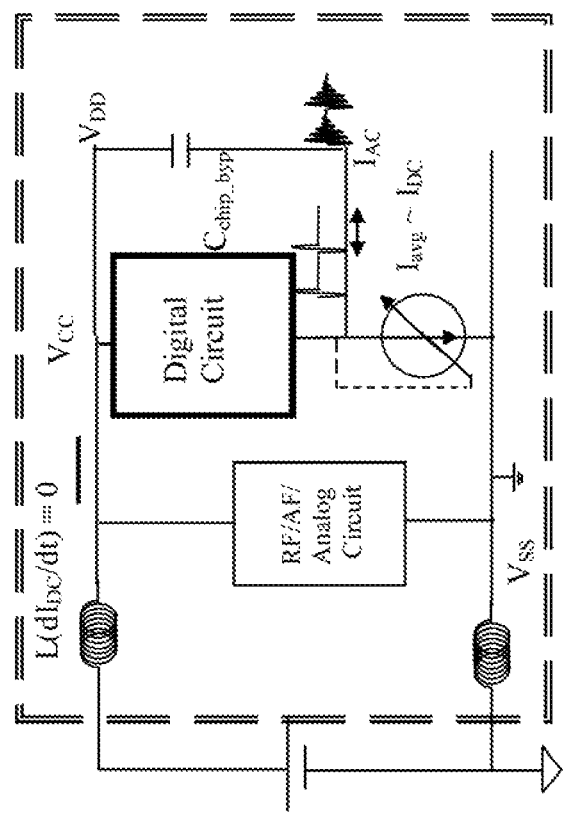

FIG. 25A is the conjugate Noise Isolation Technology as shown in FIG. 15A. The P device is changed to be the N device $M_N$ and the power bus Vcc is changed to be the Ground Bus Vss. FIG. 26A is the alternative design of the FIG. 24A to have the cascade current regulator effect to increase the Noise Isolation Factor NIF. Even FIG. 25A has slightly better NIF, since the cascade effect is the same and the FIG. 26A can have the multiple distributed power structure as shown in FIG. 27A, the FIG. 26 is the Preferred implementation.

FIG. 27 shows how the Noise Isolation Technology is applied to the conventional chip to serve as IP with the wrapper structure. FIG. 27A is the general Noise Isolation Technology architecture. FIG. 27B is the general mixed-signal type chip which integrate all the RF/AF/Analog with Digital/FPGA. FIG. 27C is the wrapper structure of the IP of the current regulator to wrap around the conventional mixed-signal type chip.

FIG. 28 shows the details of the general mixed-signal type chip. It illustrates the state of art of semiconductor industry. A|D represents analog to digital conversion A/D and/or digital to analog conversion D/A. S|P represents serial to parallel conversion S/P and/or parallel to serial conversion P/S. The FPGA has merged the logic, Digital Signal Processor DSP, the Serial/Parallel and Parallel/Serial two way Conversions S|P together. The Radio Front RF, Analog Front AF, the Analog to Digital Conversion (ADC) and Digital to Analog Conversion (DAC) A|D are excluded due to the substrate noise. As shown in FIG. 28B, it is the A|D overlapping waveform of the analog input and digital output. As shown in FIG. 28C, it is the logic signal of the S|P in the analog wave form. The A|D signal steps is much smaller than the S|P logic signal. The small A|D signal steps make the A|D is much more susceptible to the substrate noise. The FPGA has a lot digital circuit and injects a lot of switching noise into the substrate. Even worse, the higher frequency is, the higher slew rate is, the larger switching noise is, the lower the circuit performance is. The substrate switching noise forbids the signal path integration of the high speed and high performance A|D. So, today the FPGA only can integrate the logic path integration of S|P and low speed and low performance ADC. Even worse, the embedded controller needs to shut down all the digital circuit during the ADC operation.

For the signal path, after A|D, it is the DSP. For the logic path, after S|P, it is the combinatory logic. As shown in FIG. 28A, today FPGA only can integrate DSP, S|P and Logic circuit. As shown in FIG. 29A, with our novel Noise Isolation Technology, the A|D of ADC and DAC can be integrated into FPGA. FIG. 29B shows the Noise Isolation Technology is the platform to integrate the A|D, S|P, FPGA, DSP and Logic all together.

A green technology integration system comprises the field programmable gate array FPGA, the ADC and DAC conversion between analog and digital. The green technology integration system integrates the FPGA, the ADC and DAC conversion between analog and digital on the platform made of noise isolation technology to be field programmable integrated chip FPIC.

Furthermore, as shown in FIG. 30A, with our noise isolation technology, the RF and AF are all integrated into one single chip, FPIC. FIG. 30B shows the Noise Isolation Technology is the platform for the integration of the FPIC. Both the ADC and the LC resonator of the Xtaless Clock are very sensitive to the substrate noise.

The green technology integration system comprises the digital signal processing DSP and the application specific integrated circuit ASIC. The ASIC can be the combinatory integration of the radio front RF, analog front AF, analog, mixed signal, etc. The green technology integration system integrates the ASIC with DSP on the platform made of the noise isolation technology to be field programmable integrated chip FPIC. This DSP can be the portion of FPGA that the ASIC is integrated with FPGA. The green technology integration system also comprises microprocessor and the application specific integrated circuit ASIC. The green technology integration system integrates the ASIC and microprocessor on the platform made of the noise isolation technology to be the field programmable integrated chip FPIC. This microprocessor can be the portion of FPGA that the ASIC is integrated with FPGA, too.

As shown in FIG. 27C, FIG. 30A and FIG. 30B, the green technology integration system has the noise isolation to be the platform serving as wrapper to integrate the versatile combinations of application specific integrated circuit ASIC means, field programmable gate array FPGA means, conversion means between analog and digital, digital signal processing DSP, microprocessor means, RF/AF/Analog circuit and digital circuit to be field programmable integrated chip FPIC.

As shown in FIG. 31, it is the combination of the FIG. 14G and FIG. 25B. As shown in FIG. 14G and FIG. 31, the Xtaless oscillator adopts the embedded Hybrid Current Regulator Noise Isolation technology. The P-device and N-device marked with the dotted circle are corresponding to the P-type current regulator PCR and the N-type current regulator NCR. As shown in FIG. 15A, the LC resonator of the Xtaless Clock is located in the R/AF/Analog Circuit region that adopts the embedded Hybrid current generator Noise Isolation Technology as shown in FIG. 31. Furthermore, as shown in FIG. 24A, the LC resonator of the Xtaless Clock uses the cascade Hybrid current generator at both the power and ground layer to have the highest quality noise isolation. As the reference voltages are generated with bandgap voltage generator and the current generator is generated with bandgap generator, the Xtaless Clock is referred to be bandgap oscillator. The P-device of the hybrid current regulator is controlled by the amplitude control or maximum voltage control; the N-device of the hybrid current regulator is controlled by the common mode control or the minimum voltage control.

The high-speed and high-performance ADC converter adopts the pipeline architecture. The MDAC has the analog circuit which consumes a lot of power and determines the speed of the conversion. The key issue is to increase the conversion speed at the high resolution and reduce the power consumption. These are two conflict goals. The solution is the dynamic switching type analog circuit.

Figure 32A:
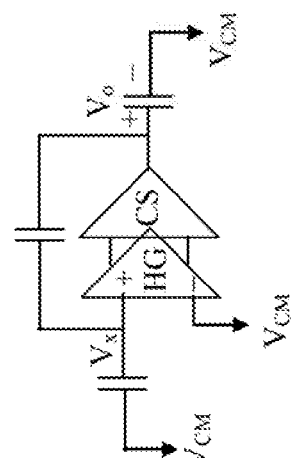
Figure 32B:
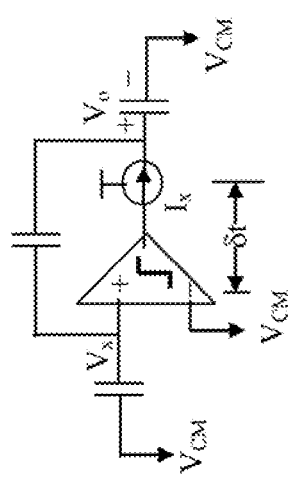

As shown in FIG. 32A, it is the conventional OPAMP in the Multiplying DAC, MDAC. There are A type OPAMP and AB type OPAMP. At the steady state, they both consumes DC current. The biasing current serves as both the switching current and biasing current. They treats the OPAMP as a whole circuit. As shown in FIG. 32B, at beginning, the Vx is the slew rate to approach $V_{CM}$. Finally, it is the RC delay of $C/g_m$ for Vx to approach $V_{CM}$ where $g_m$ is the gain of the small signal. As shown in FIG. 32B, it is the comparator in the MDAC. There is a constant current source which is corresponding to the slew rate of the OPAMP in the conventional MDAC. It is just to eliminate the RC delay of $C/g_m$ with the constant current source which is the duplicate of the biasing current. However, it is at the cost of losing the accuracy. There are the comparator switching delay which causes the inaccuracy of the Vx. Even with the delay compensation techniques for the deviation $\epsilon$, this inaccuracy is still uncertain. It is impossible to have the accuracy, $Vx=V_{CM}$.

Figure 32C:
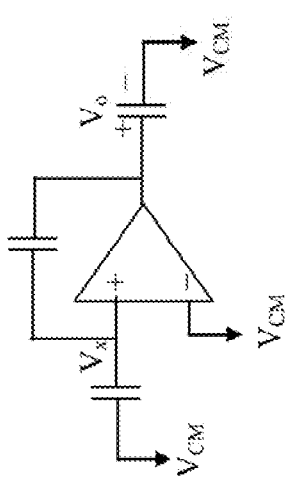
Figure 32D:
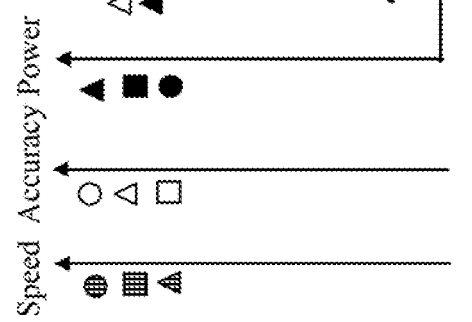
Figure 32E:
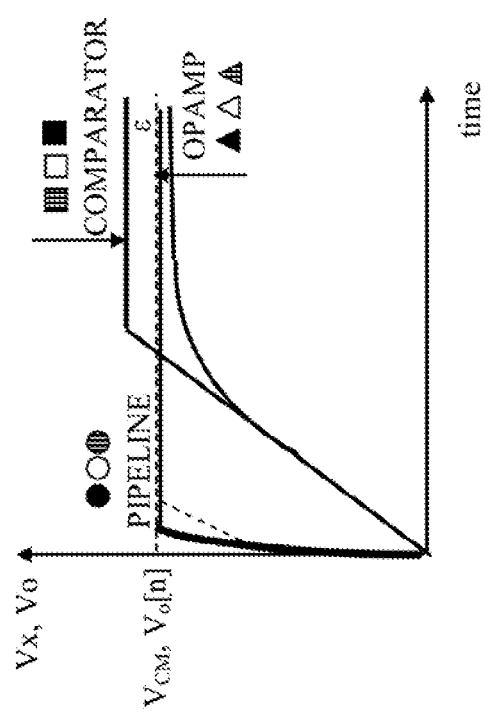
Figure 32F:
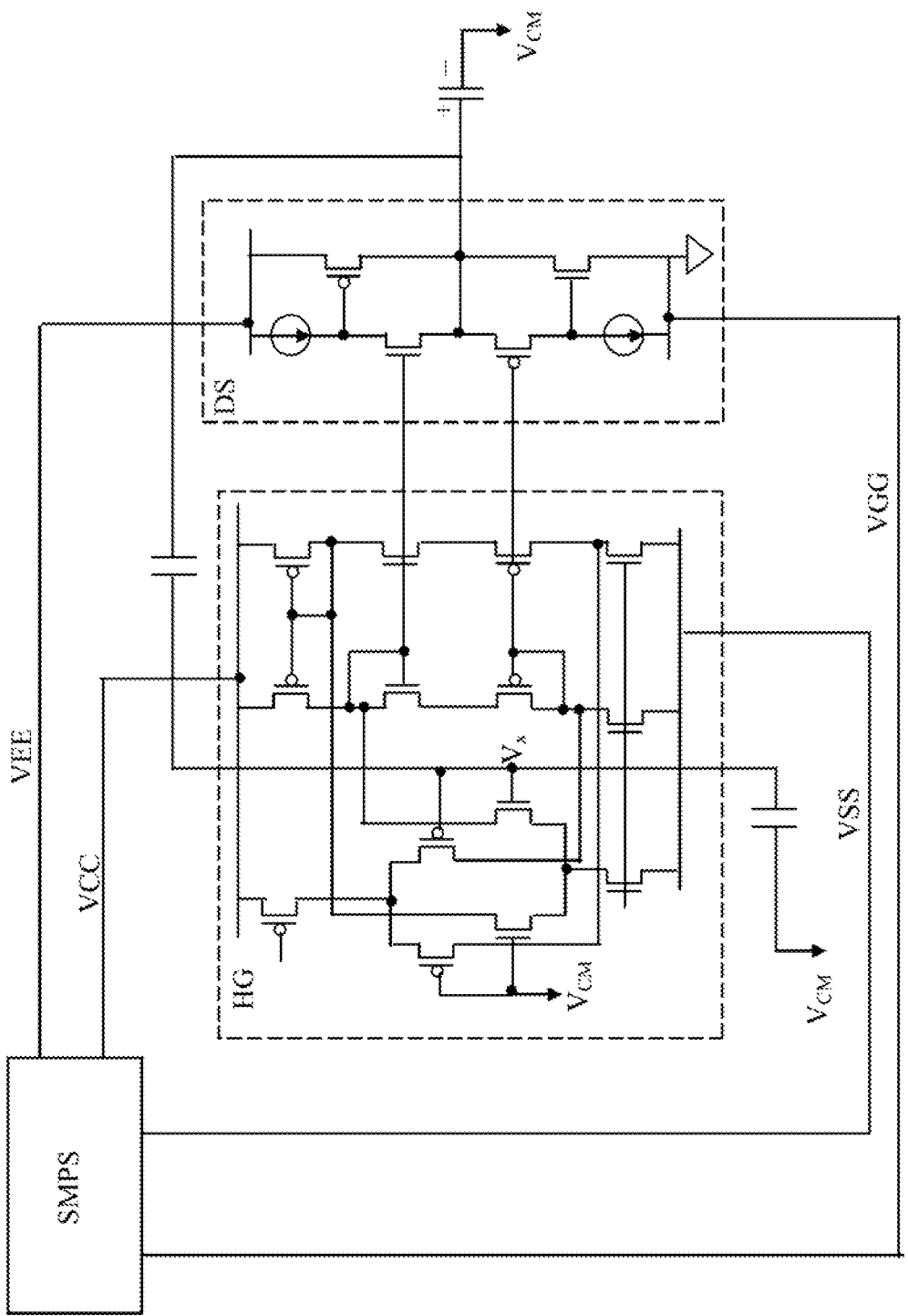

The FPGA having the Low power pipeline ADC with pipeline buffer will enable the merge the industrial ASIC with FPGA to be the green technology FPIC. As shown in FIG. 32C and FIG. 32F, the pipeline OPAMP adopts the dynamic switch technique in both High Gain HG OPAMP stage and Clamping Switch CS output stage. Referring to FIG. 32F, the green technology integration system comprises the pipeline buffer ADC. The pipeline buffer ADC is constituted of the high gain operational amplifier stage and dynamic switching output stage. The Dynamic Clamping Switch DS OUTPUT has the digital switching effect to drain a large amount current. So, the slew rate of the pipeline OPAMP is dynamic and is not limited by the biasing current. As shown in FIG. 32D, the dynamic switch of the pipeline OPAMP has the much higher slew rate due to the dynamic switch of the DS output stage. At the small signal stage, due to the clamping mechanism having much higher gain, the settling time is much faster and having the highest accuracy. FIG. 32E is the MDAC comparison result of the pipeline OPAMP, the comparator and the conventional OPAMP. The MDAC made of the pipeline OPAMP has the highest speed, highest accuracy and the least power.

As shown in FIG. 1A, there is the need for the wireless connection for the green technology system made of the Insulation Glass Unit IGU of the Green Window. The most power consumption for the high Peak-Average-Ratio PAR wireless signal in FIG. 33A is the power amplifier. We need to use the dynamic power supply to reduce the power consumption of the power amplifier. Referring to FIG. 33B, the green technology integration system comprises the RF Power Amplifier dynamic power supply. The RF Power Amplifier dynamic power supply has the Low Drop Voltage Regulator LDVR type analog buffer power supply to be AC coupled with the high PAE ratio signal to supply power dynamically.

FIG. 34A is the cross section of the Electro-Chromic Window (EC Window). The EC window is made of five layers, Transparent Conductor (TC), Electro/chromic Electrode (EC), ion Conductor (IC), Counter Electrode (CE) and Transparent Conductor (TC). As shown in FIG. 34A, similar to the MOS and Bipolar devices, there are the hot-ion $I_{ion}$ and break-down/reliability voltage problems for the EC window. The current-limited voltage ramping is the adaptive increment of voltage difference according to constant current/field. As shown in FIG. 34B, the const current/field is the difference of the applying voltage and the built in potential of Cstore. There are two kinds of window controller. The first green technology integration system comprises the Current-Limited Voltage Ramping circuit to switch an Electrochromic Window being made of said layer means. The second green technology integration system comprises Voltage-Limited Current Charging circuit to switch an Electrochromic Window means being made of said layer means. The voltage limit and current limit are the function of temperature. The ion resistance $R_{ion}$ is function of the temperature. As shown in FIG. 34C, we can get the temperature of the EC window from the value of $R_{ion}(T)$ with the relations as follows.

$$Vw = I(t)R(T) + \Sigma I(t)/C$$

$$Vw1 = I1(t)R(T) + \Sigma I(t)/C$$

$$Vw2 = I2(t)R(T) + \Sigma I(t)/C$$

$$Vw2-Vw1=[I2(t)-I1(t)]R(T)$$

$$R(T)=(Vw2-Vw1)/[I2(t)-I1(t)]$$

$$I=Niv=NiE=Ni(Vw-\Sigma I(t)/C)/d_{ion}$$

$$I(t)=(Vw-\Sigma I(t)/C)/R(T)$$

$$R(T)=d_{ion}/Ni$$

The EC window has the bi-stability as shown in FIG. 34D that the EC window can operate as shown in FIG. 34E to reduce the leakage current to save the power with the optical hysteresis.

FIG. 35A shows the switching operation of the EC window. The voltage difference across the EC window W+−W−. The voltage of the bleach might be different from the voltage of the color. There is polarity. To protect the EC window, there are the voltage limit and the current limit. To avoid the current limit, in the switching from bleaching to the coloring and vice versa, there is the voltage ramping of the switch. To implement the current limited voltage ramping switch, as shown in FIG. 35B, with the H-Bridge switching as shown in FIG. 35D1 and FIG. 35D2, we can convert the polar switching to be the uni-polar switch as shown in FIG. 35B. It is noted that the window switching time is different from the polarity switching time. As shown in FIG. 35A, the EC window switching time is the start of bleaching or coloring. The voltage starts to ramp up or down. The polarity switch is the time the ramping voltage across the zero voltage, W+=W−.

The EC window has two limits, current limit and voltage limit. Due to the hot-ion effect, the speed limit of the ion is limited to a maximum ion speed. The hot-ion speed limit can be observed with the current-limit. The EC window can be thought as the battery. The voltage limit is the electrical field causing the reliability of the EC-window battery. As shown in FIG. 36, during the operations of the EC window, the voltage source or the current source are varying to keep both the voltage-limit and current limit. According to the switching operation in FIG. 35, the fundamental EC-window switching operation are classified to be six phases. Phase 1 is the start or continue switching of coloring phase. Phase 2 is the hold of the color. Phase 3 is the start of bleach. Phase 4 is the start or continue switching of bleaching phase. Phase 5 is the hold of the bleach. Phase 6 is the start of coloring All the operations of the EC-window H-bridge switch are followed this fundamental switching principles. To protect the EC window, the power is current-limited and voltage-limited source.

Furthermore, the H-Bridge Switch structure can be applied to have the different components. As shown in FIG. 37A1, it is the EC window driven by the analog buffer. It is the fundamental voltage ramping mode. From the electric model of the EC window, the EC window can be treated as the capacitor with the dissipative current source. Applying the H-Bridge structure to the capacitor of the EC window, the circuit of the H-Bridge with the analog buffer is shown as FIG. 37A2. The resistor is served as the current sensing. With the feedback of the current sensing, the circuit in FIG. 37A2, can be served as the current-limited voltage ramping.

The H-Bridge structure applying to the Switch Mode Power Supply has much more versatile novel structures. As shown in FIG. 37B1, it is the basic Buck converter. Applying the H-Bridge to the EC window, the current-limit window controller is as shown in FIG. 37B2. As shown in the FIG. 37C1, the H-Bridge structure is applied to the inductor, current-sensing resistor, capacitor and the EC window. The corresponding current-limited window controller is shown as FIG. 37C2. Applying the H-Bridge operator to the whole buck converter as show in FIG. 37D1, the corresponding window controller is as shown in FIG. 37D2. The MOS devices in the H-Bridge serve as not only the switches but also the switching gate of the buck converter, too.

There are different EC window controller algorithms of (1) voltage-ramping, (2) current-limited, (3) current-limited voltage-ramping and (4) voltage-ramping current-limited, etc. We can apply the different H-Bridge window controller architectures in FIG. 37 to the different EC window controller algorithms. FIG. 1F and FIG. 1G shows the design platform having the different practical implementations of the EC window controller. The buck converter is to convert the high voltage power supply to the low voltage power having the large current. There are many different ways to implement the EC controller. As shown in FIG. 1F, the control input signals can be either current charging signal or the voltage ramping signal. However, for the networking consideration, there is the need for the embedded controller. The embedded has the Pulse Width Modulation PWM signals. In the practical design, the EC window controller is designed around the embedded controller.

Figure 36A:
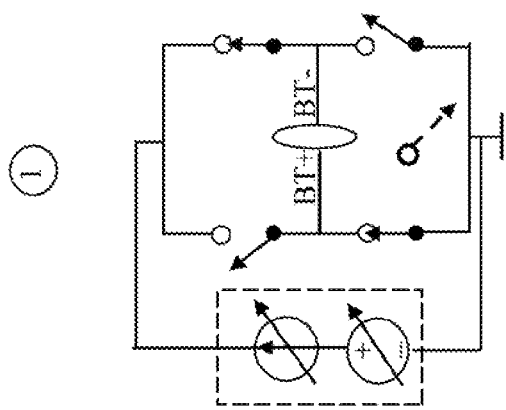
Figure 36B:
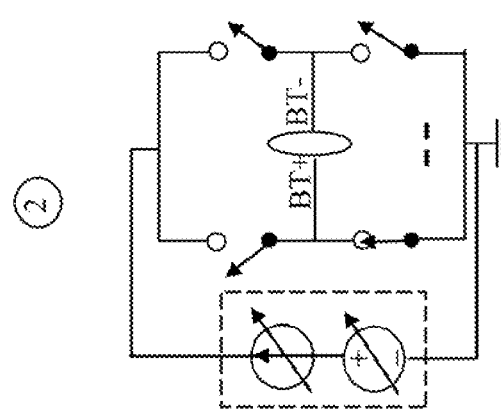
Figure 36C:
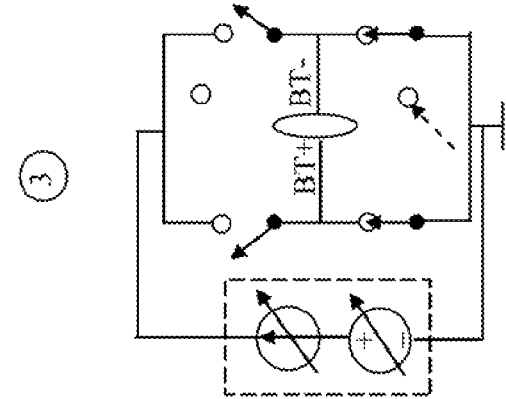
Figure 36D:
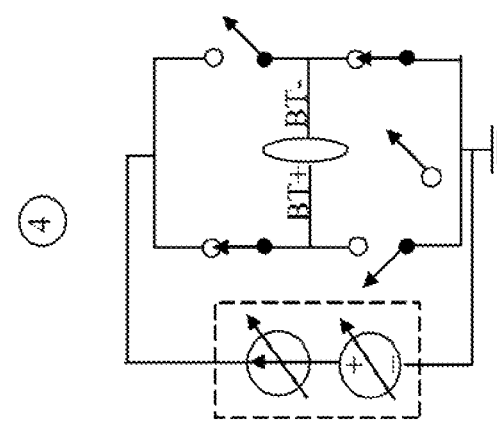
Figure 36E:
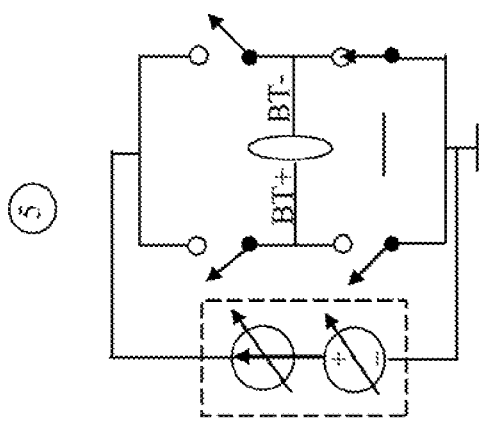
Figure 36F:
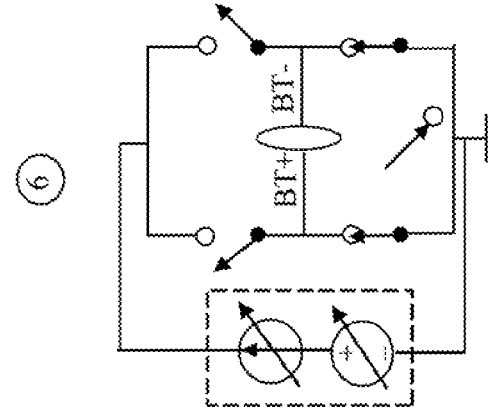

As shown in FIG. 35B, there are the charging process and the discharging process. As the voltage increases from 0 to the voltage limit is the charging process. As the voltage decreases from the voltage limit to 0 is the discharging process. The voltage limit for the tint/coloring is different from the voltage limit of the transparent/bleach. The discharging process for the LDVR type single side pull up analog buffer can be done by the short of the EC window as shown in FIG. 36C and FIG. 36F. For the two-sided pull-up and pull-down analog buffer, the discharging process can be done by the pull-down of the analog buffer as shown in FIG. 36A and FIG. 36D by the short of the EC window as shown in FIG. 36C and FIG. 36F. For the SMPS buck converter, there is no discharging mechanism. However, as the polarity changes, the voltage becomes the negative. It still can use the SMPS to charge up in the discharging process as long as the voltage limit and the current limit is in the safe range. As shown in FIG. 35A and FIG. 35B, for the polarity switch, it can be applied to both voltage ramping and current charging method. For the color/bleach switch, it is applied to the current charging method only.

There are two major algorithms to switch the EC window controller, the current-limited voltage-ramping and the voltage-limited current-charging. As shown in FIG. 38C1 is the charging process of the current-limited voltage-ramping; As shown in FIG. 38C2 is the discharging process of the current-limited voltage-ramping. As shown in FIG. 38D1 is the charging process of the voltage-limited current-charging; As shown in FIG. 38D2 is the discharging process of the voltage-limited current-charging. The current-limited voltage-ramping methodology is the conjugate of the voltage-limited current-charging. They are the general fundamental algorithms. They can be easily modified to fit for the different systems and architectures of the EC window controller.

As shown in FIG. 38C1, the voltage ramping up and the ramping rate is bounded by the constant current of current limit. The current is fed back to modify the voltage ramping up rate. The ramping voltage rate is reduced or increased for the ramping voltage. As shown in FIG. 1G and FIG. 38C1, for the embedded controller having the PWM signal to generate the voltage ramping signal, it can use the PWM signal to generate the voltage ramping signal. As shown in FIG. 1G and FIG. 38D1, for the current Switch EC window controller, the current feedback is to adjust the PWM duty-cycle.

For the voltage ramping algorithm, as shown in FIG. 35C, the voltage ramping |W+−W−| signal is sent to the PWM generator. The RC filter filters out the digital switch and get the |W+−W−| analog signal. The |W+−W−| analog signal is sent to the analog buffer to generate the voltage ramping voltage source to drive the EC window. As the voltage ramping voltage become zero, the polarity switch signals are generated to switch the H-Bridge. This is the feed forward system.

If the embedded controller uses the current-sensing resistor feedback current signal information to adjust the voltage ramping rate, it is the current-limited voltage ramping. Then it becomes the feed forward system with the addition of the feedback signal control.

For the current limited algorithm, the duty-cycle signal is sent to the PWM generator to generate the corresponding PWM signal. The PWM signal is the switching signal of the Buck Converter type Switch Mode Power Supply SMPS. The current-sensing resistor senses the current and feedback to the embedded controller to adjust the duty-cycle. This is the feedback system.

If the embedded controller uses the feedback signal of W+−W− voltage to adjust and enable/disable the PWM signal due to the maximum voltage limit allowance, it becomes the voltage-limited current charging. Then it becomes the current feedback system with the addition of the voltage feedback signal control. As shown in the upper-right portion in the FIG. 1G, the green technology integration system is made of the Voltage-Limited Current Charging circuit further comprising a buck converter to drive a H-bridge switch structure to drive a Electrochromic Window.

Figure 38B:
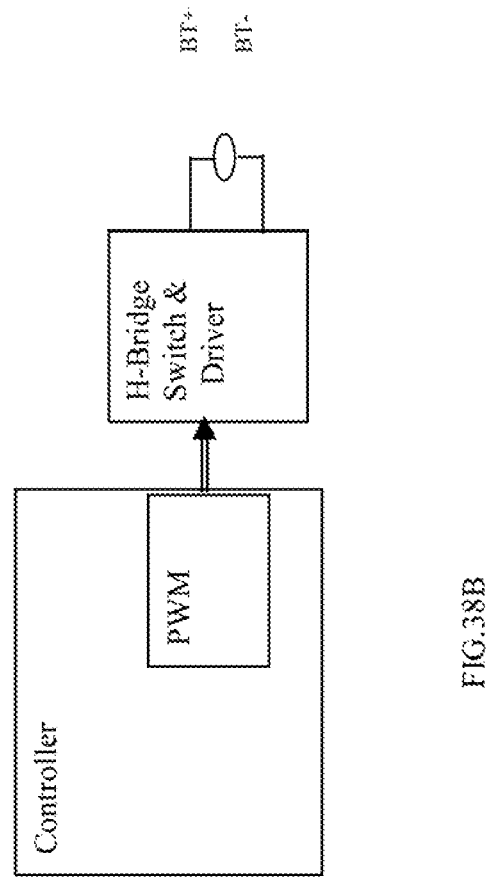
Figure 38A:
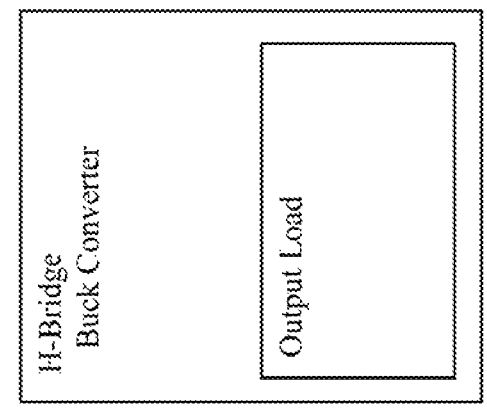

FIG. 38A and FIG. 38B show the application of FIG. 37D2 being applied to the EC window controller. As shown in FIG. 1H, the green technology integration system is made of the Voltage-Limited Current Charging circuit further comprising H-bridge switching Buck Converter means to drive a Electrochromic Window means. The embedded window controller sends the polarity and SMPS switching signals to the H-Bridge.

There are many different ways for the combination of the polarity and SMPS switching signals. For simplicity, only the PMOS signal to be the SMPS signal gated by the polarity signal and the NMOS is the polarity signal. For the high power efficiency, both the PMOS and NMOS signal can be SMPS signal gated by the polarity signal.

Figure 39C:
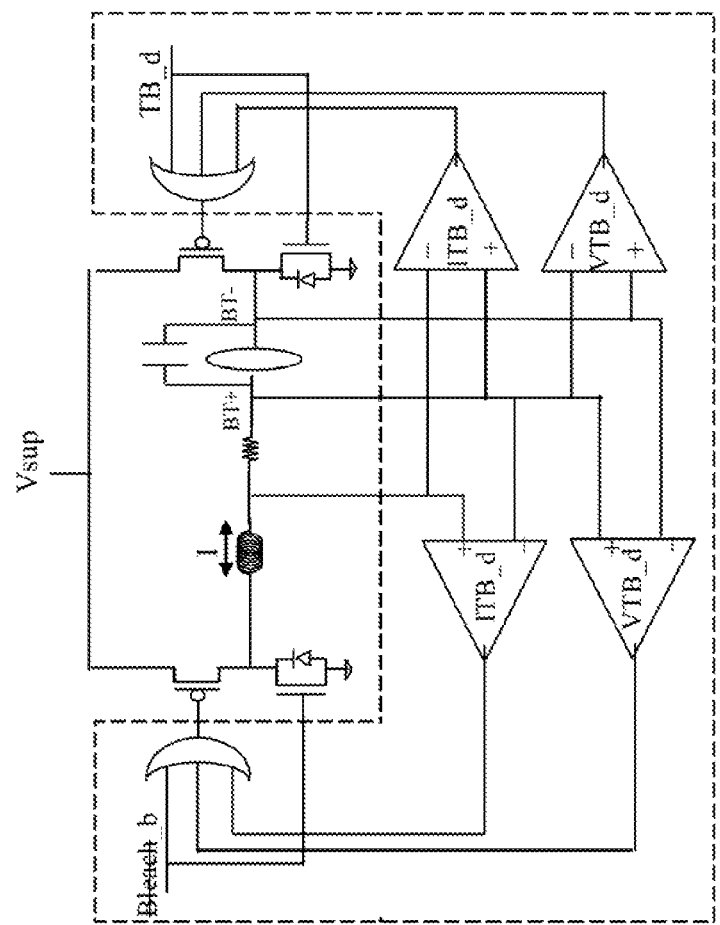
Figure 39A:
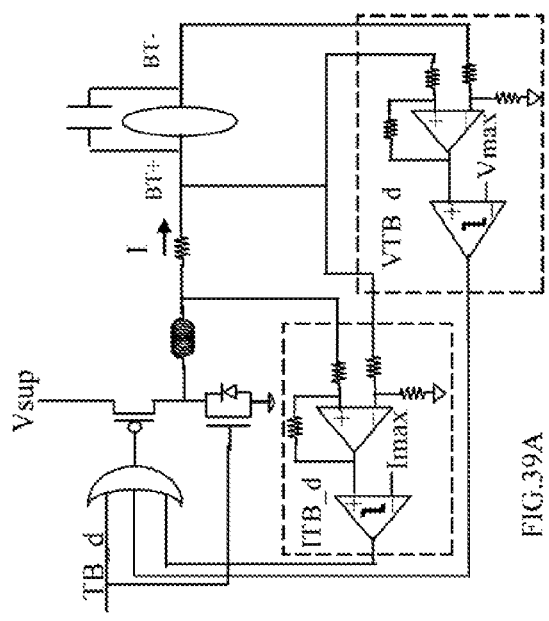
Figure 39B:
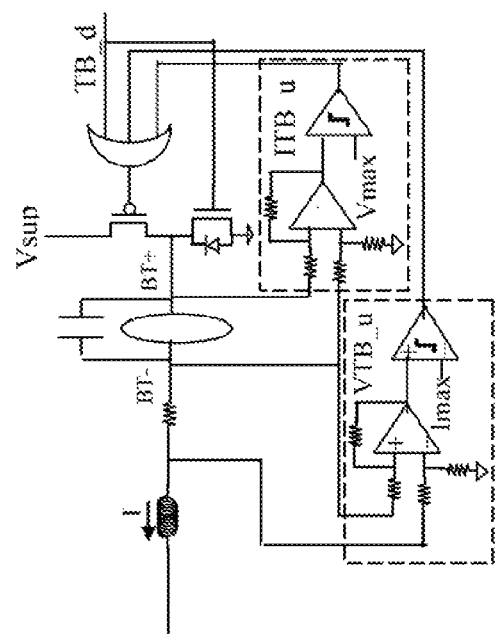

The EC window controller can be independent device. As shown in FIG. 39A, during the bleach, the current flows in one direction. Bleach_b is the bleach signal. The ISW_b circuit is the current-limit detect circuit to switch of the switching gate. The VSW_b circuit is the voltage-limit detect circuit to switch of the switching gate. This is the event-driven switch mode buck converter. As shown in FIG. 39B, during the color, the current flows in the reverse direction. Color_b is the Color signal. The ISW_c circuit is the current-limit detect circuit to switch of the switching gate. The VSW_c circuit is the voltage-limit detect circuit to switch of the switching gate. This is the event-driven switch mode buck converter. FIG. 39C are the combinatory circuit of the FIG. 39A and FIG. 39B to be the complete EC window controller circuit.

Figure 40A:
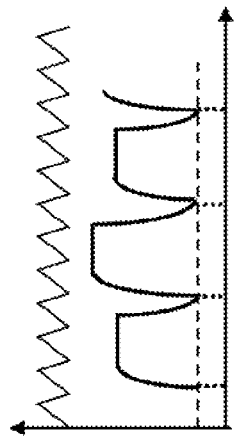
Figure 40B:
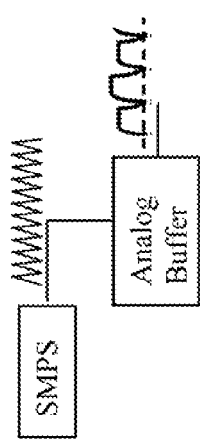
Figure 40C:
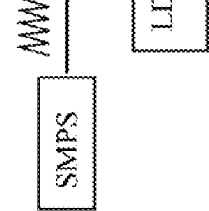
Figure 40D:
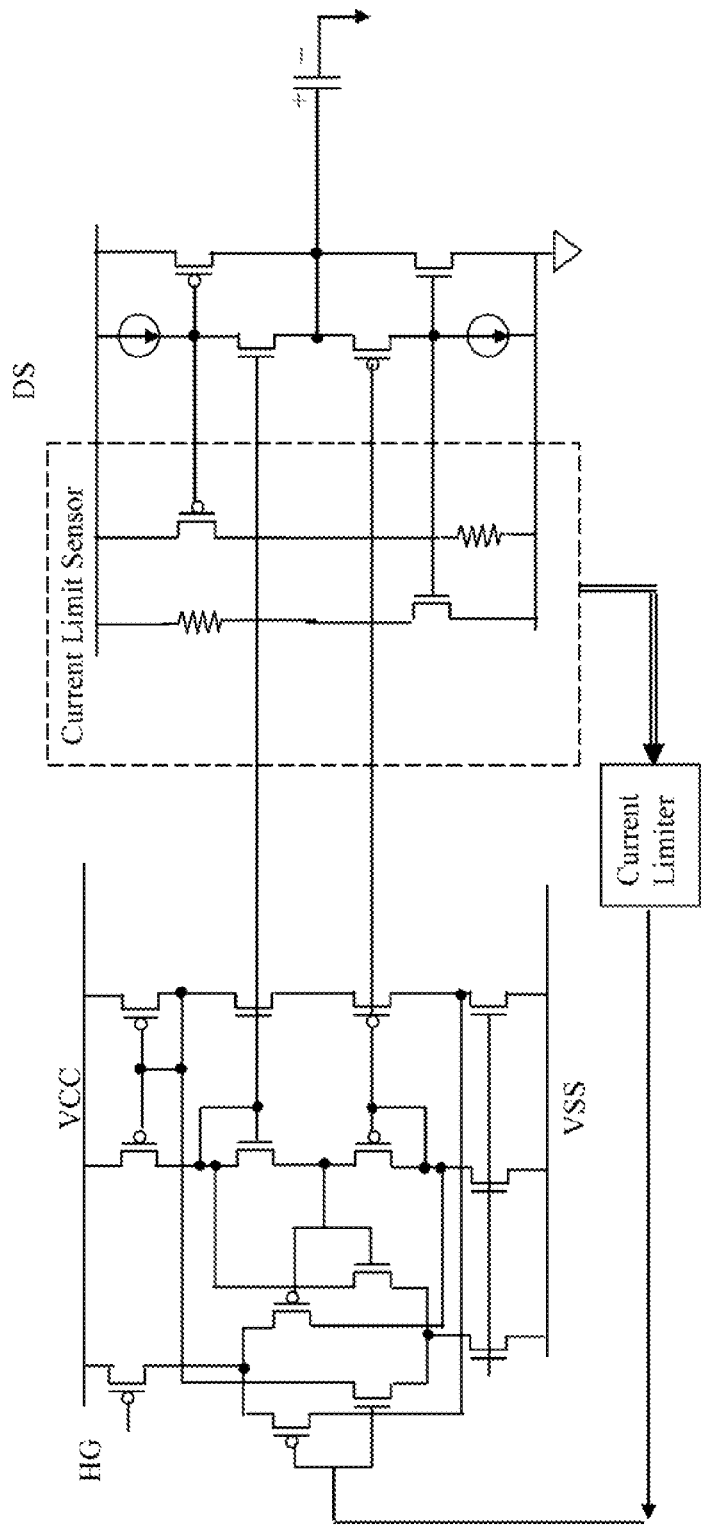

As shown in FIG. 21A and FIG. 40A, the Switch Mode Power supply SMPS provides the power to Low-Drop Voltage Regulator LDVR to generate the clean power. Similarly, as shown in FIG. 40B, the analog buffer of the EC window controller will filter out the switching noise of the SMPS. With the analog buffer in FIG. 40D and the H-Bridge operation in FIG. 36, the operation curve is shown as FIG. 40C. There are many ways to implement the current sensing technique. As shown in FIG. 1F, the current sensing resistor can feedback the current information to the embedded controller or the SMPS. Use the SMPS to control the current to be current-limited voltage ramping. We can also use the resistorless current sensing in the prior applications. As shown in FIG. 40D, we can also use the current limit sensor embedded in the analog buffer.

The green technology integration system is made of the Current-Limited Voltage Ramping circuit having a analog buffer to drive a H-bridge switch structure to drive the Electrochromic Window. As shown in FIG. 34E and FIG. 40C, the analog buffer can filter out the noise of the switch mode power supply. As shown in FIG. 40D, the analog buffer has the output stage serves as LDVR type operation. In other words, it is single side pull-up that no DC biasing current for the output stage. It will not burn the DC biasing current for the output stage as the conventional unit gain amplifier does. Furthermore, the current limit sensing mechanisms are implemented with the current mirror mechanism in the analog buffer.

Figure 41B:
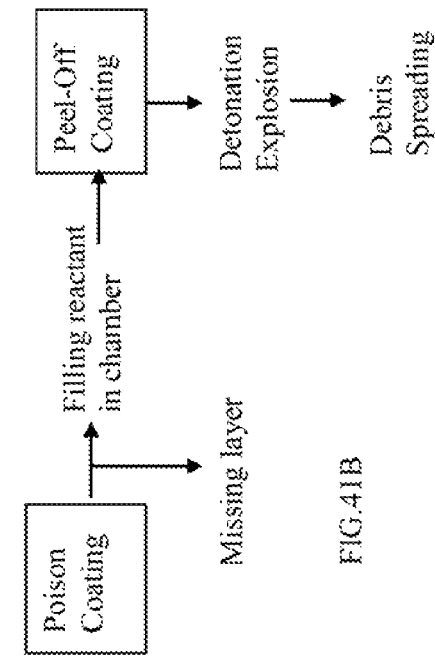
Figure 41D:
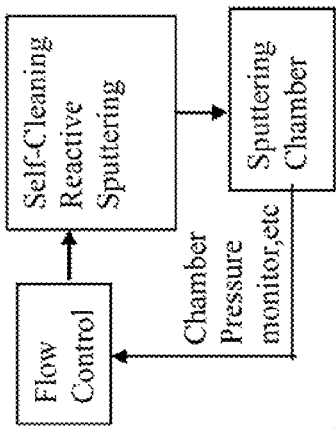
Figure 41A:
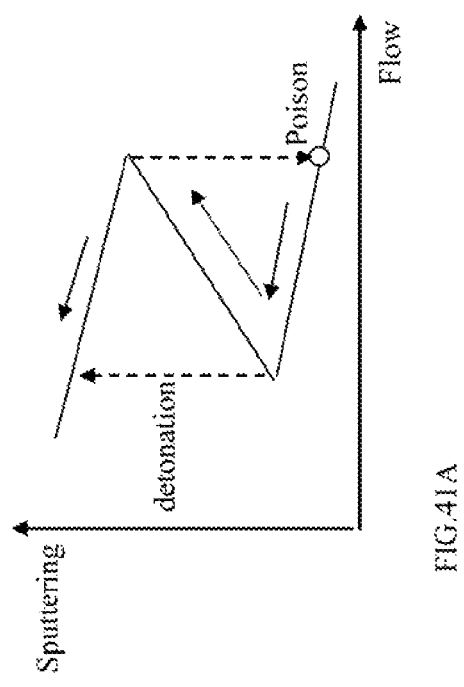
Figure 41C:
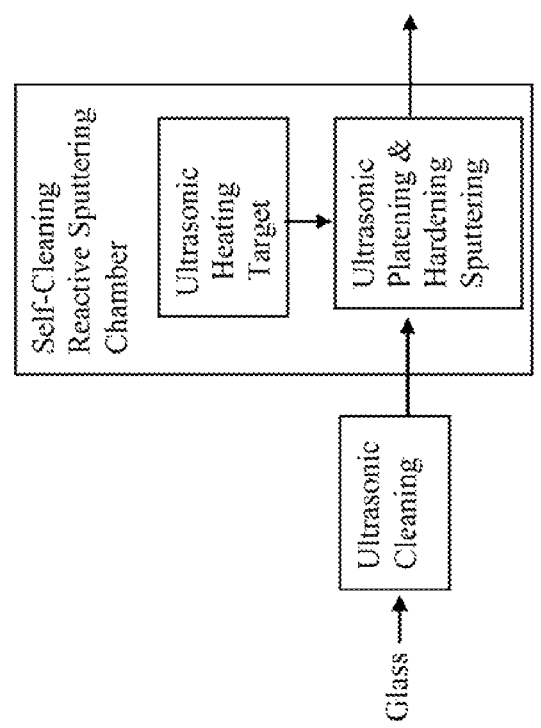

There are many way to manufacture the EC window. For the mass production, the gas reaction sputtering process is preferred. As shown in FIG. 41A, the gas reaction sputtering has the poison effect. The sputtering material will coat on the target. As shown in FIG. 41B, it causes the unstable operation of the sputtering chamber. It causes the missing layer and debris spreading problem. To avoid the poison problem in the sputtering chamber, it uses the ultrasonic to have the self-cleaning target. The sputtering material will be vaporized from the target instead of coating on the target. The system design of the self-cleaning sputtering chamber is as shown in FIG. 41D.

The general manufacture flow for the EC window is shown in FIG. 42A. Furthermore, as shown in FIG. 42A, the ultrasonic not only for the self-cleaning sputtering but also for the glass cleaning, plating and hardening, etc to enhance the performance of the EC window. As shown in FIG. 42B, the EC window layer grows the ion conduction layer without the plating and hardening. As shown by the solid line, the ion path zigzag and the ion has low speed. It causes the switch of the EC window taking a much longer time. As shown in FIG. 42C, the EC window upper layer is deposited one thin layer. After the sputtering this thin layer, using the plating and hardening process to organized this thin interface layer. Then begin the formal sputtering of this layer. This layer will grow on the plating and hardening thin layer with the ordering way to form good crystal structure. As shown by the solid line, the ion movement is in straight line and the ion moves fast. The EC window can switch fast. The green technology integration system comprises the Layers. In general, the layers are deposited to be layers. The layer is first deposited to be one interfacing layer. Then apply the plating and hardening process to the interfacing layer to form a well-crystallized foundation. Then the Layer is deposited on the well-crystallized foundation to grow this layer. The layer is very much important for the ion conduction layer. It can increase the performance of the EC window a lot. Normally, the heating and hardening are done with the quartz light. The heating and hardening the layer with the assisted ultrasonic has the plating effect, too.

FIG. 1B and FIG. 1C shows the application of the Zilinx FPIC with the 11Less Green Technology for of Smart Window. As shown in FIG. 30B, FIG. 1B is the platform of the Zilinx FPIC having the 11Less Green Technology for of Smart Window. As shown in FIG. 27C, FIG. 1C is the Zilinx FPIC having the IP wrapper of Noise Isolation Technology for 11Less Green Technology for of Smart Window.

While the invention has been particularly shown and described with reference to the preferred embodiments thereof, it will be understood by those skilled in the art that various changes in form and details may be made therein without departing from the spirit and scope of the invention.

We claim:

1. A green technology integration system means has layered noise isolation means,
    said layered noise isolation means having a plural of current regulator means to regulate current flowing a plural of connection means,
    said connection means having parasitic inductor means,
    said current regulator means regulating current flowing through said parasitic inductor means to reduce noise generated by said parasitic inductor means.

2. A green technology integration system means according to claim 1 said current regulator further comprising a plural of P type current devices and N type current devices,
    said P type current device and N type current device being connected in cascade with draining node being connected together;
    an optional capacitor means being connected to said draining node.

3. A green technology integration system means according to claim 1 said layered noise isolation means being a platform serving as wrapper means to integrate versatile combinations of application specific integrated circuit ASIC means, field programmable gate array FPGA means, conversion means between analog and digital, digital signal processing DSP, microprocessor means, RF/AF/Analog circuit and digital circuit to be field programmable integrated chip FPIC.

4. A green technology integration system means according to claim 1 further comprising xtaless clock, said layered noise isolation means being a platform serving as wrapper means to integrate versatile combinations of application specific integrated circuit of said xtaless clock,
    said xtaless clock comprising LC resonator being constituted of inductor means and capacitor means.

5. A green technology integration system means according to claim 1 further comprising xtaless clock, said layered noise isolation means being a platform serving as wrapper means to integrate versatile combinations of application specific integrated circuit of said xtaless clock,
    said xtaless clock further comprising common mode feedback control means, constant amplitude feedback control means, reference voltage means and reference current means;
    said LC resonator being controlled with said reference current means;
    said common mode feedback control means and constant amplitude feedback control means being controlled with said reference voltage means.

6. A green technology integration system means according to claim 1 further comprising xtaless clock, said layered noise isolation means being a platform serving as wrapper means to integrate versatile combinations of application specific integrated circuit of said xtaless clock,
    said xtaless clock further comprising common mode feedback control means, constant amplitude feedback control means, reference voltage means and reference current means;
    said LC resonator being controlled with said reference current means;
    said common mode feedback control means and constant amplitude feedback control means being controlled with said reference voltage means,
    said reference voltage being bandgap voltage and reference current being bandgap current, and said xtaless clock being referred as bandgap oscillator.

7. A green technology integration system means according to claim 1 further comprising pipeline buffer ADC, said layered noise isolation means being a platform serving as wrapper means to integrate versatile combinations of application specific integrated circuit of said pipeline buffer ADC,
    said pipeline buffer ADC comprising high gain operational amplifier stage and dynamic switching output stage.

8. A green technology integration system means according to claim 1 further comprising RF Power Amplifier dynamic power supply, said layered noise isolation means being a platform serving as wrapper means to integrate versatile combinations of application specific integrated circuit of said RF Power Amplifier dynamic power supply,
    said RF Power Amplifier dynamic power supply having Low Drop Voltage Regulator LDVR type analog buffer power supply to be AC coupled with high PAE ratio signal to supply power dynamically.

9. A green technology integration system means according to claim 1 further comprising an Insulated Glass Unit IGU means, said layered noise isolation means being a platform serving as wrapper means to integrate versatile combinations of application of said Insulated Glass Unit IGU means,
    said Insulated Glass Unit IGU means further comprising electrochromic window means and solar cell window means;
    said solar cell window means providing electricity to said electrochromic window means to be self-contained IGU means.

10. A green technology integration system means according to claim 1 further comprising battery control means, said layered noise isolation means being a platform serving as wrapper means to integrate versatile combinations of application specific integrated circuit of said battery control means,
    said battery control means switch a Electrochromic Window means being made of battery means.

11. A green technology integration system according to claim 1 further comprising Current-Limited Voltage Ramping circuit means, said layered noise isolation means being a platform serving as wrapper means to integrate versatile combinations of application specific integrated circuit of said Current-Limited Voltage Ramping circuit means,
    said Current-Limited Voltage Ramping circuit means being to switch a Electrochromic Window means being made of battery means.

12. A green technology integration system according to claim 1 further comprising Voltage-Limited Current Charging circuit means, said layered noise isolation means being a platform serving as wrapper means to integrate versatile combinations of application specific integrated circuit of said Voltage-Limited Current Charging circuit means,
    said Voltage-Limited Current Charging circuit means being to switch a Electrochromic Window means being made of battery means.

13. A green technology integration system according to claim 1 of said Current-Limited Voltage Ramping circuit having a analog buffer, said layered noise isolation means being a platform serving as wrapper means to integrate versatile combinations of application specific integrated circuit of said analog buffer,
  said analog buffer being to drive a H-bridge switch structure to drive said Electrochromic Window means being made of battery means.

14. A green technology integration system according to to claim 1 of said Voltage-Limited Current Charging circuit means further comprising a buck converter, said layered noise isolation means being a platform serving as wrapper means to integrate versatile combinations of application specific integrated circuit of said buck converter,
  said buck converter driving a H-bridge switch structure to drive a Electrochromic Window means being made of battery means.

15. A green technology integration system according to to claim 1 of said Voltage-Limited Current Charging circuit means further comprising H-bridge switching Buck Converter means, said layered noise isolation means being a platform serving as wrapper means to integrate versatile combinations of application specific integrated circuit of said H-bridge switching Buck Converter means,
  said H-bridge switching Buck Converter means driving a Electrochromic Window means being made of battery means.

16. A green technology integration system means according to claim 1 of which said battery means being deposited to be films, said layered noise isolation means being a platform serving as wrapper means to integrate versatile combinations of application of said battery means,
  said a first film first deposited then plating and hardening said first film to form a well-crystallized foundation means;
  then said other films depositing on said well-crystallized foundation means to grow said other films.

17. A green technology integration system according to claim 1 being a gas reaction sputtering films, said layered noise isolation means being a platform serving as wrapper means to integrate versatile combinations of application of said gas reaction sputtering films,
  said gas reaction sputtering films comprising ultrasonic self-cleaning target means to clean passion deposition on said target means.

18. A green technology integration system according to claim 1 further comprising film being ion conduction film, said layered noise isolation means being a platform serving as wrapper means to integrate versatile combinations of application of said conduction film.

19. A green technology integration system according to claim 1 further comprising film, said layered noise isolation means being a platform serving as wrapper means to integrate versatile combinations of application of said film,
  said film being plate and hardened with ultrasonic assisted means.

20. A green technology integration system means according to claim 1 further comprising IGU having smart fans; said layered noise isolation means being a platform serving as wrapper means to integrate versatile combinations of application of said IGU,
  said smart fans further comprising bladeless turbofan means;
  said bladeless turbofan means circulating air for air conditioning.

* * * * *